US006596457B1

(12) United States Patent
Hidaka et al.

(10) Patent No.: US 6,596,457 B1
(45) Date of Patent: Jul. 22, 2003

(54) POSITIVE PHOTOSENSITIVE LITHOGRAPHIC PRINTING PLATE RESPONSIVE TO NEAR INFRARED RAYS; METHOD OF PRODUCING IT AND METHOD FOR FORMING A POSITIVE IMAGE

(75) Inventors: Katsuhiko Hidaka, Ibaraki (JP); Tatsunori Tsuchiya, Kanagawa (JP); Hiroyuki Yagisawa, Ibaraki (JP); Masao Akamatsu, Ibaraki (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 09/441,094

(22) Filed: Nov. 16, 1999

(30) Foreign Application Priority Data

| | | |
|---|---|---|
| Nov. 16, 1998 | (JP) | 10-324734 |
| Nov. 17, 1998 | (JP) | 10-326340 |
| Jan. 12, 1999 | (JP) | 11-004985 |
| Jul. 27, 1999 | (JP) | 11-211957 |
| Jul. 27, 1999 | (JP) | 11-211958 |
| Aug. 24, 1999 | (JP) | 11-236705 |

(51) Int. Cl.[7] ............................ G03F 7/039; G03F 7/11

(52) U.S. Cl. ................................ 430/270.1; 430/271.1; 430/302; 430/348; 430/944; 430/945; 430/964; 101/454; 101/457; 101/463.1; 101/467

(58) Field of Search ........................... 430/270.1, 271.1, 430/302, 348, 944, 945, 964; 101/454, 457, 463.1, 467

(56) References Cited

U.S. PATENT DOCUMENTS 3,755,423 A 8/1973 Onoda et al. ............... 260/497

(List continued on next page.)

FOREIGN PATENT DOCUMENTS

| | | |
|---|---|---|
| DE | 2 134 115 | 1/1972 |
| DE | 24 54 768 | 5/1976 |

(List continued on next page.)

OTHER PUBLICATIONS

Absolute Humitdity Scales. The Mac Humidity/Moisture handbook. Mar. 9, 2001. http://www.macinstruments.com/macinslc.html.*

(List continued on next page.)

*Primary Examiner*—Janet Baxter
*Assistant Examiner*—Barbara Gilliam
(74) *Attorney, Agent, or Firm*—Oblon, Spivak, McClelland, Maier & Neustadt, P.C.

(57) ABSTRACT

A positive photosensitive printing plate is prepared wherein the photosensitivity is to near-infrared rays which do not induce a chemical change in a photosensitive component. The photosensitive material has an inclined structure from the viewpoint of dissolution of the irradiated portion in an alkali developer. The dissolution rate is such that it continuously increases from the upper, surface part of the photosensitive material to the lower part of the photosensitive material. This effect may be enhanced by diffusion of a material, preferably a polar compound, such as $H_2O$, from the surface toward the inner lower part of the photosensitive material. Techniques for accomplishing the diffusion include contacting the surface of the photosensitive material with an atmosphere of high humidity or overlaying the photosensitive material with a layer of protective material (paper) containing moisture and heating the resultant composite. The photosensitive material may include a solubility suppressing agent such as a sulfonic acid ester or a compound having a triarylmethane skeleton.

141 Claims, 13 Drawing Sheets

V1: AVERAGE DISSOLUTION RATE (100-90%)
V2: AVERAGE DISSOLUTION RATE (90-0%)

U.S. PATENT DOCUMENTS

| | | | | | |
|---|---|---|---|---|---|
| 3,830,833 | A | | 8/1974 | Mabuchi et al. | 260/491 |
| 4,095,030 | A | | 6/1978 | Stapp | 560/100 |
| 4,396,703 | A | * | 8/1983 | Matsumoto et al. | 430/302 |
| 4,973,572 | A | * | 11/1990 | DeBoer et al. | 503/227 |
| 5,177,254 | A | | 1/1993 | Haji et al. | 560/244 |
| 5,777,155 | A | | 7/1998 | Sato et al. | 560/244 |
| 5,811,221 | A | * | 9/1998 | Miller et al. | 430/302 |
| 5,985,512 | A | * | 11/1999 | Hatakeyama et al. | 430/270.1 |
| 6,090,532 | A | * | 7/2000 | West et al. | 430/326 |
| 6,110,646 | A | * | 8/2000 | Urano et al. | 430/302 |
| 6,197,478 | B1 | * | 3/2001 | Vermeersch et al. | 430/272.1 |

FOREIGN PATENT DOCUMENTS

| | | |
|---|---|---|
| DE | 27 36 695 | 3/1979 |
| EP | 0 823 327 | 2/1998 |
| EP | 0 913 253 | 5/1999 |
| EP | 0 914 964 A2 | 5/1999 |
| JP | 50-126611 | 10/1975 |
| JP | 55-11555 | 1/1980 |
| JP | 57-140744 | 8/1982 |
| JP | 11-119414 | 4/1999 |
| WO | WO 97/39894 | 10/1997 |
| WO | WO 98/42507 | 10/1998 |
| WO | WO 99/21715 | 5/1999 |

OTHER PUBLICATIONS

Absolute Humidity. Mar. 9, 2001. http://129.252.37.27/erth_sci/Atmos/AbsHumid.html.*

"Development of Thermal Positive Brilla LH–PI" presented in the 102$^{nd}$ Spring Conference of Nippon Insatu GAKKAI held on Jun. 17, 1999. (English Abstract included).

"Thermoster: A new Thermal Litho Printing Plate Technology for CTP Recording" presented in TAGA 1998.

A brochure of Fujifilm's Brilla LH–PI (English Abstract Included).

* cited by examiner

V1: AVERAGE DISSOLUTION RATE (100-90%)

V2: AVERAGE DISSOLUTION RATE (90-0%)

V1: AVERAGE DISSOLUTION RATE (100-90%)

V2: AVERAGE DISSOLUTION RATE (90-0%)

CALCULATION OF GRADIENT $S_3$ OF SAMPLE ①:
THE TIME (T) UNTIL THE SOLUBILITY REACHES 80% IS 80 SECONDS. AT THE POINT T/2=40 SECONDS, THE SOLUBILITY IS 3%. ACCORDINGLY, THE GRADIENT $S_3$=3.

SCHEMATIC DRAWING ILLUSTRATING THE DRYING PROCESS

DRYING AND COATED SURFACE TEMPERATURE CURVES IN DRYING PROCESS IN EXAMPLES AND COMPARATIVE EXAMPLES

* RATE DRYING IN REF. Ex. F1

POSITIVE PHOTOSENSITIVE LITHOGRAPHIC PRINTING PLATE RESPONSIVE TO NEAR INFRARED RAYS; METHOD OF PRODUCING IT AND METHOD FOR FORMING A POSITIVE IMAGE

BACKGROUND OF THE INVENTION

1. Field of the Invention

The present invention relates to a positive photosensitive lithographic printing plate which can be exposed by near infrared rays, a method for producing it and a method for forming a positive image employing it. More particularly, it relates to a positive photosensitive lithographic printing plate suitable for direct plate making by means of a semiconductor laser or a YAG laser, a method for producing it and a method for exposing and developing it.

2. Discussion of the Background

Along with the progress in the image treating technology by computers, attention has been drawn to direct system for making a positive photosensitive or heat sensitive plate wherein a resist image is formed directly from digital image information by e.g. a laser beam or a thermal head without resort to a silver salt masking film.

Particularly, it has been strongly desired to realize a laser photosensitive direct plate making system with a high degree of development, employing a high power semiconductor laser, from the viewpoint of the long useful life of the semiconductor laser and downsizing.

An image-forming method utilizing laser photosensitivity or heat sensitivity is known for preparing a lithographic printing plate utilizing a sublimable transfer dye. For example, a method of preparing a lithographic printing plate by utilizing the crosslinking reaction of a diazo compound (e.g. JP-A-52-151024, JP-B-2-51732, JP-A-50-15603, JP-B-3-34051, JP-B-61-21831, JP-B-60-12939 and U.S. Pat. No. 3,664,737), or a method of preparing a lithographic printing plate by utilizing the decomposition reaction of nitrocellulose (e.g. JP-A-50-102403 and JP-A-50-102401), has been known.

Further, in recent years, a technique in which a chemical amplification type photoresist is combined with a long wavelength light ray absorbing dye, has been proposed. For example, JP-A-6-43633 discloses a photosensitive material wherein a certain specific squarilium dye is combined with a photo-acid-generator and a binder.

A technique of this type has been proposed for preparing a lithographic printing plate by exposing a photosensitive layer containing an infrared ray absorbing dye, a latent Brønsted acid, a resol resin and a novolak resin, in an image pattern by e.g. a semiconductor laser (JP-A-7-20629). Further, the same technique wherein an s-triazine compound is used instead of the above latent Brønsted acid, has also been disclosed (JP-A-7-271029).

However, these conventional methods were not necessarily adequate in their performance from a practical viewpoint. It was usually necessary to have a heat treatment step after the exposure phase of the plate making process. This extra heat treatment step resulted in increased operation time, the requirement of extra space for apparatus and higher equipment costs. Further, because the temperature in the heating step significantly affects the sensitivity, printing resistance and chemical resistance, users of the process were required to strictly control the temperature.

To overcome such problems, a positive photosensitive lithographic printing plate of the thermal conversion type, which requires no heat treatment, has been proposed in JP-A-8-207013. A further technique has been disclosed in which there is formed a photosensitive layer insoluble in an alkali developer. The layer is comprised of a novolak resin, a cyanine dye and a solubility-suppressing agent such as a sulfonic ester. The layer is irradiated with a laser so that the photosensitive layer is made soluble where irradiated, thereby forming an image. A technique similar thereto has been disclosed in WO97/39384.

As mentioned above, there also exists a method of preparing a conventional positive photosensitive lithographic printing plate by exposure with a laser. The conventional method employs a photosensitive layer in which a photo-acid-generator is blended with a photosensitive agent, and the energy from a laser light is used to bring about a chemical change of the additive which increases the solubility of the photosensitive layer. An alternative technique has been proposed in JP-A-10-268512, which corresponds to U.S. patent application Ser. No. 08/906,258, filed Aug. 5, 1997, wherein the layer forming a positive photosensitive lithographic printing plate is such that its alkali-solubility increases as a result of heat generated by irradiation with the laser light itself. In this case a chemical change is not substantially brought about when the alkali-solubility of the photosensitive layer increases. This alternative technique is highly advantageous because when a compound insensitive to ultraviolet rays (UV) is used as the solubility-suppressing agent or another additive, the photosensitive layer will be insensitive to UV, such that the operation can be carried out even under white light.

There are disadvantages to forming a positive image by exposure with laser and causing a chemical change. The time of irradiating one point on the photosensitive layer with the laser light is extremely short, and accordingly, photosensitivity is the problem.

To accelerate the chemical change and to increase the photosensitivity, irradiation with a short wavelength light having a high energy, is preferred. However, this approach presents a problem because laser generators having a short wavelength coupled with high power are not readily available.

Further, when the chemical change is brought about by heat converted from the light energy, problems occur because the irradiation time is extremely short. If the added amount the photo-thermal conversion material is increased to increase the amount of thermal conversion, the light is absorbed around the surface of the photosensitive layer, but in the inner layer, the light declines, whereby the reactivity will be extremely poor. As a result, the dissolution speed of the layer will decrease toward the lower layer part of the film, such that the dissolution time of the entire irradiated portion will no longer be accelerated, and there will be a limitation in the increase of the sensitivity, such being problematic.

One way of overcoming this problem is to make the photosensitive layer thin. However, when the photosensitive layer is of the thermal conversion type, if the layer is made too thin, the amount of thermal diffusion to the support increases, and the sensitivity decreases.

Further, when a large amount of solubility-suppressing agent is used, or a strong solubility-suppressing agent is used, the alkali solubility of the entire photosensitive layer decreases, whereby it becomes necessary to make the irradiation energy of laser light high and, accordingly, the exposure time tends to be long, which is disadvantageous. Further, in the inner layer, as the light declines, the reactivity will be extremely poor, and as a result, the dissolution speed will decrease toward the lower layer part of the film, whereby the dissolution time of the entire irradiated portion will no longer be accelerated, and there will be a limitation in the increase of the sensitivity.

Conversely, when the amount of the solubility-suppressing agent is small, or a weak solubility-suppressing agent is used, the strength of the entire photosensitive layer tends to be low, and there are problems in the printing resistance and the preservation property.

Further, the preservation property, the printing resistance and the chemical resistance are significantly influenced by deterioration with age or the preservation conditions. Particularly, e.g., when the molecular weight of binder components in a photosensitive material is changed to improve the chemical resistance or the printing resistance, the alkali solubility will be poor, whereby the development property will deteriorate. As mentioned above, the chemical resistance, the preservation property and the printing resistance are always in an antinomic relation to performance characteristics such as sensitivity or the development property, and the performance characteristics required for the positive photosensitive lithographic printing plate are not satisfied.

SUMMARY OF THE INVENTION

The object of the present invention is to provide a positive photosensitive lithographic printing plate which can be exposed by scanning with a laser light beam, which plate is characterized by high sensitivity and a good preservation property, an excellent solubility of the exposed portion of the photosensitive layer at the time of development, the ability to develop a clear image, and excellent printing resistance and chemical resistance. The invention also includes a method for producing the plate and a method for forming a positive image employing the positive photosensitive lithographic printing plate of the invention.

Another object of the present invention is to provide a positive photosensitive lithographic printing plate capable of forming an image by using a long wavelength laser light having a wavelength range of from 600 nm to 1,300 nm.

Another object of the present invention is to provide a positive photosensitive lithographic printing plate capable of forming an image by using a laser light, and having a uniform developing property at the entire plate.

Another object of the present invention is to provide a method for producing said positive photosensitive lithographic printing plate with a low treatment cost per plate, by downsizing the space for treatment.

Further, another object of the present invention is to provide a method for producing a positive photosensitive lithographic printing plate having uniform characteristics of the photosensitive layer and capable of printing a beautiful image.

The present invention has been made as a result of extensive studies to achieve the above objects. More particularly, it is the object of the present invention to provide:

(1) A positive photosensitive lithographic printing plate which comprises a photosensitive material containing a photo-thermal conversion material having an absorption band within a wavelength range of from 600 nm to 1,300 nm and an alkali-soluble resin, wherein the dissolution rate of said photosensitive material, in unexposed condition, in an alkali developer increases from the upper or surface part of said photosensitive material toward the lower part of said photosensitive material, (2) A method for producing a positive photosensitive lithographic printing plate, which comprises coating a photosensitive composition containing a photo-thermal conversion material having an absorption band within a wavelength range of from 600 nm to 1,300 nm and an alkali-soluble resin, on a support to form a layer of photosensitive material, and diffusing a compound having a polar group from the surface of the photosensitive material, (3) A method for producing a positive photosensitive lithographic printing plate, which comprises coating a photosensitive composition containing a photo-thermal conversion material having an absorption band within a wavelength range of from 600 nm to 1,300 nm and an alkali-soluble resin, on a support to form a photosensitive material, overlaying said photosensitive material with a protective material containing moisture, and keeping the overlaid, photosensitive layer under heating conditions, (4) A method for producing a positive photosensitive lithographic printing plate, wherein a photosensitive composition comprising a photo-thermal conversion material having an absorption band within a wavelength range of from 600 nm to 1,300 nm and an alkali-soluble resin, is coated on a support to form a layer of photosensitive material, which is then overlaid with a protective material to form a predetermined size of lithographic printing plate, a plurality of such lithographic printing plates are piled one on another, a heat-insulating material is applied to almost entire top and bottom surfaces thereof, and the pile is kept under heating under such a state, (5) A method for producing a positive photosensitive lithographic printing plate, wherein a photosensitive composition containing a photo-thermal conversion material having an absorption band within a wavelength range of from 600 nm to 1,300 nm and an alkali-soluble resin, is coated on a support to form a layer of photosensitive material, and a drying process of drying at a temperature within a range of from 20° C. to 100° C. for a predetermined time is carried out, prior to diffusion from the surface of the photosensitive material, and (6) A method for forming a positive image, which comprises scanning and irradiating the positive photosensitive lithographic printing plate as defined in (1), with a laser light having a wavelength range of from 600 to 1,300 nm, to project an image for exposure, followed by development with an alkali developer.

The curve for sample 1 depicts dissolution rate data for the photosensitive lithographic printing plate made according to Example A6. The curve for sample 2 depicts dissolution rate data for the printing plate made according to Example A5.

Figure 2:
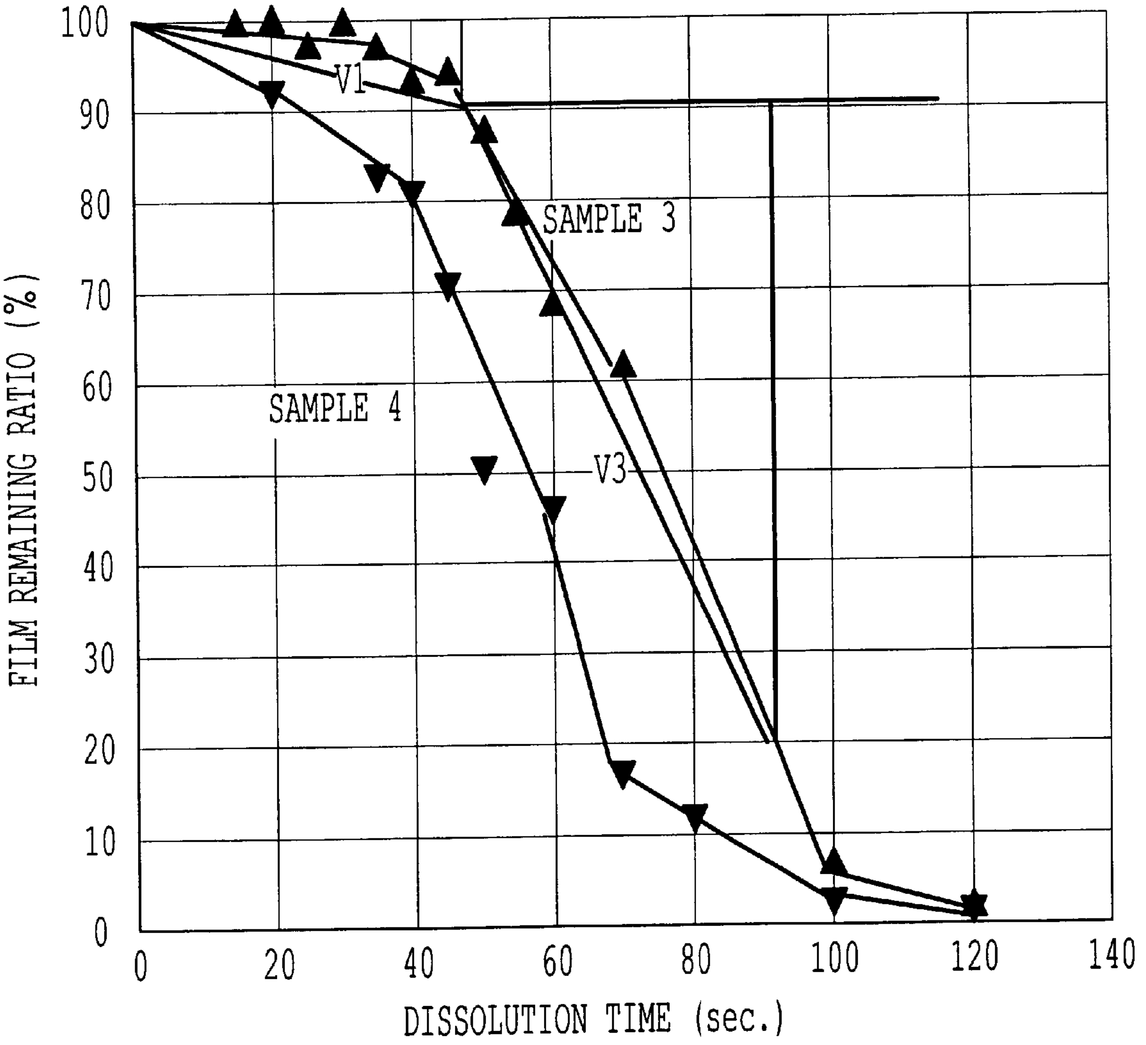

FIG. 2 is a graph (2) illustrating the dissolution rate of the photosensitive layer of the positive photosensitive lithographic printing plate of the present invention.

Figure 3:
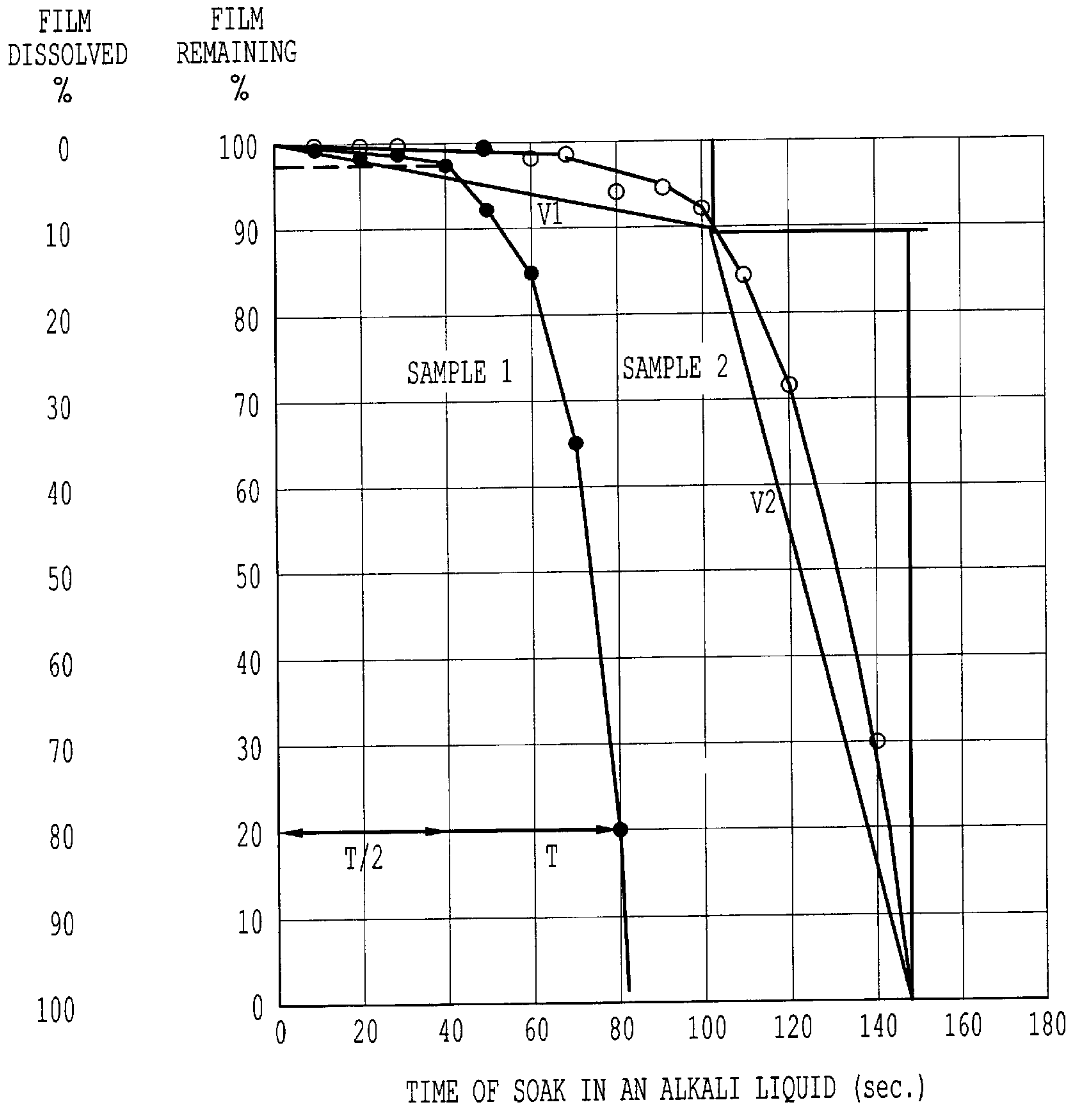

FIG. 3 is a graph (3) illustrating the dissolution rate of the photosensitive layer of the positive photosensitive lithographic printing plate of the present invention. The graph of FIG. 3 is identical to the graph of FIG. 1, but the graph has been used to derive different data points to calculate gradient S3.

Figure 4:
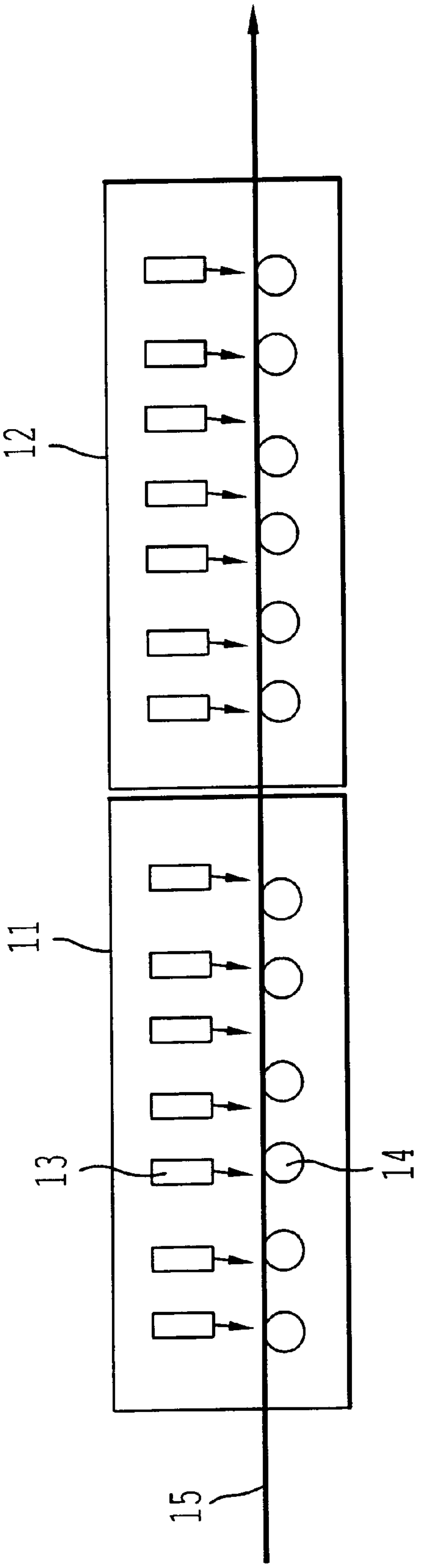

FIG. 4 is a schematic drawing illustrating one mode of carrying out the drying process to be used in the present invention.

Figure 5:
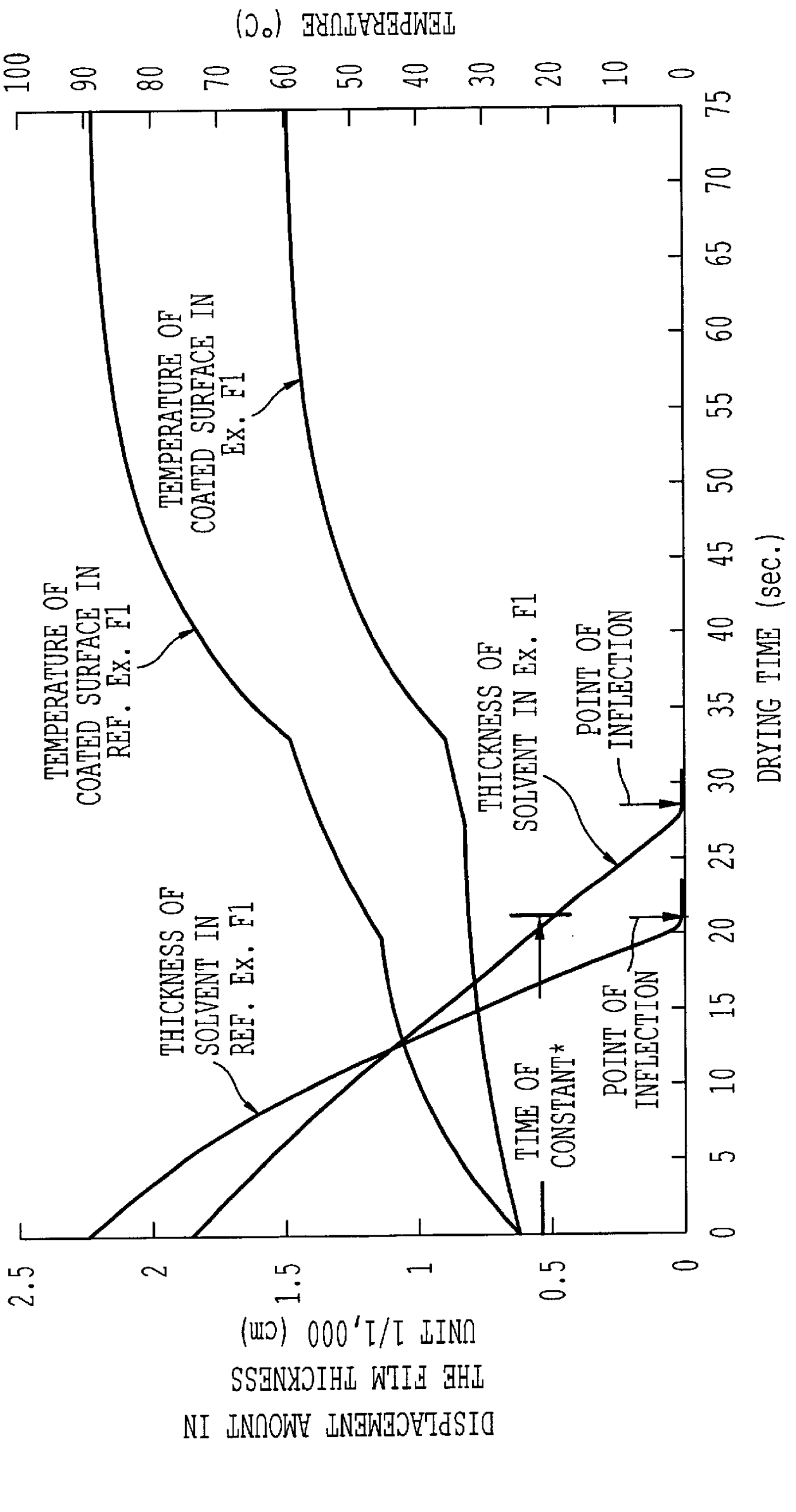

FIG. 5 is a graph illustrating the amount of displacement of the coated film thickness, and the temperature of the coated surface, in the drying process to be used in the present invention.

Figure 6:
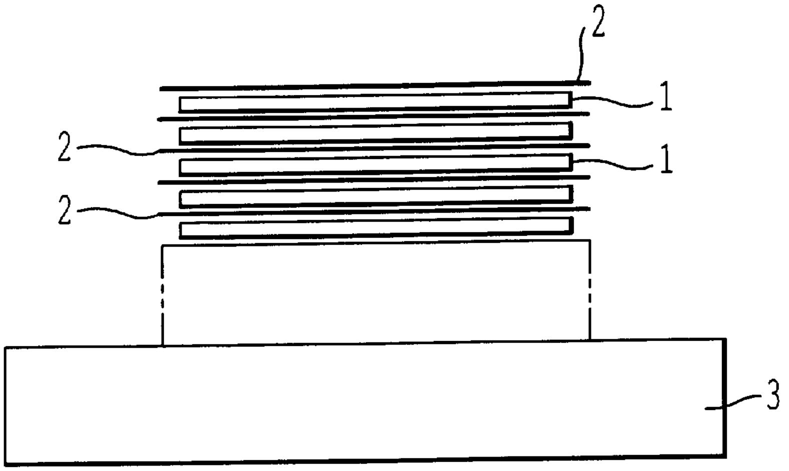

FIG. 6 is a longitudinal section illustrating the keeping method under heating (aging process) to be used in the present invention.

Figure 7:
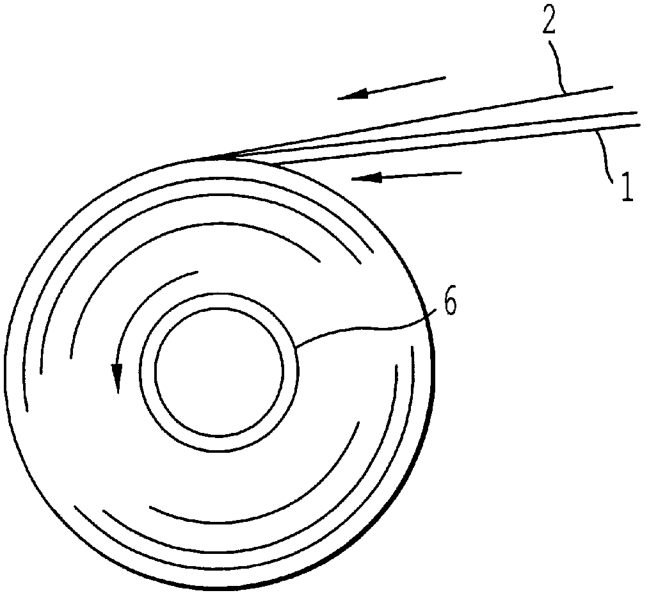

FIG. 7 is a longitudinal section illustrating another example of keeping method under heating (aging process) to be used in the present invention.

Figure 8:
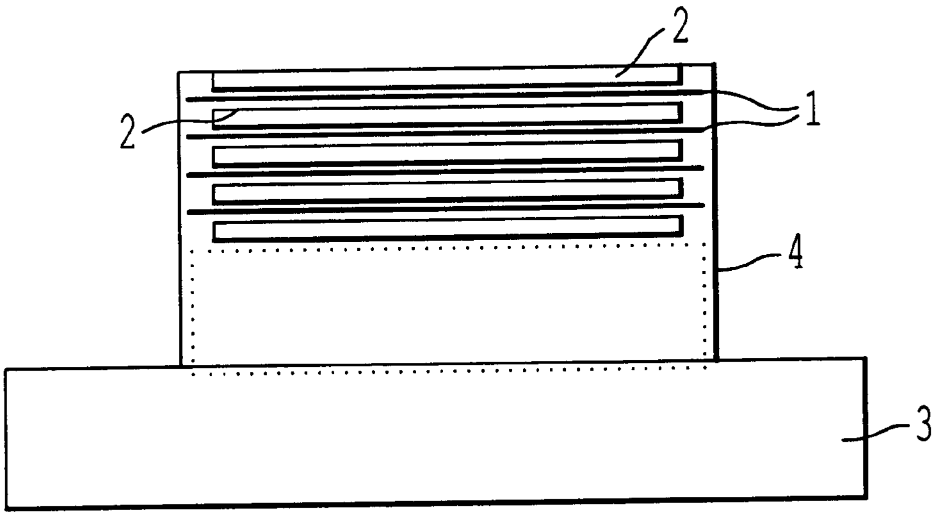

FIG. 8 is a schematic drawing illustrating one mode of carrying out the treatment process under heating to be used in the present invention, and illustrating lithographic printing plates and protective materials piled one on another and covered with a moisture-impermeable material.

Figure 9:
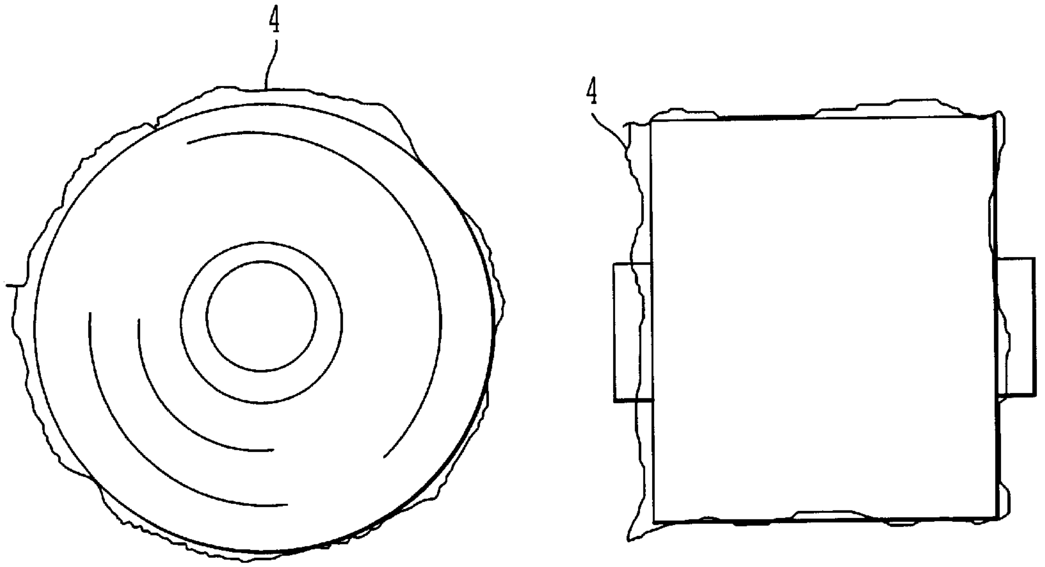

FIG. 9 is a schematic drawing illustrating one mode of carrying out the treatment process under heating to be used in the present invention, and illustrating a lithographic printing plate and a protective material wound into a coil, and covered with a moisture-impermeable material.

Figure 10:
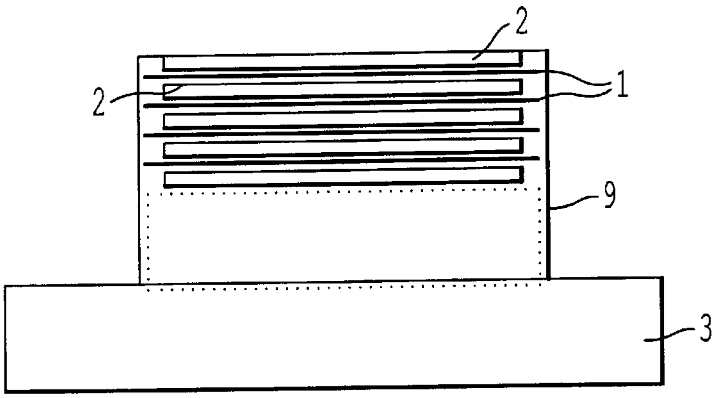

FIG. 10 is a schematic drawing illustrating one mode of carrying out the treatment process under heating to be used in the present invention, and illustrating lithographic printing plates and protective materials piled one on another, and covered with a heat generator of a sheet shape.

Figure 11:
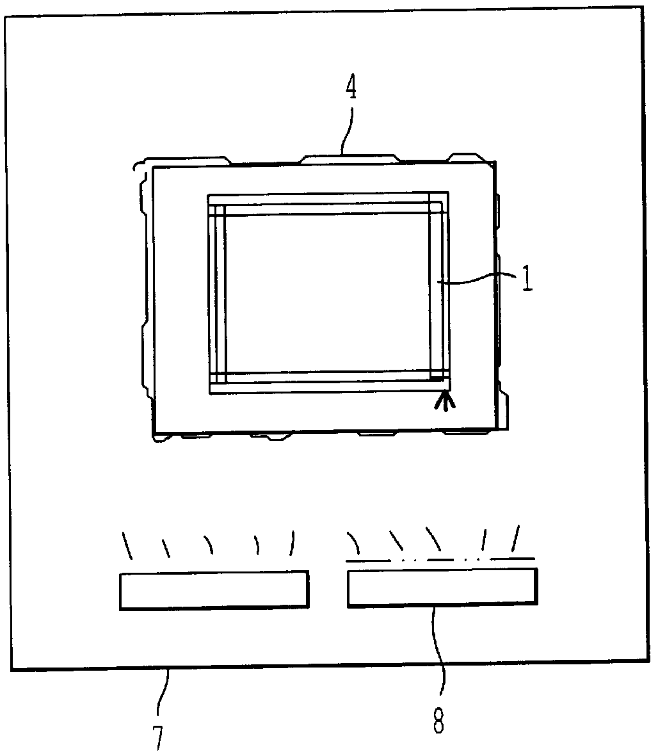

FIG. 11 is a schematic drawing illustrating one mode of carrying out the treatment process under heating to be used in the present invention, and illustrating an aging chamber equipped with an air circulation apparatus, to carry out an aging treatment of a pile of lithographic printing plates and protective materials.

Figure 12:
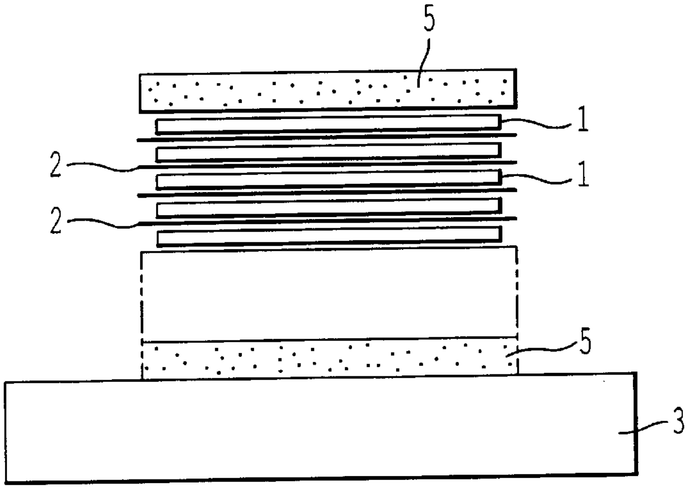

FIG. 12 is a schematic drawing illustrating one mode of carrying out the treatment process under heating to be used in the present invention, and illustrating a pile of lithographic printing plates and protective materials, which has a heat-insulating material applied to the top and bottom surfaces thereof.

Figure 13:
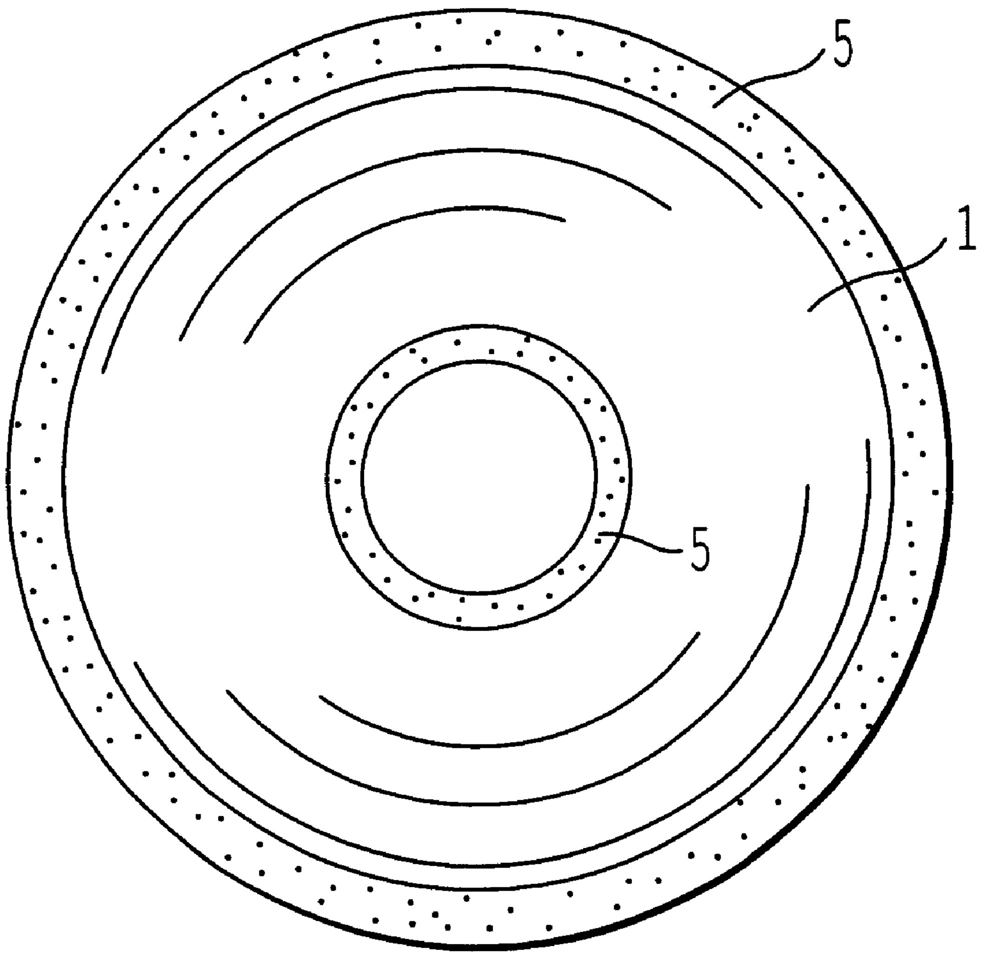

FIG. 13 is a schematic drawing illustrating one mode of carrying out the treatment process under heating to be used in the present invention, and illustrating such a state that a lithographic printing plate is wound into a coil together with a protective material, and a heat-insulating material is used for a coil core material and for a covering material for the outer periphery of the coil.

Figure 14:
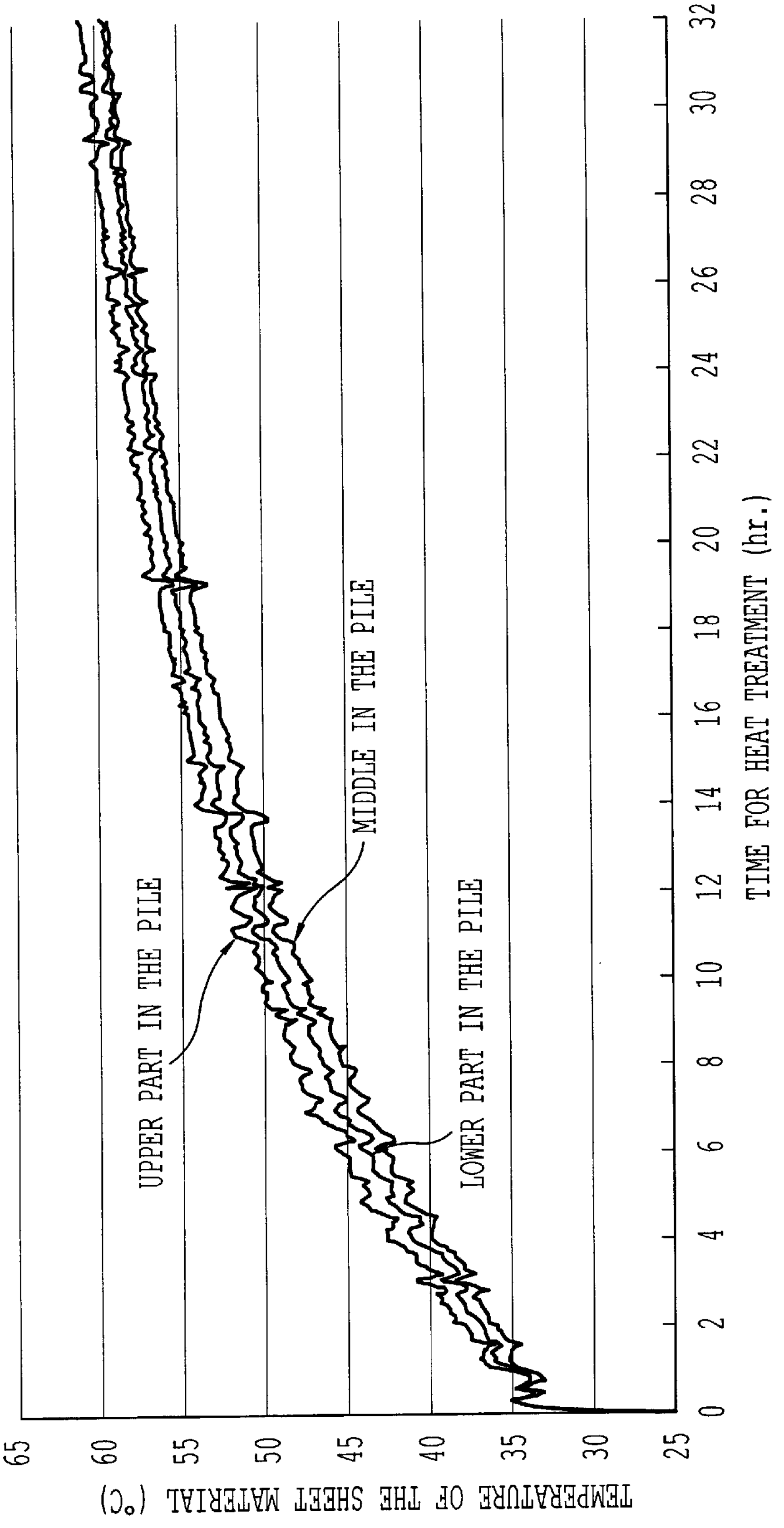

FIG. 14 is a graph illustrating the temperature distribution in Reference Example E1.

Figure 15:
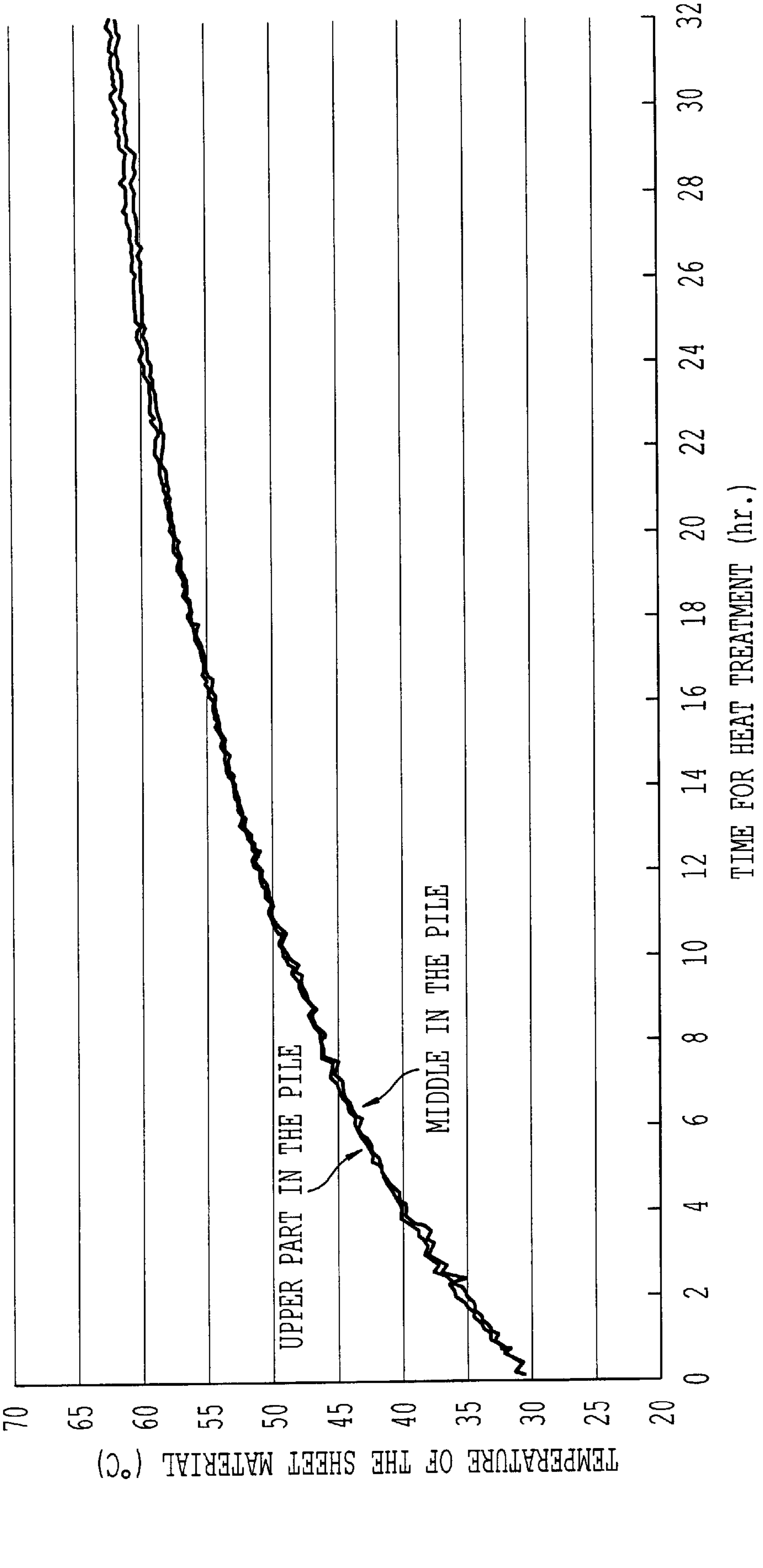

FIG. 15 is a graph illustrating the temperature distribution in Reference Example E2.

Figure 16:
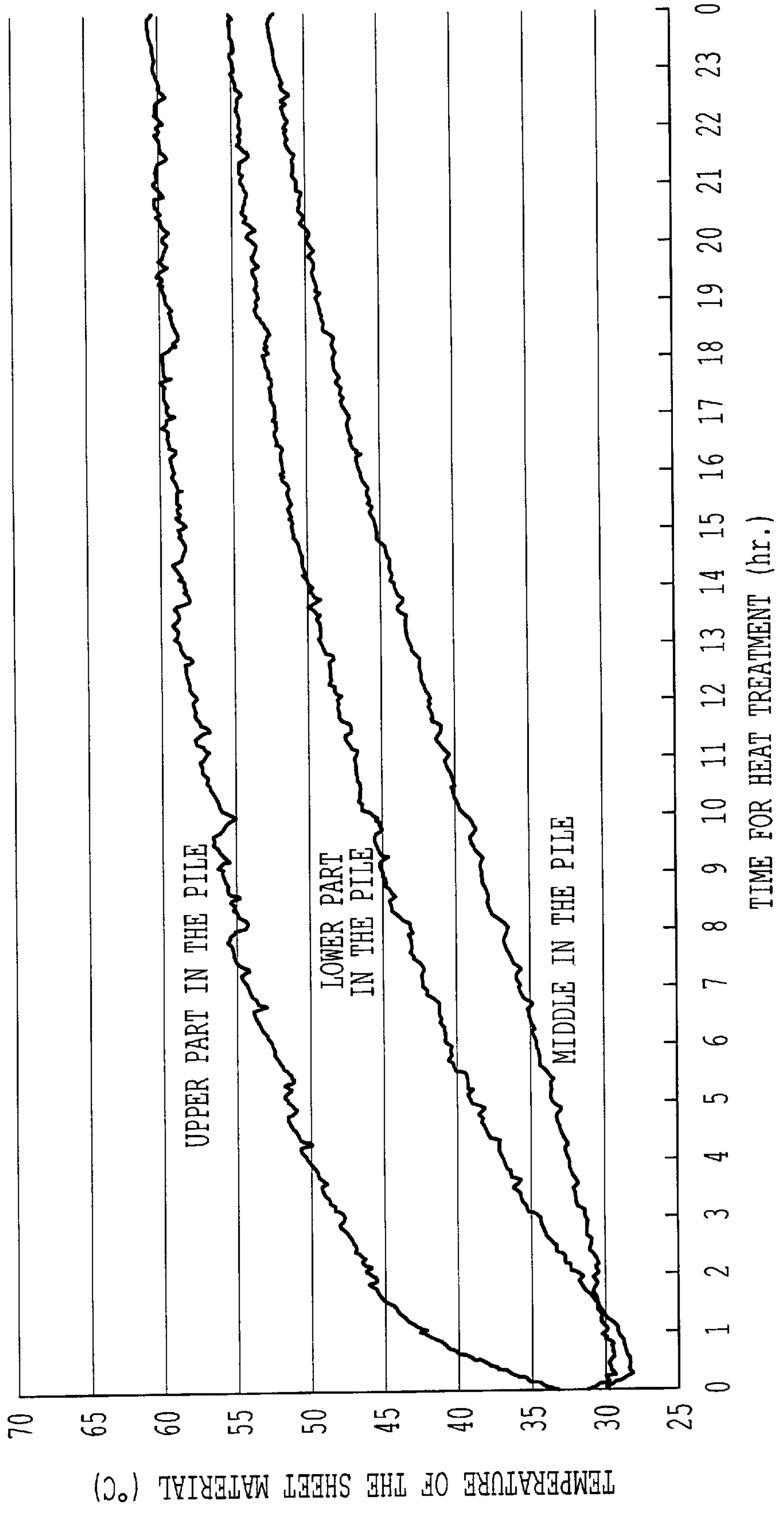

FIG. 16 is a graph illustrating the temperature distribution in Reference Example E3.

EXPLANATION OF THE REFERENCE NUMERALS USED IN THE DRAWINGS

1: Positive photosensitive lithographic printing plate
2: Protective material
3: Pallet
4: Moisture-impermeable material
5: Heat-insulating material
6: Coil core material
7: Aging chamber
8: Air circulation apparatus
9: Heat generator of a sheet shape
11: First drying step
12: Second drying step
13: Slit nozzle for hot air drying
14: Conveyer roll
15: Aluminum bar (positive photosensitive lithographic printing plate before cutting after the photosensitive layer is coated thereon).

DETAILED DESCRIPTION OF THE INVENTION

It is one object of the present invention to provide a positive photosensitive lithographic printing plate which can be exposed by using near infrared rays having a wavelength range of from 600 nm to 1,300 nm.

Such a positive photosensitive lithographic printing plate comprises a photosensitive material formed by coating a composition comprising both a photo-thermal conversion material having an absorption band within a wavelength range of from 600 nm to 1,300 nm and an alkali-soluble resin, onto a support.

The support on which a photosensitive layer comprising a photosensitive composition will be formed, may, for example, be a metal plate of e.g. aluminum, zinc, steel, copper or an alloy thereof, a metal plate having e.g. chromium, zinc, copper, nickel, aluminum or iron plated or vapor-deposited thereon, a paper sheet, a plastic film, a glass sheet, a resin-coated paper sheet, a paper sheet having a metal foil such as an aluminum foil bonded thereto, or a plastic film having a hydrophilic treatment applied thereto. An aluminum plate is preferred.

As the support for the photosensitive lithographic printing plate of the present invention, it is more preferred to employ an aluminum plate having grain treatment applied thereto by brush polishing or electrolytic etching in a hydrochloric acid or nitric acid solution, having anodizing treatment applied thereto in a sulfuric acid solvent and, if necessary, having surface treatment such as pore sealing treatment applied thereto.

As the photo-thermal conversion material to be used for the photosensitive composition of the present invention, a material having an absorption band within a wavelength range of from 600 nm to 1,300 nm, preferably from 650 nm to 1,100 nm, and absorbing a light having a wavelength within a range of from 600 nm to 1,300 nm and converting it to heat, is employed. The photo-thermal conversion material is a compound which effectively absorbs light having a wavelength within a range of from 600 nm to 1,300 nm, while it does not substantially absorb, or absorbs but is not substantially sensitive to, light in an ultraviolet region, and which will not bring about a chemical modification of the photosensitive composition by a weak ultraviolet ray which may be contained in white light.

The photo-thermal conversion material may be any of a dyestuff, an organic pigment or an inorganic pigment. Specifically, an inorganic pigment such as carbon black,- titanium monoxide or ferric oxide, a phthalocyanine pigment such as naphthalocyanine, or a dye having absorption band in a near infrared region, as disclosed in e.g. "Special Function Dye" (compiled by Ikemori and Hashiratani, 1986, published by Kabushiki Kaisha CMC), "Chemistry of Functional Dyes" (compiled by Higaki, 1981, published by Kabushiki Kaisha CMC) or "Dye Handbook" (compiled by Oga, Hirashima, Matsuoka and Kitao, published by Kodansha), may be mentioned.

As the photo-thermal conversion material, specific examples of the dye or pigment having an absorption band in a near infrared region, will be shown below.

S-1

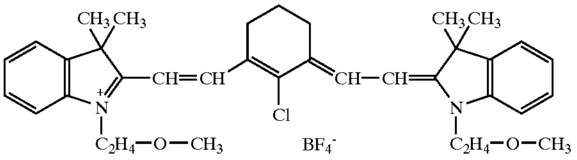

S-2

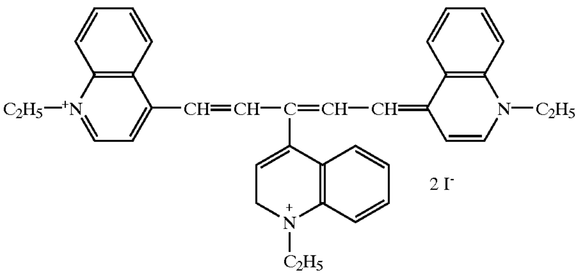

S-3

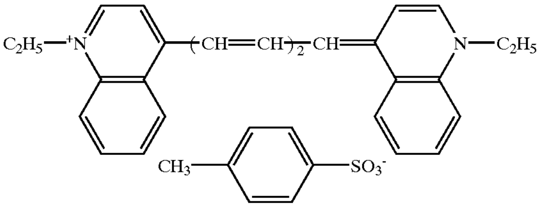

S-4

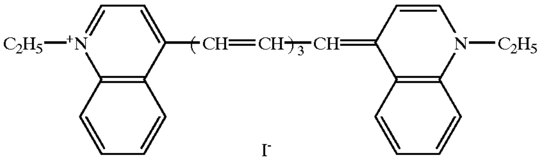

S-5

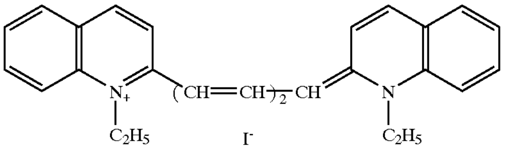

S-6

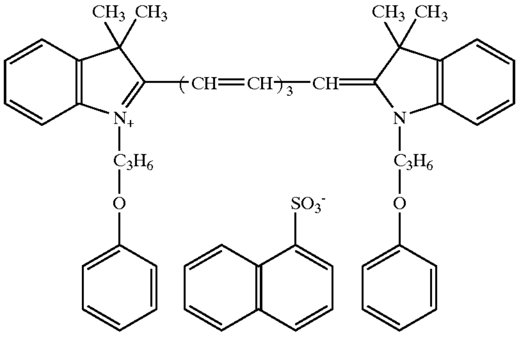

S-7

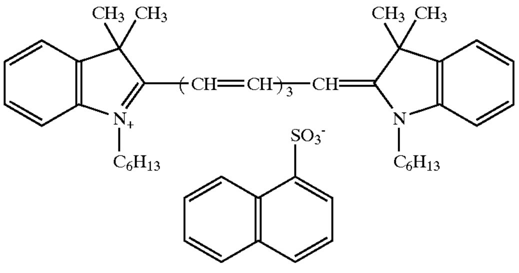

S-8

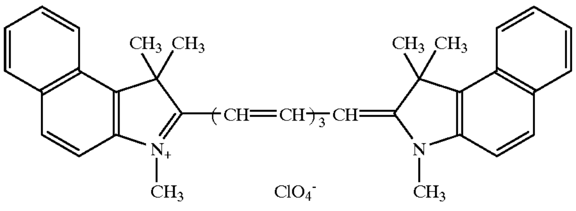

S-9

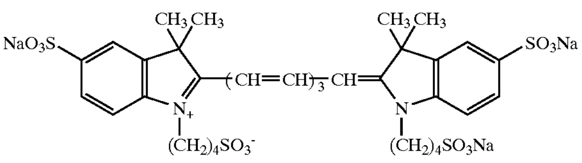

S-10

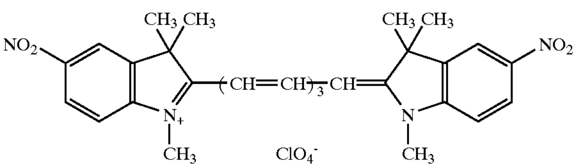

-continued
S-11
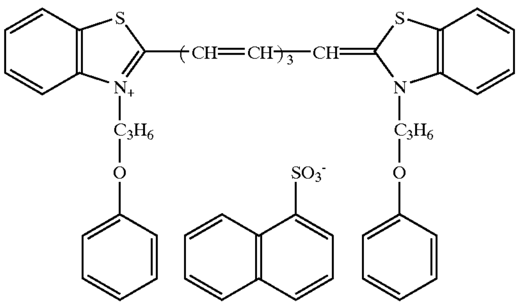
S-12
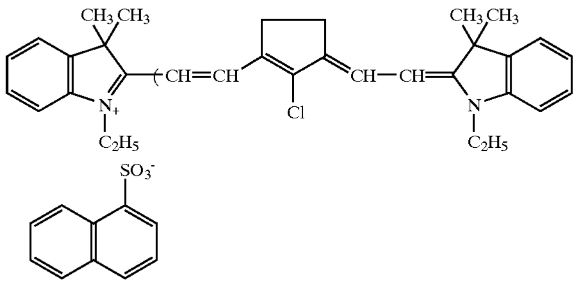
S-13
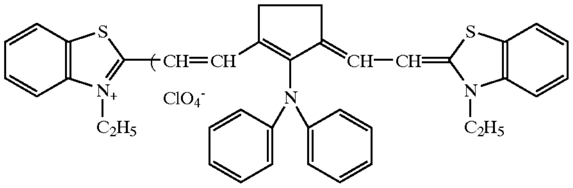
S-14
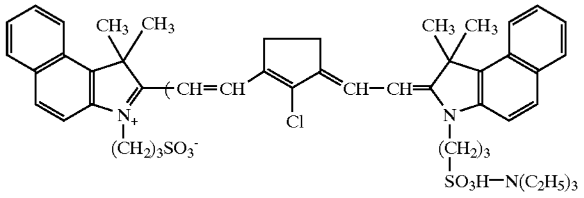
S-15
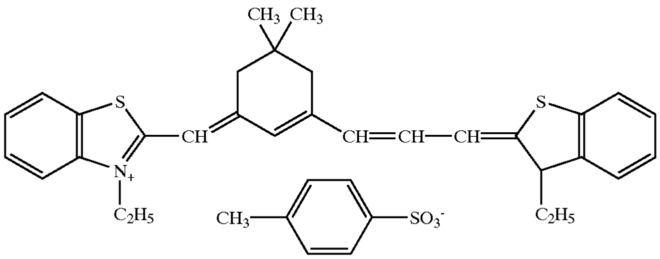
S-16
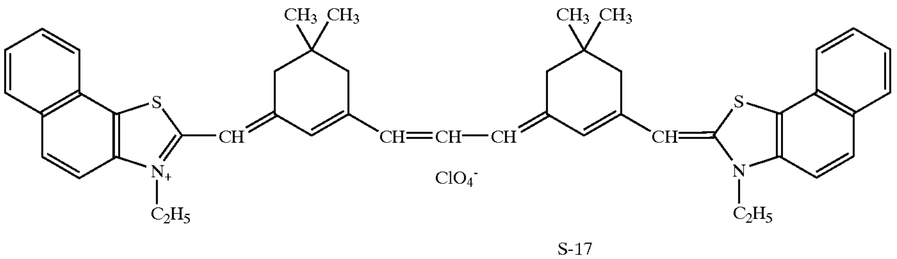
S-17
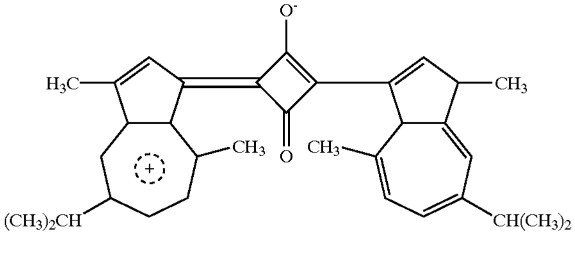
S-18
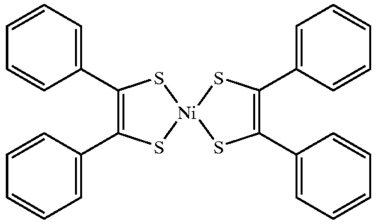

-continued
S-19
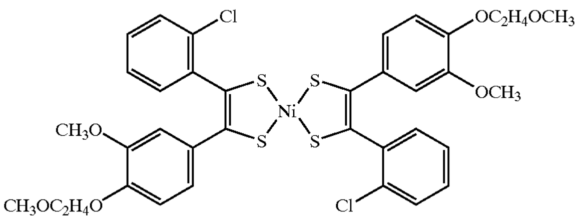
S-20
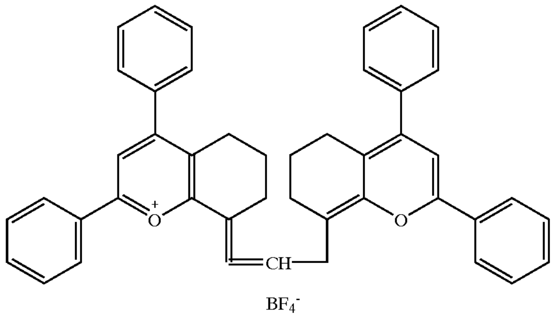
S-21
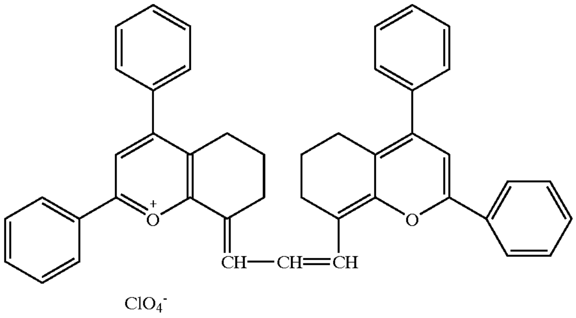
S-22
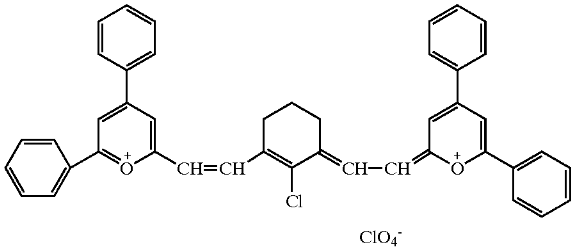
S-23
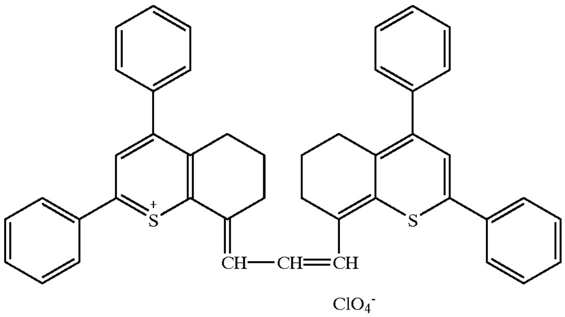
S-24
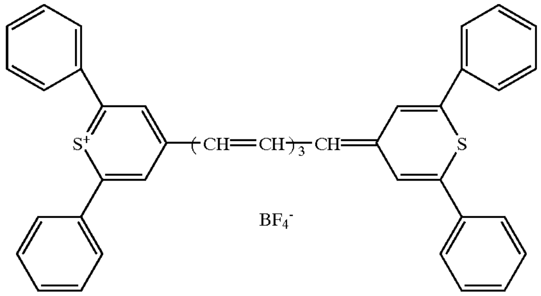
S-25
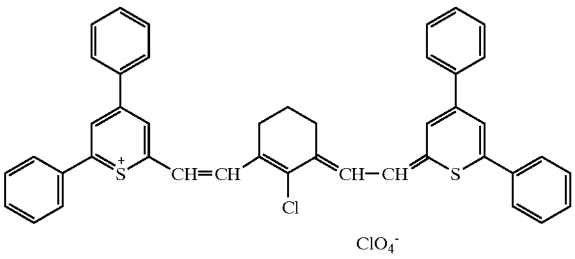
S-26
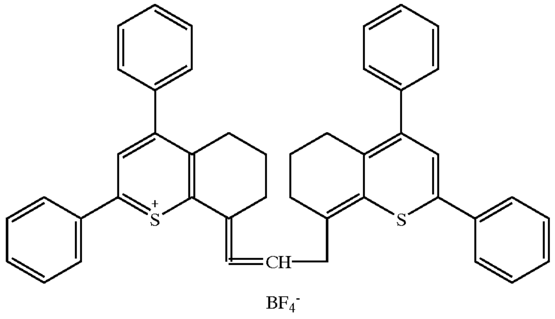

-continued
S-27
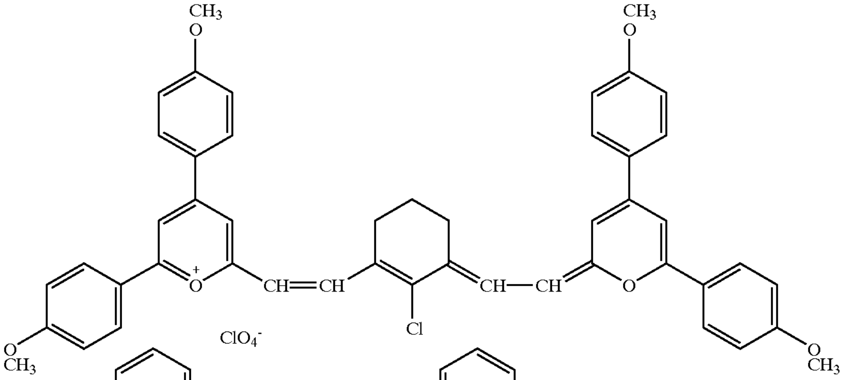
S-28
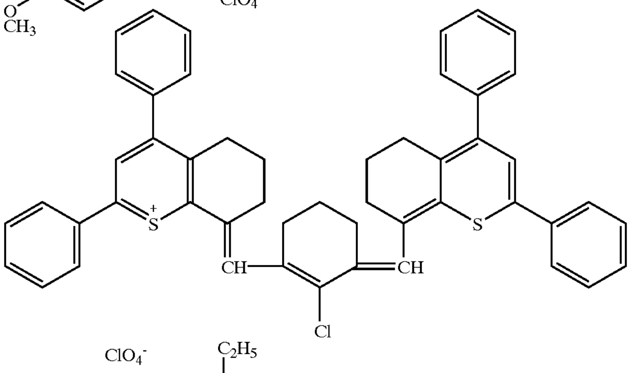
S-29
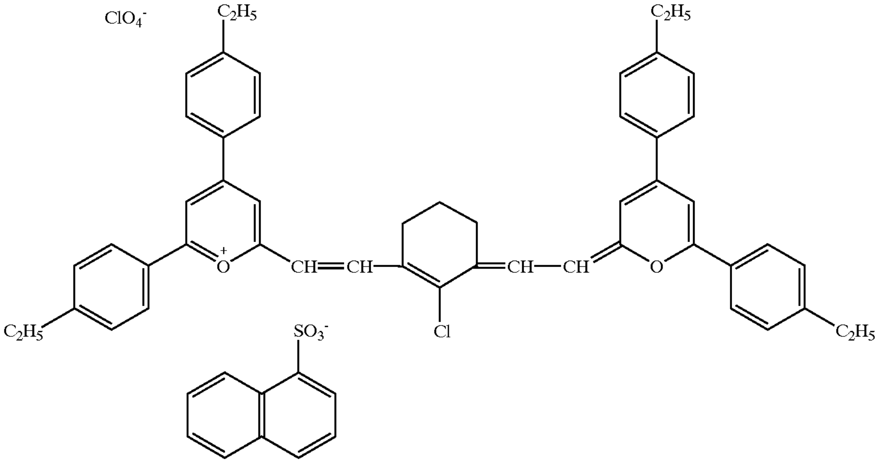
S-30
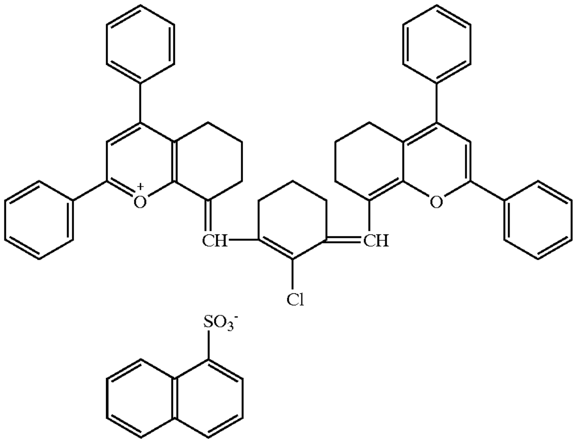
S-31
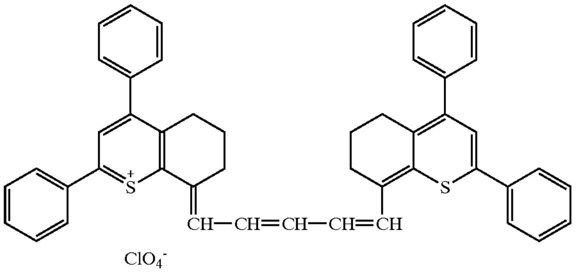

-continued
S-32
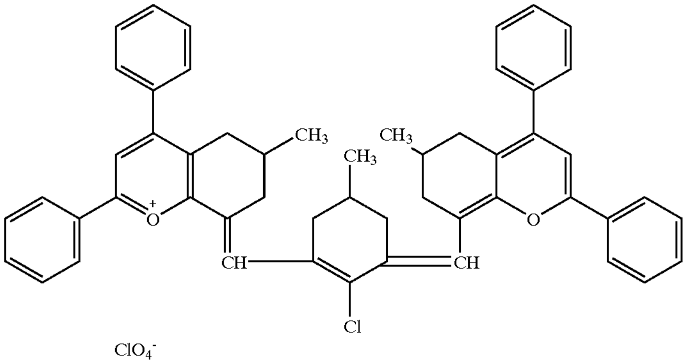
S-33
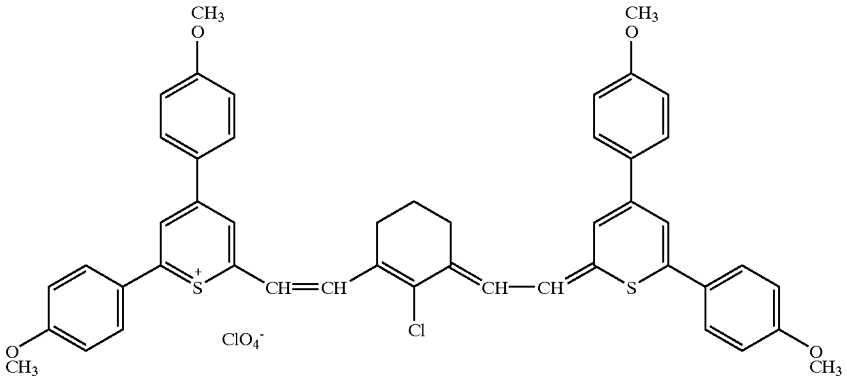
S-34
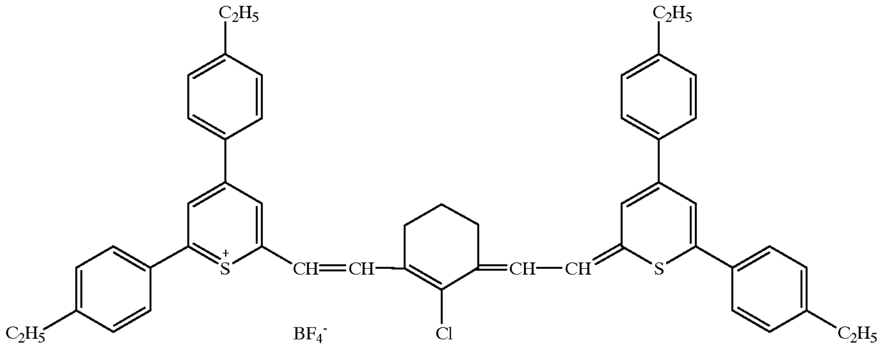
S-35
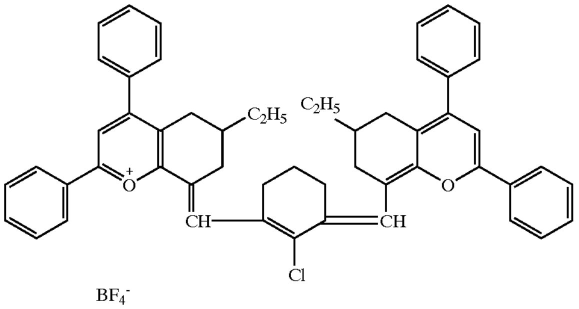
S-36
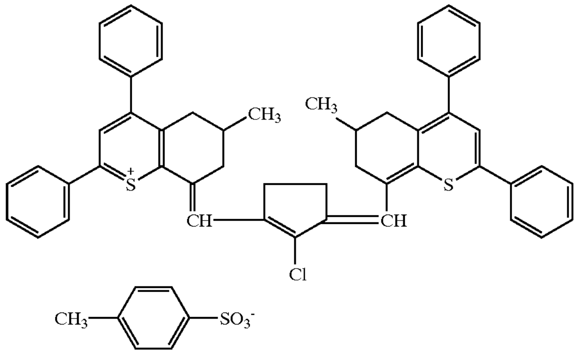

-continued
S-37
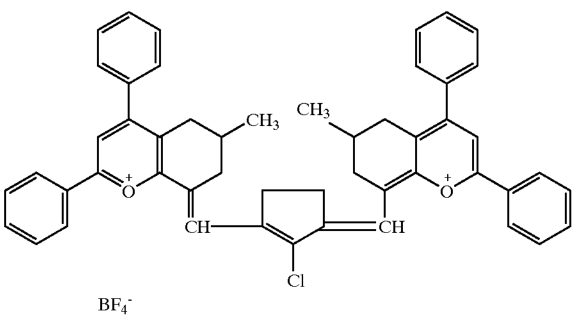
S-38
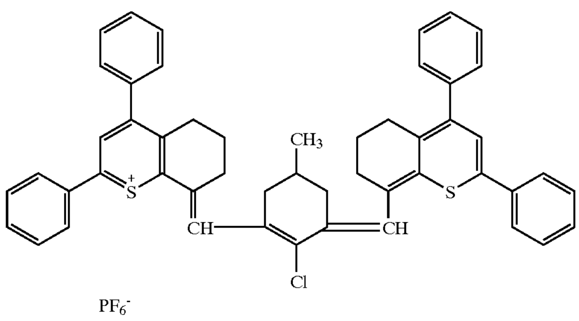
S-39
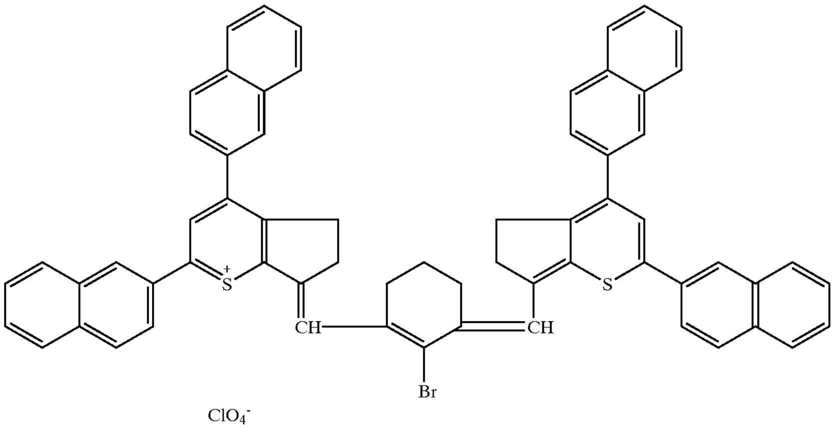
S-40
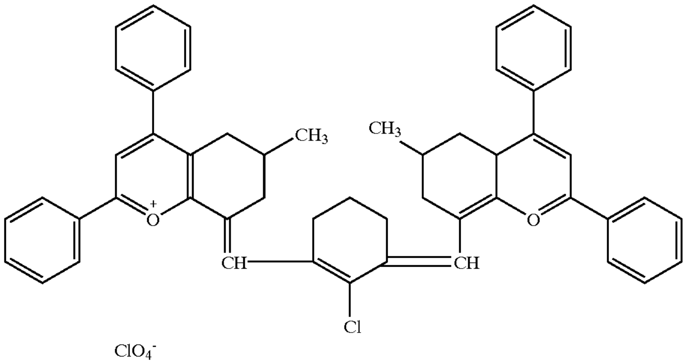
S-41
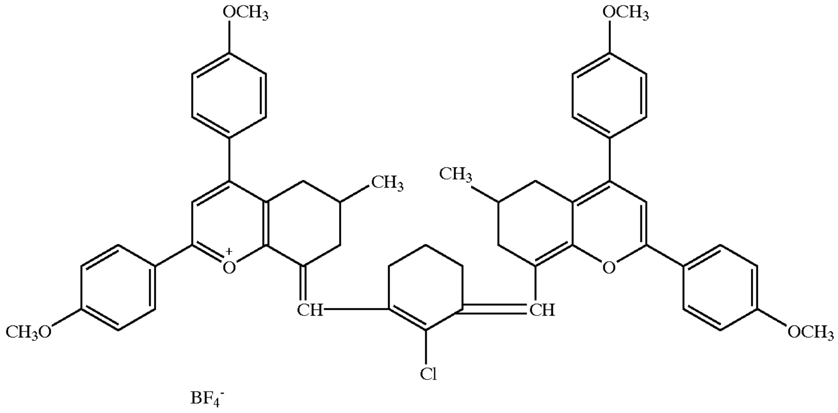

-continued
S-42
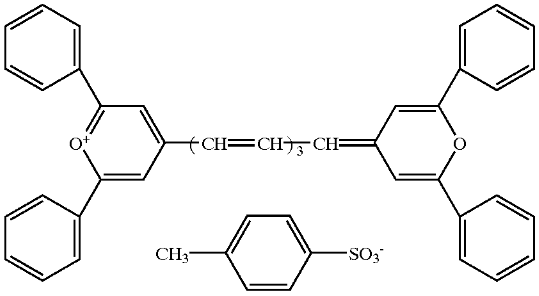
S-43
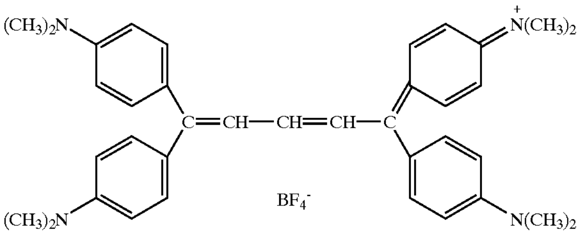
S-44
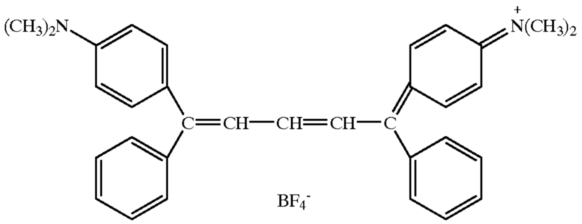
S-45
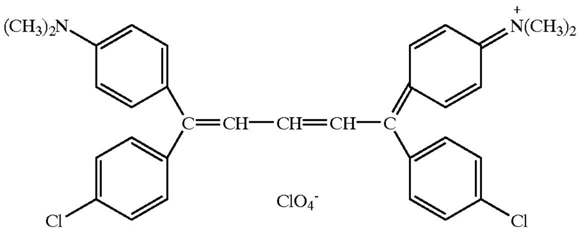
S-46
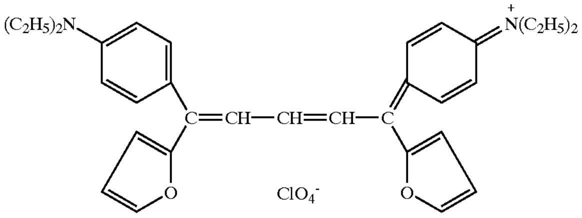
S-47
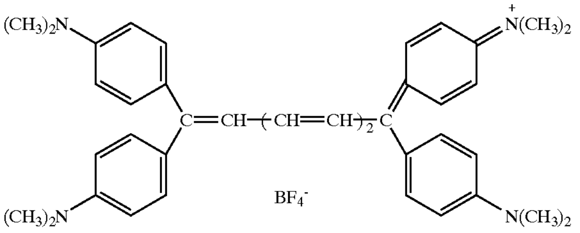
S-48
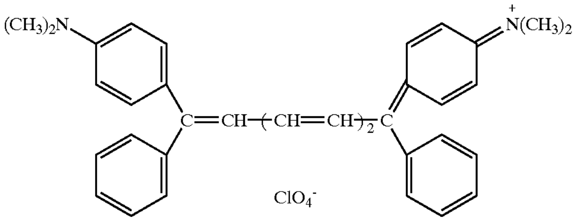
S-49
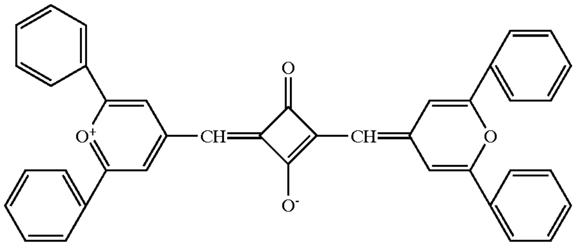
S-50
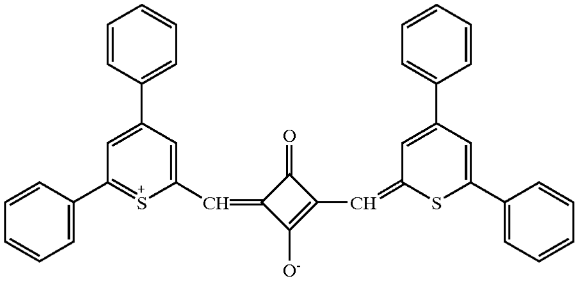
S-51
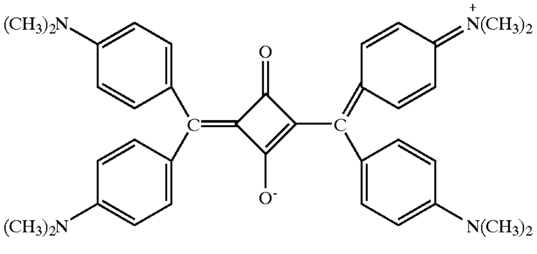

-continued
S-52
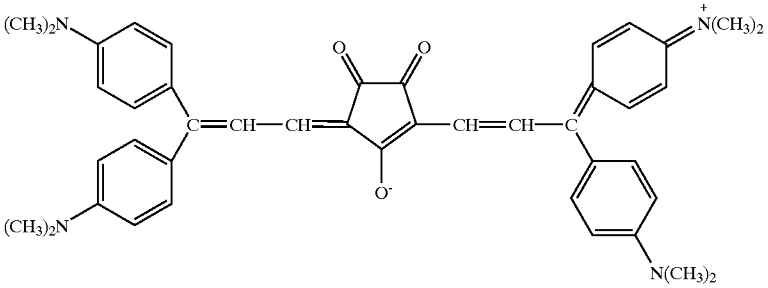
S-53
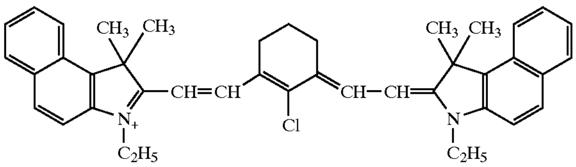
$BF_4^-$
S-54
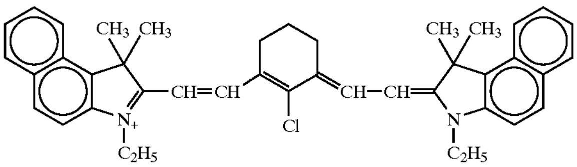
$^-BPh_4$
S-55
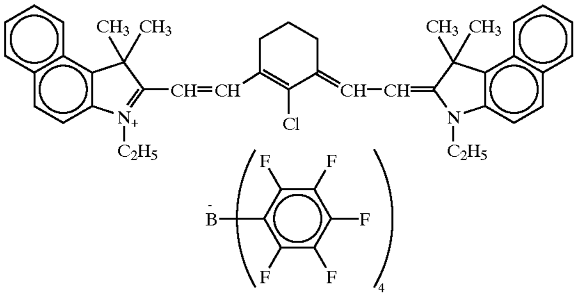
S-56
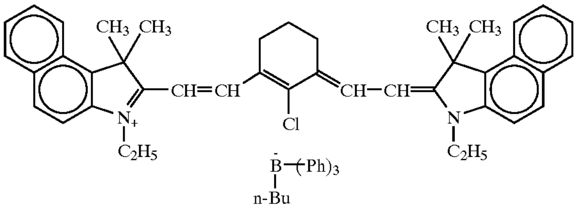
S-57
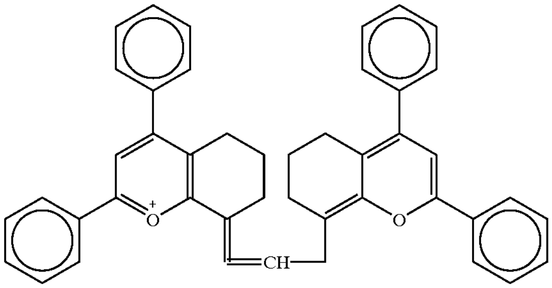
$^-B—Ph_4$
S-58
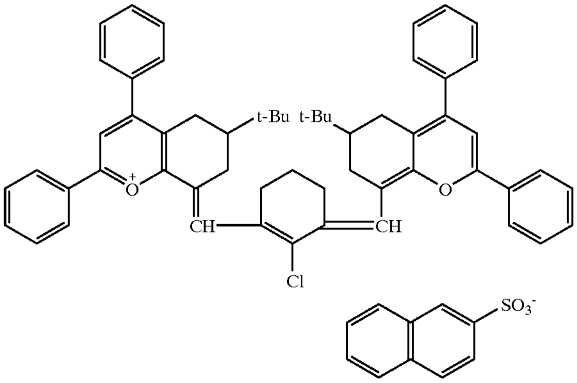
S-59
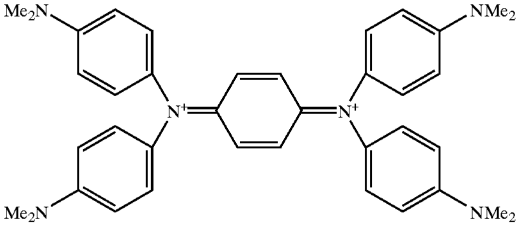
$2ClO_4^-$
S-60
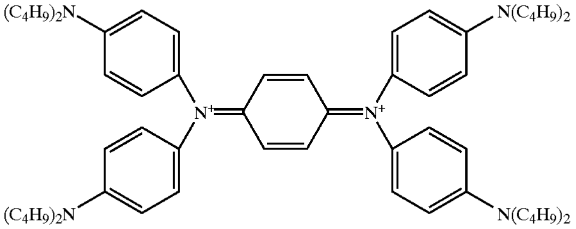
$2ClO_4^-$ -continued

S-61

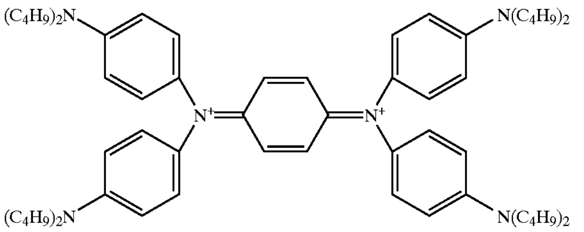

$Ph_3B^-C_4H_9$
$Ph_3B^-C_6H_{13}$

These dyes can be synthesized in accordance with conventional methods. The following additional suitable dyes may be commercially available.

S-62 polymethine dye: IR-820B (manufactured by Nippon Kayaku K.K.)

S-63 nigrosine dye: Colour Index Solvent Black 5

S-64 nigrosine dye: Colour Index Solvent Black 7

S-65 nigrosine dye: Colour Index Acid Black 2

S-66 carbon black: MA-100 (manufactured by Mitsubishi Chemical Corporation)

S-67 titanium monoxide: Titanium Black 13M (manufactured by Mitsubishi Material K.K.)

S-68 titanium monoxide: Titanium Black 12S (manufactured by Mitsubishi Material K.K.)

As the photo-thermal conversion material to be used in the present invention, preferred are a cyanine dye, a polymethine dye, a squarilium dye, a croconium dye, a pyrylium dye, a thiopyrylium dye, a phthalocyanine type compound, and a compound having an N,N-diaryliminium skeleton. Particularly, a cyanine dye, a polymethine dye, a pyrylium dye, a thiopyrylium dye and a compound having an N,N-diaryliminium skeleton, are more preferred.

Further, the preferred photo-thermal conversion material varies depending upon the wavelength of the laser. For example, in the case of using a laser light having a wavelength in the vicinity of 830 nm, a cyanine dye is particularly preferred, and a compound represented by the following general formula (I) is most preferred.

(I)

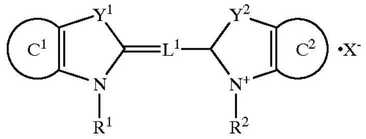

wherein each of the ring $C^1$ and the ring $C^2$ which are independent of each other, is a benzene ring or a naphthalene ring which may have a substituent, each of $Y^1$ and $Y^2$ which are independent of each other, is a dialkylmethylene group or a sulfur atom, each of $R^1$ and $R^2$ which are independent of each other, is a hydrocarbon group which may have a substituent, $L^1$ is a tri-, penta- or hepta-methine group which may have a substituent, provided that two substituents in said penta- or hepta-methine group may bond to each other to form a $C_{5-7}$ cycloalkene ring, and $X^-$ is a counter anion.

As the substituent for each of $R^1$ and $R^2$ in the formula (I), an alkoxy group, a phenoxy group, a hydroxyl group or a phenyl group is preferred. As the substituent for $L^1$, an alkyl group, an amino group or a halogen atom is preferred. As the substituent for each of the ring $C^1$ and the ring $C^2$, an alkyl group, an alkoxy group, a nitro group or a halogen atom is preferred.

Further, in the case of using a laser light having a wavelength in the vicinity of 1,064 nm, a compound having an N,N-diaryliminium skeleton is particularly preferred, and a compound represented by the following general formula (IIa) or (IIb) is most preferred.

(IIa)

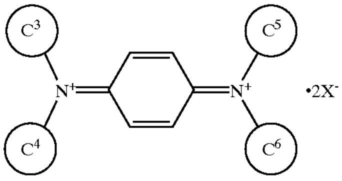

(IIb)

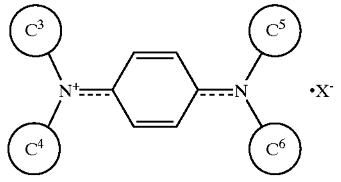

wherein each of $C^3$ to $C^6$ which are independent of one another, is a benzene ring which may have a substituent, $X^-$ is a counteranion, and the cyclohexadiene ring to which nitrogen atoms are bonded, may have a substituent.

In the formula (IIa) and the formula (IIb), as the substituent for each of $C^3$ to $C^6$, an alkoxy group, an aryloxy group, a dialkylamino group, a diarylamino group or an alkylarylamino group is preferred, and among these, a dialkylamino group, a diarylamino group or an alkylarylamino group is particularly preferred. As the substitution position, the para-position is preferred. Further, at least three or rings $C^3$ to $C^6$, have the above-mentioned substituents, and more preferably all of $C^3$ to $C^6$ have substituents. As the substituent for the cyclohexadiene ring, an alkyl group or a halogen atom is preferred.

The proportion of such a photo-thermal conversion material in the positive photosensitive composition of the present invention is, in a weight ratio, preferably at least 0.1 wt %, more preferably at least 1 wt %, particularly preferably at least 2 wt %, and preferably at most 50 wt %, more preferably at most 30 wt %, and particularly preferably at most 20 wt %.

The alkali-soluble resin to be used as the second component in the photosensitive composition of the present invention may be any resin which is soluble in an alkali developer, and preferably one which contains at least a novolak resin or a polyvinyl phenol resin.

Further, the alkali-soluble resin maybe a mixture of at least two kinds, and the alkali-soluble resin may be mixed with an alkali-insoluble resin, within a range of not depriving of solubility of the photosensitive material in an alkali developer.

The novolak resin may be one prepared by polycondensing at least one member selected from aromatic hydrocarbons such as phenol, m-cresol, o-cresol, p-cresol, 2,5-xylenol, 3,5-xylenol, resorcinol, pyrogallol, bisphenol, bisphenol-A, trisphenol, o-ethylphenol, m-ethylphenol, p-ethylphenol, propylphenol, n-butylphenol, t-butylphenol, 1-naphthol and 2-naphthol, with at least one aldehyde or ketone selected from aldehydes such as formaldehyde, acetaldehyde, propionaldehyde, benzaldehyde and furfural and ketones such as acetone, methyl ethyl ketone and methyl isobutyl ketone, in the presence of an acid catalyst.

Instead of the formaldehyde and acetaldehyde, paraformaldehyde and paraldehyde may, respectively, be used. The weight average molecular weight calculated as polystyrene, measured by gel permeation chromatography (hereinafter referred to simply as GPC) of the novolak resin (the weight average molecular weight by the GPC measurement will hereinafter be referred to as Mw) is preferably from 1,000 to 15,000, particularly preferably from 1,500 to 10,000.

The aromatic hydrocarbon of the novolak resin may be more preferably a novolak resin obtained by polycondensing at least one phenol selected from phenol, o-cresol, m-cresol, p-cresol, 2,5-xylenol, 3,5-xylenol and resorcinol, with at least one member selected from aldehydes such as formaldehyde, acetaldehyde and propionaldehyde.

Among these, preferred is a novolak resin which is a polycondensation product of an aldehyde with a phenol comprising m-cresol/p-cresol/2,5-xylenol/3,5-xylenol/resorcinol in a mixing molar ratio of 70 to 100/0 to 30/0 to 20/0 to 20/0 to 20, or with a phenol comprising phenol/m-cresol/p-cresol in a mixing molar ratio of 10 to 100/0 to 60/0 to 40. Among aldehydes, formaldehyde is particularly preferred. As set forth in the Examples, both invention and comparative, the m-cresol/p-cresol/phenol molar ratio of the novolak used is 3:2:5.

The polyvinyl phenol resin may be a polymer of one or more hydroxystyrenes such as o-hydroxystyrene, m-hydroxystyrene, p-hydroxystyrene, 2-(o-hydroxyphenyl) propylene, 2-(m-hydroxyphenyl)propylene and 2-(p-hydroxyphenyl)propylene. Such a hydroxystyrene may have a substituent such as a halogen such as chlorine, bromine, iodine or fluorine, or a $C_{1-4}$ alkyl substituent, on its aromatic ring. Accordingly, the polyvinyl phenol may be a polyvinyl phenol which may have a halogen or a $C_{1-4}$ alkyl substituent on its aromatic ring.

The polyvinyl phenol resin is usually prepared by polymerizing one or more hydroxystyrenes which may have a substituent in the presence of a radical polymerization initiator or a cationic polymerization initiator. Such a polyvinyl phenol resin may be the one subjected to partial hydrogenation.

Or, it may be a resin having part of —OH groups in a polyvinyl phenol protected by e.g. t-butoxycarbonyl groups, pyranyl groups or furanyl groups. Mw of the polyvinyl phenol resin is preferably from 1,000 to 100,000, particularly preferably from 1,500 to. 50,000.

More preferably, the polyvinyl phenol resin may be a polyvinyl phenol which may have a $C_{1-4}$ alkyl substituent on its aromatic ring, particularly preferably an unsubstituted polyvinyl phenol.

If Mw of the above novolak resin or polyvinyl phenol resin is lower than the above range, no adequate coating film tends to be obtainable, and if it exceeds the above range, the solubility of the non-exposed portion in an alkali developer tends to be small, whereby a pattern tends to be hardly obtainable.

Among the above described resins, a novolak resin is particularly preferred.

The proportion of such a resin in the positive photosensitive composition to be used in the present invention, is preferably at least 40%, more preferably at least 60%, and preferably at most 95%, more preferably at most 90%, in a weigh ratio.

As used herein, a “photosensitive layer” or “photosensitive material” comprises at least photothermal conversion material having an absorption band within a wavelength of from 600 nm to 1300 nm and an alkali-soluble resin.

A third component may be included in the photosensitive material to be used in the present invention. The third component is a solubility-suppressing agent capable of lowering the dissolution rate in an alkali developer of a blend comprising the above-mentioned photo-thermal conversion material and the above-mentioned alkali-soluble resin. (Hereinafter the third component will be referred to simply as a solubility-suppressing agent.)

Suitable solubility-suppressing agents to be used in the present invention include, a sulfonic acid ester, a phosphoric acid ester, an aromatic carboxylic acid ester, an aromatic disulfone, a carboxylic anhydride, an aromatic ketone, an aromatic aldehyde, an aromatic amine, an aromatic ether compound or a compound having a triarylmethane skeleton. Further, an acid color-developable dye having a lactone skeleton, an N,N-diarylamide skeleton or a diarylmethylimino skeleton, or a base color-developable dye having a lactone skeleton, a thiolactone skeleton or a sulfolactone skeleton.

Further, as the solubility-suppressing agent, a surface active agent may be mentioned, and preferred is a nonionic surface active agent such as a polyethylene glycol, a polyethylene glycol/polypropylene glycol block copolymer, a polyethylene glycol alkyl ether, a polyethylene glycol/polypropylene glycol alkyl ether, a polyethylene glycol alkyl phenyl ester, a polyethylene glycol fatty acid ester, a polyethylene glycol alkylamine, a polyethylene glycol alkyl amino ether, a glycerin fatty acid ester or a polyethylene oxide addition product thereof, a sorbitan fatty acid ester or a polyethylene oxide addition product thereof, a sorbitol fatty acid ester or a polyethylene oxide addition product thereof, a pentaerythrite fatty acid ester or a polyethylene oxide addition product thereof, or a polygycerol fatty acid ester. The nonionic surface active agent has preferably HLB at least 8, particularly preferably HLB at least 10.

Among these, as the solubility-suppressing agent in the present invention, preferred is a sulfonic acid ester, or the nonionic surface active agent having HLB at least 10, such as a polyethylene glycol, a polyethylene glycol/polypropylene glycol block copolymer, a polyethylene glycol alkyl ether, a polyethylene glycol alkyl phenyl ether, a polyethylene glycol fatty acid ester, a glycerol fatty acid ester or a polyethylene oxide addition product thereof, a sorbitan fatty acid ester or a polyethylene oxide addition product thereof, a sorbitol fatty acid ester or a polyethylene oxide addition product thereof, a pentaerythrite fatty acid ester or a polygycerol fatty acid ester. Further, the acid color-developable dye having a lactone skeleton, which can be used as an exposure image-forming agent, also has a solubility-suppressing effect.

Among such solubility-suppressing agents, a sulfonic acid ester compound and a compound having a triarylmethane skeleton are preferred, and a sulfonic acid ester having a naphthalene skeleton is more preferred.

Further, the above-mentioned compound having a solubility-suppressing effect and having part of hydroxyl groups or carboxyl groups contained in the alkali-soluble resin bonded thereto by ester linkage, may also preferably be used. In this case, it is considered that the resin moiety and the solubility-suppressing agent moiety coexist in one molecule. Among compounds having the solubility-suppressing agent moiety in an alkali-soluble resin molecule, one wherein the alkali-soluble resin has phenolic hydroxyl groups, and at least part of said phenolic hydroxyl groups are esterified by a sulfonic acid compound, is more preferred.

The mechanism of the solubility-suppressing agent is not necessarily clear. However, the following consideration has been made. Namely, the photosensitive layer of the positive photosensitive lithographic printing plate of the present invention has characteristics that it dissolves in an alkali developer, and the solubility is low before irradiation with laser light, and is high after the irradiation. The photosensitive material to be used in the present invention comprises an alkali-soluble resin such as a novolak resin or a polyvinyl phenol resin, and the alkali-soluble resin has polar groups such as phenolic hydroxyl groups. It is theorized that the alkali-soluble resin may have a space conformation wherein the polar groups can interact with each other, whereby the intermolecular force between resin molecules will be large, or may have a specific space conformation wherein substituents which will undergo neutralization reaction with an alkali, such as carboxylic groups or phenolic hydroxyl groups, are covered with another moiety in the resin molecules, and as a result, the reaction rate to the alkali developer tends to be low.

In the case where the solubility-suppressing agent is added to such an alkali-soluble resin, the solubility of the photosensitive material in an alkali developer tends to be low, as compared with the case where no solubility-suppressing agent is added. It is believed that solubility is low because the intermolecular force between the resin molecules is strengthened by polar groups in the solubility-suppressing agent molecule, in addition the binding power is strengthened by interaction of the polar groups in the solubility-suppressing agent molecules with the polar groups in the alkali-soluble resin, such as hydrogen bonding. Alternatively or simultaneously, the alkali-soluble resin may have a space conformation wherein the intermolecular force between the resin molecules increases as a result of a certain specific structure of the solubility-suppressing agent molecules, or the solubility-suppressing agent itself may have a low solubility in an alkali developer.

The above-mentioned photo-thermal conversion material, alkali-soluble resin and solubility-suppressing agent are basic components for the photosensitive material to be used in the present invention, and the photosensitive lithographic printing plate of the present invention may contain, within a range of not impairing its performances, various additives in the photosensitive layer.

As the additive, an acid color-developable dye can be used to improve the exposure image-forming property, and it is particularly preferred to use a compound capable of forming a proton shift complex with the phenolic hydroxyl group in the alkali-soluble resin.

Said proton shift complex is usually less likely to be formed only by mixing the acid color-developable dye with the alkali-soluble resin having phenolic hydroxyl groups, and its formation is usually accelerated by carrying out heat treatment. It is considered that a portion exposed with laser light develops color, and an excellent exposure image-forming property can be obtained, on the basis of this principle.

The acid color-developable dye in a present invention does not absorb visible light itself, or it absorbs little amount. 100 parts by weight of a phenolic novolak resin and 10 parts by weight of an acid color-developable dye are dissolved in 1,000 parts by weight of methyl cellosolve, and the solution is coated on a support followed by drying at 80° C. for 2 minutes, to form a coated film of 2.5 μm, and when an absorption of at least 10 times of the absorption of the acid color-developable dye itself is confirmed in the visible light region, the acid color-developable dye is applicable to the present invention.

Among the acid color-developable dyes, a compound having a lactone skeleton in its molecule is preferred, and a compound having a skeleton of the following formula (III) in its molecule is more preferred.

(III)

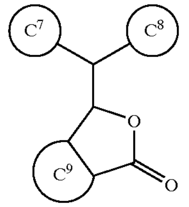

wherein each of $C^7$ to $C^9$ is a benzene ring or a naphthalene ring which may have a substituent, and the substituents on $C^7$ and $C^8$ may bond to each other to form a cyclic structure.

In the formula (III), the substituent in each of $C^7$ to $C^9$, is preferably an alkyl group, a halogen atom, an alkoxy group which may have a substituent, an aryloxy group which may have a substituent, an amino group which may have a substituent, an alkylthio group which may have a substituent, or an arylthio group which may have a substituent, and it is more preferred that at least one of $C^7$ and $C^8$ has an alkoxy group which may have a substituent, an aryloxy group which may have a substituent, an amino group which may have a substituent, an alkylthio group which may have a substituent, or an arylthio group which may have a substituent.

Further, as the case requires, the photosensitive layer to be used in the present invention may contain a coloring material like a pigment or a dyestuff, such as Victoria Pure Blue (42595), Auramine O (41000), Catilon Briliant Flavin (basic 13), Rhodamine 6GCP (45160), Rhodamine B (45170), Safranine OK70: 100(50240), Erio Grawsin X (42080), Fast Black HB (26150), No. 120/Lionol Yellow (21090), Lionol Yellow GRO (21090), Similor First Yellow 8GF (21105), Benzidine Yellow 4T-564D (21095), Shimilor First Red 4015 (12355), Lionol Red B4401 (15850), Fast Gen Blue TGR-L (74160), or Lionol Blue SM (26150). The numerals in the above brackets ( ) indicate the color index (C.I.).

The photosensitive material to be used in the present invention may further contain an organic acid having pKa of preferably at least 2, or an anhydride of such an organic acid, with the purpose of improving the development property such as imparting under development property, as the case requires.

The organic acid or its anhydride may, for example, be one as disclosed in e.g. JP-A-60-88942, JP-A-63-276048 or JP-A-2-96754. Specifically, it may, for example, be an aliphatic saturated carboxylic acid such as glyceric acid, methyl malonic acid, dimethyl malonic acid, propyl malonic acid, succinic acid, malic acid, mesotartaric acid, glutaric acid, β-methyl glutaric acid, β,β-dimethyl glutaric acid, β-ethyl glutaric acid, β,β-diethyl glutaric acid, β-propyl glutaric acid, β,β-methylpropyl glutaric acid, pimelic acid, suberic acid or sebacic acid, an aliphatic unsaturated carboxylic acid such as maleic acid, fumaric acid or glutaconic acid, a carbocyclic saturated carboxylic acid such as 1,1-cyclobutane dicarboxylic acid, 1,3-cyclobutane dicarboxylic acid, 1,1-cyclopentane dicarboxylic acid, 1,2-cyclopentane dicarboxylic acid, 1,1-cyclohexane dicarboxylic acid, 1,2-cyclohexane dicarboxylic acid, 1,3-cyclohexane dicarboxylic acid or 1,4-cyclohexane dicarboxylic acid, a carbocyclic unsaturated carboxylic acid such as 1,2-cyclohexene dicarboxylic acid, 2,3-dihydroxybenzoic acid, 3,4-dimethylbenzoic acid, 3,4-dimethoxybenzoic acid, 3,5-dimethoxybenzoic acid, p-toluic acid, 2-hydroxy-p-toluic acid, 2-hydroxy-m-toluic acid, 2-hydroxy-o-toluic acid, mandelic acid, gallic acid, phthalic acid, isophthalic acid or terephthalic acid, or anhydride such as meldrum acid, ascorbic acid, succinic anhydride, glutaric anhydride, maleic anhydride, cyclohexene dicarboxylic anhydride, cyclohexane dicarboxylic anhydride or phthalic anhydride.

Among these, an aliphatic dicarboxylic acid is preferred, and an alicyclic dicarboxylic acid is more preferred.

The photosensitive material to be used in the present invention may contain a compound capable of crosslinking the alkali-soluble resin by the effect of heat (hereinafter sometimes referred to as thermocrosslinking compound). In the case where the thermocrosslinking compound is contained in the photosensitive material, by heat treatment after exposure, the alkali-soluble resin undergoes crosslinking, whereby the chemical resistance and the printing resistance can be improved.

The thermocrosslinking compound to be used in the present invention may be a compound capable of crosslinking the alkali-soluble resin, when heated to usually from 150° C. to 300° C.

The thermocrosslinking compound may be a nitrogen-containing compound having a thermocrosslinking property, preferably a compound containing an amino group. More specifically, it may, for example, be an amino compound having, as functional groups, at least two members selected from a methylol group, an alkoxymethyl group which is an alcohol condensation modified product thereof, and an acetoxymethyl group.

Among the compounds having an amino group, preferred is one having a heterocyclic structure, particularly a nitrogen-containing heterocyclic structure, in its structure, and more preferred is a compound having a melamine skeleton represented by the following formula (IV).

(IV)

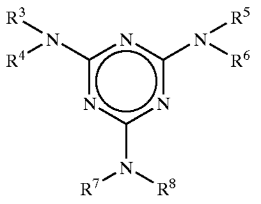

wherein each of $R^3$ to $R^8$ which are independent of one another, is a group —$CH_2OU$, provided that U is a hydrogen atom, an alkyl group, an alkenyl group or an acyl group.

Further, among the compounds of the formula (IV), one having a hydrogen atom or a $C_{1-4}$ alkyl group as U is preferred, and one having an alkoxylation ratio (the ratio (molar ratio) of U in —$CH_2OU$ being a $C_{1-4}$ alkyl group to the total of —$CH_2OU$ as represented by each of $R^3$ to $R^8$) of at least 70%, preferably from 80% to 100%, is advantageous.

Further, one having a hydrogen atom or a methyl group as U, and having a methoxylation ratio (the ratio (molar ratio) of U in —$CH_2OU$ being a methyl group to the total of —$CH_2OU$) of from 80% to 100%, is particularly advantageous.

Specifically, said amino compound may, for example, be a melamine derivative such as methoxy methylated melamine (e.g. Cymel 300 series (1) by Mitsui Cytec Company (former Mitsui Cyanamid Company)), a benzoguanamine derivative such as a methyl/ethyl mixed alkoxylated benzoguanamine resin (e.g. Cymel 1100 series (2) by Mitsui Cytec Company), a glycoluryl derivative such as a tetramethylol glycoluryl resin (e.g. Cymel 1100 series (3) by Mitsui Cytec Company), or another urea resin derivative.

Among these, a melamine derivative is particularly preferred.

The photosensitive material of the present invention may further contain e.g. a dyestuff, a pigment, a coating property-improving agent, a development-improving agent, an adhesion-improving agent, a sensitivity-improving agent or an oleophilic agent, in addition to the above-mentioned components.

Irradiation of the photosensitive material to be used in the present invention, with a near infrared ray having a wavelength within a range of from 600 nm to 1,300 run, causes the dissolution rate of the exposed portion in an alkali developer to be high. To take advantage of this characteristic, it is preferred to consider the following points with respect to the substance to be contained in the photosensitive material.

(1) The photosensitive material, including the compounds included therein. preferably does not substantially undergo a chemical change by irradiation with ultraviolet or visible ray (250 nm–600 run) or near infrared ray (600 nm–1,300 nm). By "no chemical change" is meant that the compound does not undergo a chemical change when exposed to light but may undergo a conformation change or a change in the interaction of said compound with other materials via weak forces such as van der Waal's forces and hydrogen bonding. For example, compounds which will undergo a chemical change by irradiation with light, such as photo-acid-generators or o-quinonediazide compounds, may act as very strong solubility suppressing agents and, accordingly, when such a compound is not contained in the photosensitive material the original performances of the photosensitive layer of the present invention (hereinafter sometimes referred to as inclined photosensitive material) is such that the dissolution rate in an alkali developer, in unexposed condition, increases from the surface part toward the lower part, are not prevented.

(2) The solubility of the photosensitive layer in an alkali developer is not substantially changed by irradiation with ultraviolet ray, whereby the photosensitive lithographic printing plate can be handled under white light, such being advantageous.

The photosensitive composition to be used in the present invention is prepared usually by dissolving the above mentioned various components in a suitable solvent. The solvent is not particularly limited so long as it is a solvent which provides sufficient solubility for the components used, and presents an excellent coating film property. It may, for example, be a cellosolve solvent such as methylcellosolve, ethylcellosolve, methylcellosolve acetate or ethylcellosolve acetate, a propylene glycol solvent such as propylene glycol monomethyl ether, propylene glycol monoethyl ether, propylene glycol monobutyl ether, propylene glycol monomethyl ether acetate, propylene glycol monoethyl ether acetate, propylene glycol monobutyl ether acetate or dipropylene glycol dimethyl ether, an ester solvent such as butyl acetate, amyl acetate, ethyl butyrate, butyl butyrate, diethyl oxalate, ethyl pyruvate, ethyl-2-hydroxy butyrate, ethyl acetoacetate, methyl lactate, ethyl lactate or methyl 3-methoxypropionate, an alcohol solvent such as heptanol, hexanol, diacetone alcohol or furfuryl alcohol, a ketone solvent such as cyclohexanone or methyl amyl ketone, a highly polar solvent such as dimethyl formamide, dimethyl acetamide or N-methyl pyrrolidone, or a mixed solvent thereof, or one having an aromatic hydrocarbon added thereto. The proportion of the solvent is usually within a range of from 1 to 20 times in a weight ratio to the total amount of the photosensitive composition.

Among such solvents, a cellosolve solvent is preferred.

As a method for coating the photosensitive composition on the surface of a support, to be used in the present invention, a conventional method such as rotational coating, wire bar coating, dip coating, air knife coating, roll coating, blade coating or curtain coating may, for example, be employed.

Inclined Photosensitive Layer

The thickness of said photosensitive layer is preferably from 1 to 3 $\mu$m, or 13 mg/dm$^2$ to 30 mg/dm$^2$ in a weight film thickness, more preferably from 1 to 2 $\mu$m, or from 16 to 28 mg/dm$^2$.

With respect to the positive photosensitive lithographic printing plate, it is necessary that the non-exposed portion keeps a high alkali resistance, and the exposed portion can be converted into such a state that the entire exposed portion of the photosensitive material will be rapidly dissolved in an alkali developer.

To achieve this, in the present invention, the inclined photosensitive material is employed.

When the dissolution rate is inclined, the following effect can be obtained. Namely, in the case of exposure by a laser light, the light declines from the surface part toward the lower part of said photosensitive material, due to absorption by a photo amplification dye. In such a case, the degree of alkali-solubility imparted to the alkali-soluble photosensitive material by the laser light, is directly proportional to the amount of absorbed energy of the laser light, and is inversely proportional to the degree of the alkali resistance of the original photosensitive layer. Accordingly, with respect to a photosensitive layer having an uniform alkali resistance, before the exposure, in the thickness direction, the dissolution rate decreases toward the lower part of said photosensitive material after the exposure.

However, if the dissolution rate is inclined, the surface part at which the degree of the conversion of the laser light to heat is high, has a high alkali resistance, and the lower part at which the laser light declines, originally has a high solubility. Accordingly, the entire layer part of the portions irradiated with the laser light will be soluble.

As used herein the term “layer” is considered a generic term which includes both “monolayer” and “multiple layer” products. For convenience, the generic term “layer” has been used interchangeably with the generic term “material” to describe the photosensitive coating applied to the support. However, the photosensitive layer or material can be applied to the support either as a monolayer or as a plurality of layers. When the term “layer” is used in the context of one singular layer of a multiple layer embodiment, its singularity is evident by the context in which the term is used.

Multiple Layer Coatings

One method of forming an inclined photosensitive material, is to coat onto the substrate a plurality of photosensitive layers having slightly different solubilities in an alkali developer. For example, when photosensitive compositions of five layers having different solubilities in an alkali developer (hereinafter referred to as A, B, C, D and E) are prepared, and the solubilities in an alkali developer of the layers A, B, C, D and E, are a, b, c, d and e, respectively, and when $a<b<c<d<e$, by coating E as the lowermost layer in: the photosensitive layer, and then coating D, C and B and A as the uppermost layer, the desired inclined photosensitive layer can be obtained. The photosensitive layers to be used for such a multiple coating, are not particularly limited so long as they constitute the plurality of layers, and to obtain the above-mentioned effect, at least four layers are preferred, and at least five layers are more preferred.

The photosensitive layers having different solubilities in an alkali developer, may be coated at the same time, or may be successively coated. However, if the respective layers are thin, it will be more difficult to control the interfaces, and accordingly, simultaneous coating is preferred in the case of at least three layers. As a method to make the solubilities of the photosensitive layers in an alkali developer different, for example, the content of the solubility-suppressing agent is changed, the type of the solubility-suppressing agent is changed, the content of the photo-thermal conversion material is changed, or the type of the photo-thermal conversion material is changed.

Further, in the case of preparing an inclined photosensitive material composed of a plurality of layers, the solubility-suppressing agent may be contained in the uppermost layer alone, it is preferably contained in all layers except the lowermost layer, and it is more preferably contained in all layers.

In the case of producing an inclined printing plate by multiple coating, as it is hard to control the interfaces, the inclined photosensitive material is preferably a monolayer. As one method to form an inclined photosensitive material of monolayer, the concentration of the solubility-suppressing agent in the photosensitive material is made to decrease from the surface of the photosensitive material toward the deeper part of the photosensitive material.

However, the solubility-suppressing agent is usually mixed with other photosensitive composition components in a solvent, and coated, whereby the concentration of the solubility-suppressing agent is almost the same at any part of the photosensitive material, and accordingly, it is impossible to prepare an inclined photosensitive material. Accordingly, in the case where the solubility-suppressing agent is blended in different concentration, a special operation such as blending in a coating machine immediately before the coating, will be necessary.

Further, it is possible to coat a plurality of photosensitive layers having different solubilities in an alkali developer, and to substantially destroy the interfaces between the layers by treatment after coating, in order to obtain a monolayer formally. However, also with this method, a special operation such as keeping miscibility within the photosensitive layers appropriately, will be necessary.

With respect to the photosensitive lithographic printing plate of the present invention, with the purpose of improving the printing resistance, improving the development property and the like, a photo-insensitive layer may be provided on the uppermost side, the lowermost side or both sides of the photosensitive layer of monolayer or plural layers.

Drying the Coating

Now, processes of drying the photosensitive material and subsequent processes will be explained in detail with reference to a preferred mode of carrying out the production process of a positive photosensitive lithographic printing plate having an inclined photosensitive material of monolayer.

Usually a lithographic printing plate having a photosensitive liquid coated thereon, is firstly subjected to a drying process. The drying process and a process of keeping under heating (hereinafter sometimes referred to as aging process), which will be explained hereinafter, may be carried out continuously or separately. Accordingly, in the case where they are continuously carried out, the demarcation between the drying process and the aging process may be vague in some cases, and in the case where they are continuously carried out, the process of diffusing a compound having a polar group from the surface of the photosensitive material, will be referred to as the aging process, and distinguished from the process prior to the diffusion, which will be referred to as the drying process.

The temperature in the drying process affects the glass transition temperature (Tg) of the complete photosensitive layer. To prepare the inclined photosensitive layer of the present invention, Tg after drying is preferably at least 50° C., more preferably at least 70° C., and particularly preferably at least 80° C. Further, it is preferably at most 120° C., more preferably at most 110° C., and particularly preferably at most 100° C. Further, to obtain a photosensitive layer having such a Tg, the drying temperature is preferably at least 20° C., more preferably at least 25° C., and usually at most 100° C., preferably at most 80° C., more preferably at most 60° C.

The more preferred method is a method of adjusting the temperature in the drying process in two steps. FIG. 4 illustrates one mode of carrying out the drying process to be used in the present invention. In the part 11 in FIG. 4 (first drying step), the temperature range and the drying time are set so that drying is carried out for at least 25 seconds to the completion point of constant rate drying of the photosensitive layer after coating. Here, the completion point of constant rate drying is the time from the initiation of the drying until the evaporation process of the coated film reaches the internal diffusion-determined step. Practically, as shown in FIG. 5, a graph showing the film thickness at the time of drying is drawn, and the completion point of constant rate drying can be obtained as the time until the graph reaches the point of inflection. The amount of the remaining solvent at the completion of the first drying step is preferably within 10 wt %, more preferably within 8 wt %, to the photosensitive material. The drying temperature in the first drying step is, in the case where the film thickness of the photosensitive material is at a level of from 15 $mg/dm^2$ to 30 $mg/dm^2$, preferably at least 25° C., and preferably at most 60° C., and more preferably at most 45° C. Further, the first drying step is carried out at highest a temperature higher preferably by 20° C., more preferably by 10° C., than the glass transition temperature of the alkali-soluble resin to be used.

Then, in the drying step shown in the part 12 in FIG. 4 (second drying step), the remaining solvent is preferably at most 8 wt %, more preferably at most 6 wt %, to obtain resistance of the photosensitive material. The drying temperature in the second drying step is preferably at least 40° C., more preferably at least 45° C., preferably at most 80° C., more preferably at most 75° C.

In the case where the drying temperatures in the first drying step and the second drying step are different, the temperature in the first drying step is preferably lower than the temperature in the second drying step.

The Aging Process

Now, the aging process will be explained.

In the aging process, into the photosensitive layer of the positive photosensitive lithographic printing plate having the photosensitive composition coated thereon and dried, a compound having a polar group is diffused from the surface of the photosensitive material, to produce a photosensitive material of monolayer having an inclined dissolution rate. To carry out diffusion, it is preferred that at least a certain amount of the compound to be diffused is vaporized under the aging temperature condition, and accordingly, the compound has a boiling point of preferably at most 200° C., more preferably at most 150° C., and further, the compound has a boiling point of at least 50° C., more preferably at least 70° C. The molecular weight is preferably at most 150, more preferably at most 100. As the polar group in the molecule, a hydroxyl group, a carboxyl group, a ketone group, an aldehyde group or an ester group is preferred, and a hydroxyl group is most preferred. Further, as the specific compound, $H_2O$ is most preferred.

As a method to carry out the diffusion of $H_2O$ (hereinafter simply referred to as water diffusion), a method of contact with an atmosphere containing humidity is preferred, and as the method of contact with an atmosphere containing humidity, a treatment is carried out under an atmosphere having an absolute humidity of usually at least 0.007 kg/kg', preferably at least 0.018 kg/kg', and further, preferably at most 0.5 kg/kg', more preferably at most 0.2 kg/kg', for preferably at least 10 hours, more preferably from 16 to 32 hours.

The treatment temperature is controlled with a purpose of controlling the humidity accurately, and it is preferably at least 30° C., more preferably at least 40° C., and further, preferably at most 100° C., more preferably at most 80° C., and particularly preferably at most 75° C.

Production of a Photosensitive Monolayer

Now, to effectively produce a photosensitive material of monolayer having an inclined dissolution rate, preferred modes will be specifically explained.

The first preferred mode is such that a photosensitive composition is coated on a support, dried and aged. During the aging process, the support having the photosensitive composition coated thereon is overlaid with a protective material having a water content of from 1 to 10 wt %, and the laminate is kept under heating, whereby moisture to be diffused in the photosensitive material can effectively be supplied from the protective material.

The form of the lithographic printing plate at the time of the aging treatment is not particularly limited. For example, a strip lithographic printing plate may continuously be supplied to an aging treatment apparatus to carry out the aging treatment. Further, the lithographic printing plate may be once wound into a coil, or cut in a suitable size, and the plurality of the cut lithographic printing plates may be piled, to carry out the aging treatment.

Among these, it is preferred to carry out the aging treatment in the form of a pile of the lithographic printing plates in a predetermined size, whereby the aging apparatus can be made compact, and it will be easy to handle the lithographic printing plate.

The overlaying of the positive photosensitive lithographic printing plate with the protective material is not particularly limited so long as the photosensitive material of the printing plate is in contact with the protective material. As shown in FIG. 6, the printing plates 1 and the protective materials 2 are piled on a pallet 3 for lamination.

Further, as shown in FIG. 7, the positive photosensitive lithographic printing plate 1 and the protective material 2 are overlaid with each other, and wound on a coil core material 4 into a coil, for lamination.

In the case where the aging treatment is carried out in a form of a coil or a pile, in order to achieve the condition of an absolute humidity of from 0.007 kg/kg' to 0.2 kg/kg' even in the inner part of the printing plate, it is preferred to let the protective material sandwiched between the lithographic printing plates contain an appropriate amount of moisture. The water content of the protective material varies depending upon the material of the protective material, and in the case where a paper sheet is used as the protective material, it is preferably at least 1 wt %, more preferably at least 3 wt %, and further, it is preferably at most 10 wt %, more preferably at most 7 wt %, and particularly preferably at most 5 wt %.

In the present specification, the water content of the protective material is represented based on the state of the protective material dried at 105° C. for 2 hours, as the water content of 0%

When the protective material is used in the present invention, any one which can contain moisture may be available. However, one in a form of a sheet is usually employed, and one excellent in moisture absorption and moisture desorption is preferred. A cellulose such as a pulp, a semi-synthetic fiber such as cellulose acetate, a natural fiber such as cotton or silk, a synthetic rubber or resin such as polyester, nylon, polyvinyl alcohol, hydrochlorinated rubber, polyimide or polyurethane, may be employed, in a form of fibers or an open-cell material, as a paper sheet such as Japanese paper, western paper, synthetic paper or mixed paper, or as a woven fabric, a non-woven fabric or a foaming sheet. Further, a laminate thereof with another material in a form of a sheet may also be employed.

The number of piled sheets and the number of winding times in the coil are not particularly limited so long as the protective material is sandwiched between at least 2 sheets, and may be readily selected based on the conditions for production and the production plan. However, in view of temperature raising of the photosensitive lithographic printing plate, the number of piled sheets is preferably within a range of from 100 to 2,000 sheets, and the coil winding is preferably within a range of from 100 to 2,000 m.

As a method for heating, a hot wind by e.g. a drier, a heating in an atmosphere having the temperature controlled, a far infrared ray heating device or a microwave heating device may, for example, be employed.

The second preferred mode is such that a photosensitive composition is coated on a support, and in the aging process, the support having a photosensitive composition coated thereon is overlaid with a protective material containing moisture to obtain a lithographic printing plate of a predetermined size, which is then piled or wound into a coil, and at least the entire side surfaces of the lithographic printing plate in a form a pile or a coil, are covered with a material having substantially no moisture permeability (hereinafter referred to as moisture-impermeable material), which is then kept under heating. By covering with a moisture-impermeable material, vaporization of moisture required for diffusion into the photosensitive material can be prevented, whereby the desired absolute humidity is likely to be obtained.

The moisture-impermeable material to cover the pile or the coil is not particularly limited so long as it has a low moisture permeability and it may be placed close to or clings to the pile or the coil. However, in view of easiness in handling, a moisture-impermeable material of a sheet shape (hereinafter referred to as moistureproof sheet) is preferred. Further, the moisture permeability is preferably at most 7 $g/m^2/24$ hr/mm25° C., more preferably at most 2 $g/m^2/24$ hr/mm/25° C. As the material, usually polyethylene trifluoride, polytetrafluoroethylene, polyethylene, polypropylene, polyvinyl chloride, polyvinylidene chloride, polystyrene, ionomer, an aluminum foil, PET or a moistureproof sheet vapor-deposited on a paper sheet, may, for example, be mentioned. In the case where said photosensitive lithographic printing plate is covered with such a sheet, the sheet is adhered to the photosensitive lithographic printing plate so that the air is present among these in an amount as small as possible, and the temperature raising of the plate readily takes place.

Further, the sheet is selected so that the sheet is not so thick. The thickness is preferably within a range of from 10 μm to 1,000 μm, more preferably within a range of from 20 μm to 500 μm.

The moistureproof sheet is used to prevent the discharge of moisture in the protective material wound into a coil or piled with the lithographic printing plate, to the exterior. Since the lithographic printing plate itself has a role as a moisture-impermeable material, covering of at least the entire side surfaces of the above-mentioned pile or coil (the part which is not covered with the outermost lithographic printing plate) is enough. However, for convenience, the entire pile or coil may be covered.

As a specific example of a use of the moistureproof sheet, as shown in FIG. 8, the printing plates 1 and the protective materials 2 are piled on a pallet 3 for lamination, and then, the side surfaces or the entire pile is covered with e.g. a moistureproof sheet 4. Further, it is preferred to apply e.g. a tape to the moistureproof sheet 4, to seal the piled plates, after the covering.

Further, as shown in FIG. 9, a positive photosensitive lithographic printing plate and a protective material is overlaid with each other, and wound on a coil core material into a coil, and the side surfaces or the entire coil is covered with e.g. a moistureproof sheet 4 for sealing.

The third preferred mode is such that a photosensitive composition is coated on a support, and in the aging process, the support having a photosensitive composition coated thereon is overlaid with a protective material containing moisture to obtain a lithographic printing plate of a predetermined size, which is then piled or wound into a coil, and the side surfaces of the lithographic printing plate piled or wound into a coil, are covered with a heat generator, followed by keeping the pile or the coil under heating, whereby a special chamber for aging will not be necessary, the aging can readily be carried out, and the aging time can be shortened.

As the heat generator, the shape and the heat generation mechanism are not particularly limited. With respect to the heat generation mechanism, as the heater part, one obtained by meander wiring of a nichrome wire or a nichrome foil, one obtained by printed wiring of a metal foil, or one having a conductive coating coated on/impregnated with fabric of glass fiber or cotton fabric having braided copper wire incorporated therewith, may, for example, be mentioned, and one having the entire heater part covered with a synthetic resin film sheet with fire retardancy and heat resistance, for electrical insulation, may preferably be used. As the synthetic resin material, vinyl chloride and Teflon are preferred.

Further, the heat generator to cover the piled photosensitive lithographic printing plates itself may not have the heat generation mechanism. For example, the covering material is a substance which absorbs infrared rays, such as blackbody, and the covering material is made to generate heat by irradiating with ultraviolet rays from the outside of the covering material. However, in such a case, to avoid the photosensitive material being exposed by the infrared rays, one which does not transmit infrared rays is used as the covering material.

Further, as the shape, in view of application to printing plates of various sizes, a heat generator of a sheet shape, which can be folded, is preferred.

The heat generator is arranged at the side surfaces of the pile or the winding of the photosensitive lithographic printing plate, and preferably the heat generator is in contact with the side surfaces of the photosensitive lithographic printing plate, in view of heating efficiency.

As the method of contact, a method of winding a strip heat generator on the side surfaces, or a method of bonding heat generators of a sheet shape having the same area as each of side surfaces to the respective side surfaces, may, for example, be mentioned.

As a specific example for a use of a heat generator of a sheet shape, as shown in FIG. 10, the printing plates 1 and the protective materials 2 are piled on a pallet 3 for lamination, and then, the side surfaces or the entire pile are covered with a heat generator 9 of a sheet shape.

By employing moistureproof material as the heat generator, the heat generator can act also as the above-mentioned moisture-impermeable material.

For adhesion of the heat generator to the side surfaces of the piled plates without air layer present therebetween, a method of clamping the outside of the wound or bonded heat generator of a sheet shape by a plurality of resin, rubber, fiber or leather belts, or a method of winding the heat contractive resin film on the side surfaces, and heating the film by e.g. a drier for contraction, may, for example, be mentioned.

In the case where the piled plates are subjected to the heat treatment by employing the heat generator of a sheet shape in a space heated to an optional temperature, it is preferred to control the temperature by measuring the temperature of the piled plates, and after the temperature of the piled plates reaches the desired temperature, by adjusting the voltage of the heat generator to keep the temperature.

In the case where the heat treatment is carried out by employing the heat generator of a sheet shape in a space at ordinary temperature, it is preferred to arrange the heat generator of a sheet shape at the side surfaces of the piled plates or the coil, and further to cover the periphery thereof with a heat-insulating material so that heat generated from the heat generator is not discharged to the outside.

In such a case, it is preferred to cover the top surface of the piled plates or the periphery surfaces of the coil, with a heat-insulating material.

In order to increase the amount of output heat from the heat generator, a plurality of the heat generating sheets may be piled one on another.

The heat generator is preferably equipped with e.g. an automatic temperature controlling circuit, a temperature fusing circuit, a detecting circuit for short circuit of thermosensible wire, a detecting circuit for breakage of thermosensible wire or a detecting circuit for the surface of excessive temperature raising, as a safeguard.

As mentioned above, by piling or winding the positive photosensitive lithographic printing plate, and by covering the side surfaces with a heat generator of a sheet shape followed by heating, the heating efficiency can be improved, whereby the time for heat treatment can be shortened.

The fourth preferred mode is such that a photosensitive composition is coated on a support, and in the aging process, the aging treatment is carried out while colliding a fluid at a temperature of from 30 to 100° C. against the lithographic printing plate. In the aging process, the lithographic printing plate is kept under heating, and the temperature of the fluid around the lithographic printing plate may sometimes decrease due to the lithographic printing plate. Accordingly, by colliding the fluid and by always circulating the fluid around the lithographic printing plate, heat transfer to the lithographic printing plate can be accelerated, whereby the time until the desired temperature for carrying out the aging treatment is achieved, can be shortened. As the fluid, the air is usually employed, and any one may be employed so long as it is a gas inert to the photosensitive layer, such as nitrogen or argon.

The collision rate of thermal fluid is preferably at least 0.2 m/s, more preferably at least 0.5 m/s, and particularly preferably at least 2 m/s. Further, it is preferably at most 100 m/s, more preferably at most 50 m/s, and particularly preferably at most 20 m/s.

In the case where the lithographic printing plate is overlaid with a protective material containing moisture and piled or wound into a coil, to carry out the aging treatment, as the moisture required for aging can be supplied from the protective material, the fluid is not required to contain moisture. On the other hand, in the case where the aging treatment is carried out without overlaying with a protective material containing moisture, by adjusting the absolute humidity of the fluid to be at least 0.007 kg/kg', moisture necessary for aging can be supplied.

In the aging process, as a preferred method of colliding a fluid against the lithographic printing plate, a predetermined size of the lithographic printing plate having a protective material containing moisture overlaid therewith, is piled or wound into a coil, and the lithographic printing plate piled or wound into a coil is put in a predetermined size of a chamber, and the lithographic printing plate is kept under heating while circulating the air in the chamber. In such a case, it is preferred to pile lithographic printing plates of a predetermined size. FIG. 11 illustrates one mode of carrying out the aging process. On a pallet 4, lithographic printing plates of a predetermined size 1 are overlaid with protective materials and piled, and the pile is put in a predetermined size of a chamber 7, and the chamber is equipped with an air-circulating apparatus 8 to circulate the air in the chamber.

As the method for circulating the air, e.g. a fan may be used. The area of the aperture of the fan is preferably equal to or larger than the area of the side surfaces of the pile, and it is preferred that the fluid of a certain temperature colloids against the pile almost perpendicularly. The fan may be arranged to one side surface, two side surfaces, three side surfaces or the entire side surfaces of the pile, or to one side surface or both side surfaces of the coil, for the collision of the fluid.

In the case where heat treatment of the pile is carried out by using a fan in a space heated to an optional temperature, it is preferred to supply a heated fluid for the suction aperture of the fan by means of e.g. a duct, and it is preferred to measure the temperature of the piled plates, and after the temperature of the piled plates reaches the desired temperature, to stop the fan or to control the air flow or the air flow rate, with the purpose of keeping the temperature.

The fifth preferred mode is such that a photosensitive composition is coated on a support, and in the aging process, the support having a photosensitive composition coated thereon is overlaid with a protective material containing moisture to obtain a lithographic printing plate of a predetermined size, a plurality of such lithographic printing plates are piled, and a heat-insulating material is applied to almost the entire top and bottom surfaces of said piled lithographic printing plates, and the pile is kept under heating. By applying the heat-insulating material thereto, heat transfer from the top and bottom surfaces can be prevented, and heat transfer can be carried out from the side surfaces only, and accordingly, the heat transfer conditions are the same for the upper part, the middle and the lower part of the piled lithographic printing plates, and non-uniformity of the photosensitive material can be prevented.

As shown in FIG. 12, when a photosensitive printing plate 1 is cut in a predetermined size and alternately piled with a slip sheet 2, a heat-insulating material 5 is applied to the top and bottom surfaces, and almost entire top and bottom surfaces are covered with the heat-insulating material 5.

The heat-insulating material 5 is not particularly limited, and one which is less likely to generate dust is preferred, and a synthetic resin form, a woven fabric, a non-woven fabric, a chipboard or a glass wool may, for example, be employed.

The heat-insulating material 5 is preferably one having an overall heat transfer coefficient of at most 2 $w/m^2 \cdot hr \cdot K$, preferably at most 1 $w/m^2 \cdot hr \cdot K$.

In the aging of the pile as shown in FIG. 12, by heating the pile, moisture is discharged from the protective material, and the degree of discharge varies depending upon the temperature of the piled lithographic printing plate and the water content of the protective material. When the temperature of the lithographic printing plate is kept high, the protective material discharges a large amount of moisture contained therein, and the concentration of moisture at the surface of the photosensitive layer will be high, whereby the water diffusion from the surface of the photosensitive layer can be carried out faster.

As mentioned above, it is considered that the concentration of the moisture at the coated surface can be controlled by the temperature of the lithographic printing plate, and accordingly, when the heat-insulating material is used, the entire piled lithographic printing plate can uniformly be heated, whereby non-uniformity in aging of the photosensitive material can be prevented.

As shown in FIG. 13, when the photosensitive printing plate 1 is an elongated strip form, it may be wound on a core material 5 made of a heat-insulating material, and a heat-insulating material 5 is wound on the wound photosensitive printing plate 1 to cover the outer periphery of the roll.

Accordingly, in the present invention, in the case of winding into a roll, the outer periphery is taken for the upper side and the core material side the lower side.

Here, the photosensitive printing plate 1 is preferably preliminarily heated in e.g. a heating furnace, before it is piled or wound into a roll. The temperature of pre-heating is preferably within ±10° C., more preferably within ±5° C., particularly preferably within ±3° C., to the temperature for heat treatment.

The photosensitive printing plate 1 sandwiched in the heat-insulating material 5 at the top and bottom, is accommodated in a heat treatment chamber or covered with a heat generator of a sheet shape, to carry out the heat treatment.

Preferred conditions for producing the positive photosensitive lithographic printing plate of the present invention vary depending upon the drying apparatus, the aging apparatus, the size of the printing plate, the type of the alkali-soluble resin in the photosensitive material, film thickness or the like, and the above-mentioned preferred mode will also change.

The solvent remaining in the photosensitive material after carrying out the aging treatment, is preferably at most 8 wt %, more preferably at most 6 wt %, particularly preferably at most 5 wt %. Further, it is preferably at least 0.05%, more preferably at least 0.2%.

Gradient of Solubility Characteristics

Figure 1:
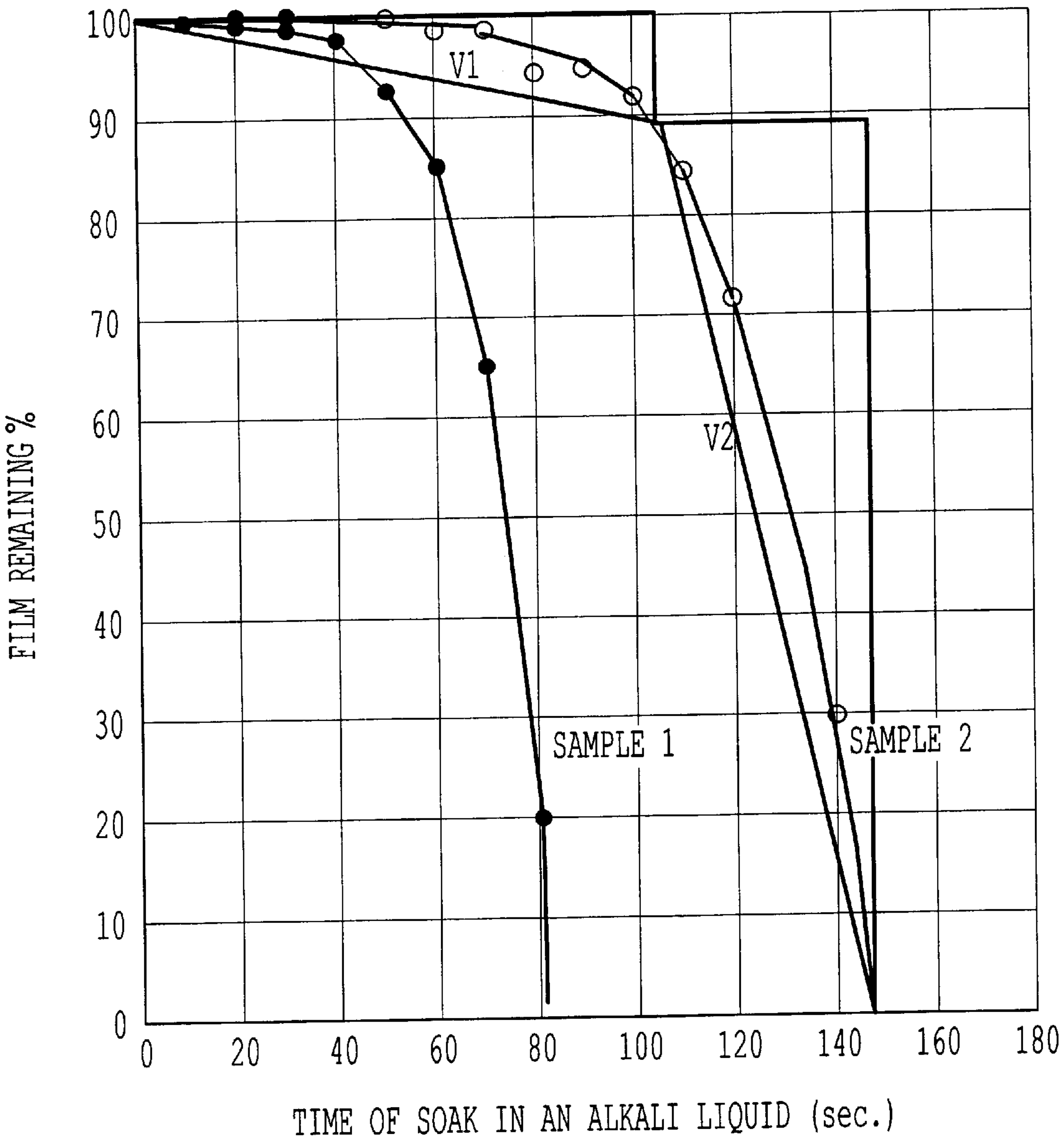
FIG. 1 is a graph (1) illustrating the dissolution rate of the photosensitive layer of the positive photosensitive lithographic printing plate of the present invention.

With respect to the positive photosensitive lithographic printing plate thus obtained, as shown in FIG. 1, the solubility of the photosensitive layer in an alkali developer continuously increases from the surface part toward the lower layer part.

Namely, as shown in FIG. 1, the gradient of the line $V_1$ illustrating the average dissolution rate of the photosensitive material at or just below the surface, i.e., the part of the film thickness 100% to the part of the film thickness 90%, and the gradient of the line $V_2$, illustrating the average dissolution rate from the part of the film thickness 90% to the complete dissolution, are different. Accordingly, a photosensitive material having a higher dissolution rate at the part lower than the part of the film thickness 90%, than at the surface part, is obtained.

The reason is not necessarily clear, and the present invention is not restricted to the consideration shown below. However, it is estimated that the solubility of the photosensitive composition of the present invention in an alkali developer changes depending upon the state of physical or physiochemical bonding of adjacent resin molecules or adjacent molecules through another co-existing compound. As mentioned above, when the photosensitive composition is exposed to an atmosphere containing humidity, water molecules diffuse into the photosensitive layer to form e.g. hydrogen bonds, or the alignment of the molecules changes, whereby the solubility in an alkali developer decreases.

It is considered that the photosensitive layer obtained by diffusion of a material into the photosensitive material, e.g. water molecules, has such a distribution that the proportion of the interaction between the alkali-soluble resin and e.g. water molecules, such as hydrogen bond, continuously decreases from the surface layer toward the inner part, and has a structure in which the alkali resistance inclines, i.e. the dissolution rate of said photosensitive layer in an alkali developer continuously increases from the surface part to the lower layer part.

The photosensitive layers of this invention differ from the positive photosensitive lithographic printing layers of the prior art which contain a conventional quinonediazide compound as a component of the photosensitive composition. Development of the prior art plates requires and takes advantage of a chemical change of the quinonediazide compound which takes place due to irradiation with light, i.e. when irradiated the diazoketone moiety undergoes photodegradation to produce a carboxylic acid, whereby the solubility of the photosensitive layer in an alkali developer increases. In such a case, the development latitude of the photosensitive composition is originally large, and accordingly, it is not necessary to control the reaction with moisture in the production process of the printing plate.

On the contrary, as in the present invention, in the case where the solubility in an alkali developer is changed by a change other than a chemical change (estimated to be a physical change such as a change in conformation), it has been found that a compound having a polar group, such as a water molecule, is significantly involved with and affects the solubility of the photosensitive composition in an alkali developer before the irradiation with laser light.

With respect to the photosensitive lithographic printing plate (unexposed one) of the present invention, as mentioned above, the photosensitive material has an inclined structure. As can be seen from FIG. 3, the dissolution rate of the photosensitive material is from 0.01 to 20% at the half point (t/2) of the time (t) until the film remaining ration reaches 20%. The solubility of the photosensitive material in an alkali developer is preferably such that at least ¼, preferably at least ½, from the surface of the layer, has an inclined structure.

The ratio of the average dissolution rate $V_2$ in an alkali developer at the inner part from the part of the film thickness 90% to the part of the film thickness 0%, to the average dissolution rate $V_1$ in an alkali developer at the surface part from the part of the film thickness 100% to the part of the film thickness 90%, i.e. $V_2/V_1$ (this is defined as gradient, and will sometimes be referred to as gradient), is at least 2, more preferably at least 5, particularly preferably at least 13.

The gradient ($V_2/V_1$) can also be obtained by calculation from the following formula.

$$\text{radient of solubility} = \frac{(A)\times 9}{(B)-(A)}$$

wherein (A) is a time (sec.) required for dissolution of the photosensitive material from the surface to the thickness 10%, and (B) is a time (sec.) required for dissolution through the entire thickness (100%) of the layer of photosensitive material.

By drawing a dissolution curve (FIG. 1) of an inclined photosensitive material treated with an alkali developer, it becomes more evident that the deeper the photosensitive material, the higher the alkali solubility. Further, the above-mentioned gradient can be obtained from the graph as shown in FIG. 1.

Further, depending upon the structure of the lithographic printing plate, when the photosensitive layer is dissolved, a small amount of the photosensitive material remains at the interface between the photosensitive material and the support, caused by pores or the surface conditions of the support, and in such a case, a dissolution curve as shown in Table 2 can be obtained. However, in some cases, there is no deposition of ink or the like in practical printing, and such will not be a problem. In a case where such a dissolution curve is obtained, the gradient is obtained from the difference between said dissolution rate from the part of the film thickness 100% to the part of the film thickness 90%, and the dissolution rate from 90% to 20% (this is defined as the gradient $S_2$, and it will sometimes be referred to as gradient $S_2$). In FIG. 2, the gradient $S_2=V_3/V_1$.

Also in such a case, the gradient $S_2$ is preferably at least 2, more preferably at least 5, and particularly preferably at least 13.

Further, the photosensitive material being inclined can also be explained by the following method.

In the dissolution curve of FIG. 3, which is the same dissolution curve as FIG. 1, when the dissolution time until the film remaining ratio reaches 20% is (t), and when the dissolution rate of the film at the half point (t/2) is (R%), it is defined that the gradient S3=R (although R is from 0 to 80, when the photosensitive material is not inclined, theoretically R is 40, and accordingly, R is 0 or above and less than 40, practically. Further, when the film remaining ratio at this time is taken for S, R=100−S).

According to this definition, the gradient $S_3$ is preferably at most 20, more preferably at most 10, particularly preferably at most 5. Further, it is preferably at least 0.01, more preferably at least 0.1, particularly preferably at least 1.

The gradient $S_3$ can be obtained from a dissolution curve as shown in FIG. 3.

The dissolution rate of the photosensitive material in an alkali developer can be measured by the following method.

Namely, a light having a wavelength to be absorbed by the photosensitive material is irradiated, on the support before coating, and by using a reflection spectrophotometry, the absorbance (a) of the reflected light from the support before coating, is measured. Then, the absorbance (b) of the reflected light from the positive photosensitive lithographic printing plate obtained by coating the photosensitive composition on the support to form a photosensitive material, is measured. Then, the lithographic printing plate is dipped in an alkali developer with calmly rocking for a predetermined time, and taken out therefrom followed by drying, and then the absorbance (c) of the reflected light is measured again.

The film remaining ratio can be calculated by the following formula from the obtained absorbances.

$$\text{Film remaining ratio} = \frac{c-a}{b-a}$$

The alkali developer to be used to obtain the above-mentioned gradient and film remaining ratio, is usually used for the positive photosensitive lithographic printing plate practically, to the utmost.

With respect to the positive photosensitive lithographic printing plate of the present invention, as mentioned above, the dissolution rate of the lower layer part of the photosensitive material in an alkali developer is high. Accordingly, the entire layer of the exposed portion will be soluble at the time of development after the exposure, and thus a clear image will be obtained. Further, as the surface part before exposure has a high alkali resistance, the surface of the film having a non-exposed portion remaining thereon has a high resistance to chemicals. Further, with respect to the printing resistance, a positive photosensitive lithographic printing plate having a high resistance to a wetting water to be used for printing, and having a high wear resistance, can be obtained.

Laser Light Irradiation

As the light source for image exposure of the photosensitive lithographic printing plate of the present invention, a light source generating a light ray such as a near infrared laser of from 600 to 1,300 nm, preferably from 650 to 1,100 nm, is preferred. It may, for example, be a ruby laser, a YAG laser, a semiconductor laser or LED. Particularly preferred is a semiconductor laser or a YAG laser, which is small in size and has a long useful life. With such a laser light source, scanning exposure is usually carried out, and then development is carried out with a developer to obtain a lithographic printing plate having an image.

Among these, a laser generating a light ray having a wavelength in the vicinity of 830 nm, and a laser generating a light ray having a wavelength in the vicinity of 1,064 nm, are preferably employed.

The surface of the photosensitive layer is usually scanned with a light ray (beam) having a high intensity condensed by the lens, from the laser light source, and the photosensitive characteristic ($mJ/cm^2$) of the photosensitive layer sensitive thereto, to be used in the present invention, may sometimes depend on the light intensity ($mJ/s\cdot cm^2$) of the received laser beam. The light intensity of the laser beam can be obtained by dividing the amount of energy of the laser beam per unit time (mJ/s) measured by a light power meter, by the irradiation area ($cm^2$) of the photosensitive layer with the laser beam. The irradiation area with the laser beam is usually defined as the area of the portion exceeding $1/e^2$ intensity of the laser peak intensity, or simply, it can be measured by exposing a photosensitive composition showing reciprocity law.

In the method for forming a positive image of the present invention, the light intensity of the light source is preferably at least $2.0\times10^6$ $mJ/s\cdot cm^2$, more preferably at least $1.0\times10^7$ $mJ/s\cdot cm^2$. When the light intensity is within the above-mentioned range, the photosensitive characteristic of the positive photosensitive lithographic printing plate in the present invention can be improved, and the time for scanning exposure can be shortened, and such is significantly advantageous practically.

Developer

In the method for forming a positive image of the present invention, as the developer to be used to develop the above-mentioned positive photosensitive lithographic printing plate subjected to image exposure, an aqueous solution of at a level of from 0.1 to 5 wt % of an inorganic alkali salt such as sodium silicate, potassium silicate, lithium silicate, ammonium silicate, sodium metasilicate, potassium metasilicate, sodium hydroxide, potassium hydroxide, lithium hydroxide, sodium carbonate, sodium bicarbonate, potassium carbonate, sodium secondary phosphate, sodium tertiary phosphate, ammonium secondary phosphate, ammonium tertiary phosphate, sodium borate, potassium borate or ammonium borate, or an organic amine compound such as monomethylamine, dimethylamine, trimethylamine, monoethylamine, diethylamine, triethylamine, monoisopropylamine, diisopropylamine, monobutylamine, monoethanolamine, diethanolamine, triethanolamine, monoisopropanolamine or diisopropanolamine, may be used as the alkali developer.

Among these, one containing an alkali metal hydroxide and an alkali metal silicate is preferred, as the solubility of an alkali salt in water is excellent, and it is easy to prepare the developer. Further, more preferably the content of the alkali metal silicate is from 0.1 to 5 wt % as silicon dioxide, and the ratio of the molar concentration of silicon dioxide ( ) to the molar concentration of the alkali metal, i.e., is from 0.1 to 1.5, and particularly preferably the content as silicon dioxide is from 0.2 to 3 wt %, and the ratio of the molar concentration of silicon dioxide to the molar concentration of the alkali metal is from 0.2 to 1.0.

Further, pH of the developer is preferably at least 12, more preferably from 12.5 to 14.0.

The preferred alkali developer to be used for the method for forming a positive image in the present invention, is one containing an amphoteric surface active agent.

As the amphoteric surface active agent, a betaine compound such as N-lauryl-N,N-dimethyl-N-ammonium, N-stearyl-N,N-dimethyl-N-carboxyammonium, N-lauryl-N,N-dihydroxyethyl-N-carboxyammonium, N-lauryl-N,N-dihydroxyethyl-N-carboxymethylammonium, N-lauryl-N,N,N-tris(carboxymethyl)ammonium or an imidazoline compound such as sodium N-coconut oil fatty acid acyl-N-carboxymethyl-N-hydroxyethyl ethylenediamine may, for example, be mentioned.

Among the above-mentioned surface active agents, a betaine compound is particularly preferred.

By using a developer containing an amphoteric surface active agent, the remaining ratio of the coating film amount will improve, and the scratch resistance will improve.

Further, as the developer contains an amphoteric surface active agent, improvement in sensitivity and development rate, improvement in development treatment performances of the developer (development treatment area of the photosensitive layer), and suppression of deterioration with age of the developer, tend to be confirmed.

Further, the alkali developer to be used in the present invention preferably contains a silicone. When it contains a silicone, film retention of unexposed portion can further be suppressed, and as a result, the range of the development conditions can be made wider.

As the silicone, a silicone oil having a siloxane bond as a skeleton, specifically, having a dimethylpolysiloxane chain or a chain having part of methyl groups thereof substituted with hydrogen or phenyl groups, or a silicone oil of a silicone resin used as a solution type, an emulsion type or a compound type, is preferred, and one which is used as a defoaming agent is more preferred, and further, one having a hydrophilic group of self-emulsifiable type, such as a copolymer of dimethylpolysiloxane and polyalkylene oxide, is particularly preferred.

The developer to be used in the present invention may contain an additive such as a water-soluble organic solvent such as a polyhydric alcohol, an aromatic alcohol or an alicyclic alcohol, a water softener such as a polyphosphate, an aminopolycarboxylate or an organic sulfonate, a reducing agent such as a phenolic compound, an amine compound, a sulfite, a phosphite or a thiophosphate, a chelating agent such as an organic phosphonic acid or a phosphonoalkane tricarboxylic acid or a salt of each of them, a pH adjuster such as an alkali-soluble mercapto compound or thioether compound, an inorganic acid or an organic acid or a salt of each of them, or a defoaming agent such as an organic silane compound, as the case requires.

The development is carried out by e.g. dipping development, spray development, brush development or ultrasonic development, usually at a temperature of preferably from about 10 to about 50° C., particularly preferably from about 15 to about 45° C.

The positive photosensitive lithographic printing plate of the present invention does not require pre-heating, and accordingly, it can be directly subjected to the alkali development process after exposure. After development, it is preferred to carry out a burning treatment in order to reinforce the remaining photosensitive layer.

EXAMPLES

Now, the present invention will be explained in further detail with reference to Examples. However, it should be understood that the present invention is by no means restricted to such specific Examples.

Example A1 to A6 and Comparative Examples A1 and A2

Preparation of a Lithographic Printing Plate

Preparation of an Aluminum Plate

An aluminum plate (material: 1050, hardness: H16) having a thickness of 0.24 mm was subjected to degreasing treatment at 60° C. for one minute in a 5 wt % sodium hydroxide aqueous solution and then to electrolytic etching treatment in an aqueous hydrochloric acid solution having a concentration of 0.5 mol/l at a temperature of 25° C. at a current density of 60 $A/dm^2$ for a treating time of 30 seconds. Then, it was subjected to desmut treatment in a 5 wt % sodium hydroxide aqueous solution at 60° C. for 10 seconds and then to anodizing treatment in a 20 wt % sulfuric acid solution at a temperature of 20° C. at a current density of 3 $A/dm^2$ for a treating time of one minute. Further, it was subjected to a hydrothermal pore sealing treatment with hot water of 80° C. for 20 seconds to obtain an aluminum plate as a support for a lithographic printing plate.

A photosensitive liquid comprising the following components, was coated by a wire bar on the aluminum plate prepared by the above described method and dried at 85° C. for 2 minutes, to obtain a photosensitive lithographic printing plate having a photosensitive layer with a film thickness of 24 $mg/dm^2$ coated thereon.

Photosensitive Liquid

| | | |
|---|---|---|
| Photo-thermal conversion material: | Compound S-53 in Table 1 | 0.04 g |
| Alkali-soluble resin: | m-cresol/p-cresol/phenol (3:2:5 molar ratio) novolak resin | 1.0 g |
| Solubility-suppressing agent: | Crystal Violet lactone | 0.1 g |
| Additive 1: | Cymel 300 manufactured by Mitsui Cytec Company | 0.01 g |
| Additive 2: | Cyclohexane-1,2-dicarboxylic acid | 0.05 g |
| Additive 3: | Polyoxyethylenesorbit tetraoleate | 0.04 g |
| Solvent: | Methyl cellosolve | 6.6 g |
| | Ethyl cellosolve | 1.7 g |

Then, evaluation was carried out with respect to the printing plate having the following treatment applied thereto. The results are shown in Table 2.

Example A1

The above-mentioned photosensitive lithographic printing plate was subjected to a treatment at 55° C. under a condition of an absolute humidity of 0.037 kg/kg' for 10 hours, to obtain a photosensitive lithographic printing plate.

Example A2

The above-mentioned photosensitive lithographic printing plate was subjected to a treatment at 55° C. under a condition of an absolute humidity of 0.037 kg/kg' for 24 hours, to obtain a photosensitive lithographic printing plate.

Example A3

The above-mentioned photosensitive lithographic printing plate was subjected to a treatment at 55° C. under a condition of an absolute humidity of 0.037 kg/kg' for 32 hours, to obtain a photosensitive lithographic printing plate.

Example A4

The above-mentioned photosensitive lithographic printing plate was subjected to a treatment at 60° C. under a condition of an absolute humidity of 0.049 kg/kg' for 12 hours, to obtain a photosensitive lithographic printing plate.

Example A5

The above-mentioned photosensitive lithographic printing plate was subjected to a treatment at 40° C. under a condition of an absolute humidity of 0.043 kg/kg' for 24 hours, to obtain a photosensitive lithographic printing plate. The dissolution rate of the photosensitive layer of the printing plate was measured and is depicted in FIG. 1 as the curve for sample 2.

Example A6

The above-mentioned photosensitive lithographic printing plate was subjected to a treatment at 40° C. under a condition of an absolute humidity of 0.001 kg/kg' for 120 hours, to obtain a photosensitive lithographic printing plate. The dissolution rate of the photosensitive layer of the printing plate was measured and is depicted in FIG. 1 as the curve for sample 1.

Example A7

The above-mentioned photosensitive lithographic printing plate was subjected to a treatment at 55° C. under a condition of an absolute humidity of 0.007 kg/kg' for 32 hours, to obtain a photosensitive lithographic printing plate.

Comparative Example A1

The above-mentioned photosensitive lithographic printing plate was not subjected to a treatment.

Comparative Example A2

The following photosensitive liquid was coated on an aluminum plate and dried in the same manner as in Example A1, and no treatment was carried out.

| Photosensitive liquid | | |
|---|---|---|
| Amplification dye: | Compound S-53 in Table 1 | 0.015 g |
| Alkali-soluble resin: | m-cresol/p-cresol/phenol (3:2:5 molar ratio) novolak resin | 0.5 g |
| Solubility-suppressing agent: | trimethylolethane | 0.1 g |
| Solvent: | Methyl cellosolve | 1.0 g |
| | Ethyl cellosolve | 4.3 g |

Then, evaluation was carried out with respect to the following items.

Print Making Process in Examples A1 to A7 and Comparative Examples A1 and A2

The above photosensitive lithographic printing plate was bonded on a rotary drum, and scanning exposure was carried out by a laser light (8 W) by a semiconductor laser plotter (Trendsetter 830 nm, manufactured by CREO CO., LTD.) under a yellow lamp. Then, development was carried out at 28° C. every 5 seconds for 120 seconds, with an alkali developer DP4 (for a positive lithographic plate, manufactured by Fuji Photo Film Co., Ltd.) diluted 7 times, and evaluation was carried out with respect to performances by the following methods.

Example A8

A photosensitive liquid comprising the following components, was coated by a wire bar on the aluminum plate prepared by the above described method and dried at 85° C. for 2 minutes, to obtain a photosensitive lithographic printing plate having a photosensitive layer with a film thickness of 24 $mg/dm^2$ coated thereon.

| Photosensitive liquid | | |
|---|---|---|
| Amplification dye: | Compound S-60 in Table 1 | 0.04 g |
| Alkali-soluble resin: | m-cresol/p-cresol/phenol (3:2:5 molar ratio) novolak resin ratio of phenol 50% | 1.0 g |
| Solubility-suppressing agent: | Crystal Violet lactone | 0.1 g |
| Additive 1: | Cymel 300 manufactured by Mitsui Cytec Company | 0.01 g |
| Additive 2: | Cyclohexane-1,2-dicarboxylic acid | 0.04 g |
| Additive 3: | Polyoxyethylenesorbit tetraoleate | 0.03 g |
| Solvent: | Methyl cellosolve | 8.5 g |
| | Ethyl cellosolve | 2.1 g |

The above-mentioned photosensitive lithographic printing plate was subjected to a treatment at 55° C. under a condition of an absolute humidity of 0.04 kg/kg' for 24 hours, to obtain a photosensitive lithographic printing plate.

Print Making Process in Example A8

The above photosensitive lithographic printing plate was bonded on a rotary drum, and scanning exposure was carried out by a laser light by a semiconductor laser plotter (CRESCENT 3030T 1,064 nm, manufactured by Geber) under a yellow lamp. Then, development was carried out at 28° C. every 5 seconds for 120 seconds, with an alkali developer DP4 (for a positive lithographic plate, manufactured by Fuji Photo Film Co., Ltd.) diluted 7 times, and evaluation was carried out with respect to performances by the above-mentioned method.

Measurement of Gradient of Solubility of the Photosensitive Layer in a Thickness Direction The above-mentioned photosensitive lithographic printing plate was dipped in a solution having an alkali developer DP4 diluted 7 times. The time (sec.) until 10% of the photosensitive layer was dissolved and the time (sec.) until 100% of the photosensitive layer was dissolved, were measured, and the value of the gradient of solubility of the photosensitive layer in the thickness direction was obtained from the following formula.

$$\text{Gradient of solubility} = \frac{(A)\times 9}{(B)-(A)}$$

(A): Time (sec.) required for dissolution of the photosensitive layer from the surface to the thickness 10%

(B): Time (sec.) required for dissolution of the entire (100%) photosensitive layer It is indicated that the higher the gradient of solubility, the higher the solubility-suppressing effect at the surface to the inner layer.

Measurement of the Range of Proper Time for Development

In the development treatment with DP4 diluted 7 times, the time when the entire irradiated portion irradiated with a laser energy of 200 mJ/cm$^2$ by the above exposure machine, was dissolved, and the time when 10% of the non-irradiated portion with the laser (solid portion) was dissolved, were measured, and the difference was taken as the proper time.

Sensitivity

The amount of laser energy with which a proper image can be obtained by soaking the photosensitive lithographic printing plate obtained under the above-mentioned exposure conditions, in the developer DP4 diluted 7 times at 28° C. for 40 seconds.

| | |
|---|---|
| Sensitivity = | The amount of irradiated laser energy required for forming an image with a soak in the above developer for 40 seconds (mJ/cm$^2$) |

Printing Resistance

A pattern for printing was baked with an exposure of 140 mJ/cm$^2$ at 8 W by the above-mentioned exposure machine, and each plate was treated by an automatic developing machine with DP4 diluted 7 times at a liquid temperature of 32° C., to prepare a printing plate. By using this, printing of 100,000 sheets was carried out, and printing defect of 3% of dots was visually evaluated by a 25×magnifier.

Printing conditions: High Echo Beni manufactured by Toyo Ink, an output of 3%

Wetting water: Astro No. 1, Mark 2, 1%, pH=5.0, an output of 40%

Printing paper: OK Art

Printing rate: 6,000 sheets/hr

Printing pressure: 0.13

Chemical Resistance

Gum chemical resistance: each sample was developed with DP4 diluted 7 times (liquid temperature: 28° C.), and soaked in a gum liquid (GU7, manufactured by Fuji Photo Film Co., Ltd.) for 2 hours, whereupon the film remaining ratio of the non-exposed portion (solid portion) was measured by a reflection densitometer and evaluated.

The evaluation standard was such that ○: 100–90%, Δ: 90–80%, ×: at most 80%, based on the measured value of the above-mentioned film remaining ratio.

Preservation Property 30 sheets with a size of 1,030×800 mm were wrapped with a moistureproof paper sheet, and preserved at 25° C. under a condition of a humidity of 56% for 3 months, and development was carried out by the above-mentioned exposure method with DP4 diluted 7 times, whereupon fluctuation in performances was evaluated.

The evaluation standard was such that ○: fluctuation value of within ±10%, Δ: within ±20%, and ×: at least ±20% in the above-mentioned evaluation for sensitivity.

The results of the above-mentioned evaluations are shown in Table 2.

TABLE 2-1

| | Sensitivity (mJ/cm$^2$) | Gradient of firm solubility | Range of proper time for development (sec.) | Printing resistance | Chemical resistance | Preservation property |
|---|---|---|---|---|---|---|
| Example A1 | 100 | 12 | 10–48 | 40,000 | Δ | Δ |
| Example A2 | 100 | 17 | 25–72 | 100,000 | ○ | ○ |
| Example A3 | 140 | 21 | 30–95 | 100,000 | ○ | ○ |
| Example A4 | 100 | 16 | 20–67 | 100,000 | ○ | ○ |
| Example A5 | 140 | 21 | 30–98 | 100,000 | ○ | ○ |
| Example A6 | 100 | 16 | 20–60 | 100,000 | ○ | ○ |
| Example A7 | 100 | 9 | 20 | 20,000 | x | x |
| Comparative | Impossible to | 1.3 | | | | |

TABLE 2-1-continued

| | Sensitivity ($mJ/cm^2$) | Gradient of firm solubility | Range of proper time for development (sec.) | Printing resistance | Chemical resistance | Preservation property |
|---|---|---|---|---|---|---|
| Example A1 | form an image | | | | | |
| Comparative Example A2 | Impossible to form an image | 1.5 | | | | |
| Example A8 | 200 | 19 | 60–100 | 100,000 | ○ | ○ |

TABLE 2-2

| | Gradient $S_2$ | Gradient $S_3$ | Glass transition temperature |
|---|---|---|---|
| Example A1 | 10 | 6 | 83 |
| Example A2 | 14 | 3 | 92 |
| Example A3 | 18 | 2 | 95 |
| Example A4 | 13 | 4 | 90 |
| Example A5 | 18 | 1 | 94 |
| Example A6 | 13 | 5 | 90 |
| Example A7 | 8 | 8 | 80 |
| Example A8 | 17 | 1 | 96 |

Examples B1 to B6 and Comparative Examples B1 and B2

Preparation of a Lithographic Printing Plate

Preparation of an Aluminum Plate

An aluminum plate (material: 1050, hardness: H16) having a thickness of 0.24 mm and a width of 1,200 mm was subjected to degreasing treatment at 60° C. for one minute in a 5 wt % sodium hydroxide aqueous solution and then to electrolytic etching treatment in an aqueous nitric acid solution having a concentration of 0.5 mol/l at a temperature of 25° C. at a current density of 60 $A/dm^2$ for a treating time of 30 seconds. Then, it was subjected to desmut treatment in a 5 wt % sodium hydroxide aqueous solution at 60° C. for 10 seconds and then to anodizing treatment in a 20 wt % sulfuric acid solution at a temperature of 20° C. at a current density of 3 $A/dm^2$ for a treating time of one minute. Further, it was subjected to a hydrothermal pore sealing treatment with hot water of 80° C. for 20 seconds to obtain an aluminum plate as a support for a lithographic printing plate.

A photosensitive liquid comprising the following components, was coated by a wire bar on the aluminum plate prepared by the above described method and dried at 85° C. for 2 minutes, to obtain a photosensitive lithographic printing plate having a photosensitive layer with a film thickness of 24 $mg/dm^2$ coated thereon.

Photosensitive Liquid

| | | |
|---|---|---|
| Photo-thermal conversion material: | Compound S-53 in Table 1 | 0.04 g |
| Alkali-soluble resin: | m-cresol/p-cresol/phenol (3:2:5 molar ratio) novolak resin | 1.0 g |
| Solubility-suppressing agent: | Crystal Violet lactone | 0.1 g |
| Additive 1: | Cymel 300 manufactured by Mitsui Cytec Company | 0.01 g |
| Additive 2: | Cyclohexane-1,2-dicarboxylic acid | 0.05 g |
| Additive 3: | Polyoxyethylenesorbit tetraoleate | 0.04 g |
| Solvent: | Methyl cellosolve | 6.6 g |
| | Ethyl cellosolve | 1.7 g |

Example B1

On the surface of the photosensitive layer of the above-mentioned photosensitive lithographic printing plate, a protective material (material: natural pulp paper) having a water content of 1.5%, a thickness of 100 μm and a weight of 25 $g/dm^2$, was supplied, followed by cutting into a length of 1,000 mm by a cutter. 300 sheets thereof were piled on a resin pallet having a wooden particleboard put thereon. Then, the pallet was put in a chamber in an atmosphere of 60° C. and a treatment was carried out for 24 hours to obtain a photosensitive lithographic printing plate.

Example B2

On the surface of the photosensitive layer of the above-mentioned photosensitive lithographic printing plate, a protective material (material: natural pulp paper) having a water content of 4%, a thickness of 100 μm and a weight of 25 $g/dm^2$, was smoothly supplied, followed by cutting into a length of 1,000 mm by a cutter. 300 sheets thereof were piled on a resin pallet having a wooden particleboard put thereon. Then, the pallet was put in a chamber in an atmosphere of 60° C. and a treatment was carried out for 24 hours to obtain a photosensitive lithographic printing plate.

Example B3

On the surface of the photosensitive layer of the above-mentioned photosensitive lithographic printing plate, a protective material (material: a mixed sheet comprising 70% of natural pulp and 30% of polyethylene) having a water content of 4%, a thickness of 100 μm and a weight of 25 $g/dm^2$, was smoothly supplied, followed by cutting into a length of 1,000 mm by a cutter. 300 sheets thereof were piled on a resin pallet having a wooden particleboard put thereon. Then, the pallet was put in a chamber in an atmosphere of 60° C. and a treatment was carried out for 24 hours to obtain a photosensitive lithographic printing plate.

Example B4

On the surface of the photosensitive layer of the above-mentioned photosensitive lithographic printing plate, a protective material (material: natural pulp paper) having a water content of 5%, a thickness of 100 μm and a weight of 25 $g/dm^2$, was supplied, followed by cutting into a length of 1,000 mm by a cutter. 20 sheets thereof were piled one on another, and the piled photosensitive lithographic printing plates were sandwiched in protective cardboards having a thickness of 1 mm, and a gummed tape having a width of 50 mm was applied to the four sides. Then, the pile was put in a chamber in an atmosphere of 55° C. and a treatment was carried out for 24 hours to obtain a photosensitive lithographic printing plate.

Example B5

On the surface of a photosensitive layer of the above-mentioned photosensitive lithographic printing plate, a protective material (material: natural pulp paper) having a water content of 5%, a thickness of 100 μm and a weight of 25 $g/dm^2$, was supplied, and the laminate was wound into a coil for 1,000 m. Then, the coil was put in a chamber in an atmosphere of 60° C. and a treatment was carried out for 24 hours, to obtain a photosensitive lithographic printing plate.

Example B6

On the surface of the photosensitive layer of the above-mentioned photosensitive lithographic printing plate, a protective material (material: natural pulp paper) having a water content of 4%, a thickness of 100 μm and a weight of $35/dm^2$, and having polyethylene laminated on its surface in a thickness of 8 μm, was supplied, followed by cutting into a length of 1,000 mm by a cutter. 300 sheets thereof were piled on a resin pallet having a wooden particleboard put thereon. Then, the pallet was put in a chamber in an atmosphere of 60° C. and a treatment was carried out for 24 hours, to obtain a photosensitive lithographic printing plate.

Comparative Example B1

No protective material was supplied on the surface of the photosensitive layer of the above-mentioned photosensitive lithographic printing plate, and the lithographic printing plate was cut into a length of 1,000 mm by a cutter. 300 sheets thereof were piled on a resin pallet having a wooden particleboard put thereon. Then, the pallet was put into a chamber in an atmosphere of 60° C. and a treatment was carried out for 24 hours, to obtain a photosensitive lithographic printing plate.

Comparative Example B2

On the surface of the photosensitive layer of the above-mentioned photosensitive lithographic printing plate, a protective material (material: PET film) having a water content of at most 0.8% and a thickness of 100 μm, was supplied, followed by cutting into a length of 1,000 mm by a cutter. Then, 300 sheets thereof were piled on a resin pallet having a wooden particleboard put thereon. Then, the pallet was put into a chamber in an atmosphere of 60° C. and a treatment was carried out for 24 hours, to obtain a photosensitive lithographic printing plate.

Print Making Process

The above photosensitive lithographic printing plate was bonded on a rotary drum, and scanning exposure was carried out by a laser light (8 W) by a semiconductor laser plotter (Trendsetter 830 nm, manufactured by CREO CO., LTD.) under a yellow lamp. Then, development was carried out at 28° C. every 5 seconds for 120 seconds, with an alkali developer DP4 (for a positive lithographic plate, manufactured by Fuji Photo Film Co., Ltd.) diluted 7 times, and evaluations were carried out with respect to the range of proper time for development, sensitivity, printing resistance, chemical resistance and preservation property, by the same methods as in Example A1.

The water content in the protective material was measured in such a manner that the 10th protective material from the top of said piled photosensitive lithographic printing plates before the treatment was quickly subjected to sampling, and a measurement was carried out in accordance with JISP8127-1979.

The results of the evaluations in Examples B1 to B6 and Comparative Examples B1 and B2 are shown in Table 3.

TABLE 3

| | Sensitivity ($mJ/cm^2$) | Range of proper time for development (sec.) | Printing resistance | Chemical resistance | Preservation property |
|---|---|---|---|---|---|
| Example B1 | 100 | 20–30 | 40,000 | Δ | Δ |
| Example B2 | 100 | 30–95 | 100,000 | ○ | ○ |
| Example B3 | 140 | 30–70 | 100,000 | ○ | ○ |
| Example B4 | 100 | 30–60 | 100,000 | ○ | ○ |
| Example B5 | 140 | 30–98 | 100,000 | ○ | ○ |
| Example B6 | 100 | 30–98 | 100,000 | ○ | ○ |
| Comparative Example B1 | Impossible to form an image (*) | | | | |
| Comparative Example B2 | Impossible to form an image (*) | | | | |

(*) The alkali resistance was low, whereby the entire photosensitive layer dissolved in a developer.

Examples C1 to C4

Preparation of a Lithographic Printing Plate

Preparation of an Aluminum Plate

An aluminum plate (material: 1050, hardness: H16) having a thickness of 0.24 mm and a width of 1,200 mm was subjected to degreasing treatment at 60° C. for one minute in a 5 wt % sodium hydroxide aqueous solution and then to electrolytic etching treatment in an aqueous nitric acid solution having a concentration of 0.5 mol/l at a temperature of 25° C. at a current density of 60 A/dm2 for a treating time of 30 seconds. Then, it was subjected to desmut treatment in a 5 wt % sodium hydroxide aqueous solution at 60° C. for 10 seconds and then to anodizing treatment in a 20 wt % sulfuric acid solution at a temperature of 20° C. at a current density of 3 $A/dm^2$ for a treating time of one minute. Further, it was subjected to a hydrothermal pore sealing treatment with hot water of 80° C. for 20 seconds to obtain an aluminum plate as a support for a lithographic printing plate.

A photosensitive liquid comprising the following components, was coated by a roll coater on the aluminum plate prepared by the above described method, dried in a first furnace at 45° C. for 30 seconds, and dried in a second furnace at 80° C. for 30 seconds to obtain a photosensitive layer with a film thickness of 24 $mg/dm^2$. A protective material (material: natural pulp, water content: 4%) was sandwiched therebetween, followed by cutting into 1,000×1,000 mm, and the sandwich was piled to obtain a photosensitive lithographic printing plate.

| Photosensitive liquid | | |
|---|---|---|
| Photo-thermal conversion material: Compound S-53 in Table 1 | | 0.04 g |
| Alkali-soluble resin: m-cresol/p-cresol/phenol (3:2:5) molar ratio novolak resin | | 1.0 g |
| Solubility-suppressing agent 1: Crystal Violet lactone | | 0.1 g |
| Solubility-suppressing agent 2: Novolak resin and the following compound (V) bonded to each other by ester linkage | | 0.1 g |
| Additive 1: | Cymel 300 manufactured by Mitsui Cytec Company | 0.01 g |
| Additive 2: | Cyclohexane-1,2-dicarboxylic acid | 0.05 g |
| Additive 3: | Polyoxyethylenesorbit tetraoleate | 0.04 g |
| Solvent: | Methyl cellosolve | 7.2 g |
| | Ethyl cellosolve | 1.8 g |

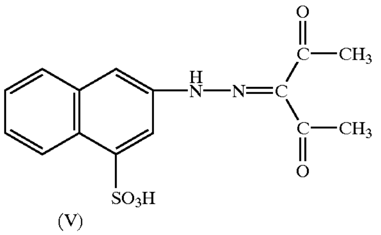

(V)

Example C1

1,000 sheets of the above-mentioned photosensitive lithographic printing plates were piled on a resin pallet having a wooden particleboard put thereon. Then, the pallet was put in a heat treatment chamber having moisture conditioning applied thereto, and having a relative humidity of 30%, an absolute humidity of 0.039 kg/kg' and a temperature of 60° C., and treatment was carried out for 32 hours to obtain a photosensitive lithographic printing plate.

Example C2

1,000 sheets of the above-mentioned photosensitive lithographic printing plates were piled on a resin pallet having a wooden particleboard put thereon. Then, the pallet was put in a heat treatment chamber having moisture conditioning applied thereto, and having a relative humidity of 20%, an absolute humidity of 0.025 kg/kg' and a temperature of 60° C., and treatment was carried out for 32 hours to obtain a photosensitive lithographic printing plate.

Example C3

1,000 sheets of the above-mentioned photosensitive lithographic printing plates were piled on a resin pallet having a wooden particleboard put thereon. Then, the pallet was put in a heat treatment chamber having no moisture conditioning applied thereto, and having a relative humidity of 7%, an absolute humidity of 0.0087 kg/kg' and a temperature of 60° C., and treatment was carried out for 32 hours to obtain a photosensitive lithographic printing plate.

Example C4

1,000 sheets of the above-mentioned photosensitive lithographic printing plates were piled on a resin pallet having a wooden particleboard put thereon. Then, the pallet was put in a heat treatment chamber having no moisture conditioning applied thereto, and having a relative humidity of 12%, an absolute humidity of 0.015 kg/kg' and a temperature of 60° C., and treatment was carried out for 32 hours to obtain a photosensitive lithographic printing plate.

The above photosensitive lithographic printing plate was bonded on a rotary drum, and scanning exposure was carried out by a laser light (8 W) by a semiconductor laser plotter (Trendsetter 830 nm, manufactured by CREO CO., LTD.) under a yellow lamp. Then, development was carried out with an alkali developer MT-4 (for a positive lithographic plate, manufactured by Mitsubishi Chemical Corporation) diluted 2.3 times at 31° C. by an automatic developing machine MT-850X manufactured by G & J, and evaluation was carried out with respect to performances by the following methods.

Method for Measuring Water Content in the Protective Material

The 10th protective material from the top of said piled photosensitive lithographic printing plates before the treatment was quickly subjected to sampling, and a measurement was carried out in accordance with JISP8127-1979.

Judgment on Development Property

Measurement of the Range of Proper Time for Development

The center portion of the obtained photosensitive lithographic printing plate of 1,000×1,000 mm was cut into 600×600 mm, and irradiated with a laser energy of 160 $mj/cm^2$ by the above-mentioned exposure machine under the above-mentioned developing treatment conditions with MT4 diluted 2.3 times, to form a clear portion image, a 50% halftone dot image and a non-irradiated portion (solid portion) image. Then, the developing time was changed, and the time when the irradiated portion completely dissolved, and the limit time where the halftone dot area of the laser 50% halftone dot portion uniformly kept 50% and the non-irradiated portion (solid portion) remained 90%, were measured, and the difference thereof was taken as the range of proper time for development. The wider the range of said proper time for development, the better, and the more effectively said treatment proceeded.

Sensitivity

The minimum of the amount of laser energy ($mJ/cm^2$) with which a proper image can be obtained under the above-mentioned exposure conditions and development conditions.

Development Uniformity of the Entire Plate of the Photosensitive Layer

A plate which was not exposed with MT4 diluted 2.3 times under the above-mentioned developing treatment conditions, was subjected to a treatment with the above-mentioned automatic developing machine having the transportation rate set to be 60 cm/min, and the area of the portion where the film remaining ratio was at most 90%, was measured.

Measurement of the Film Remaining Ratio

Measurement in the same manner as in Example A1 was carried out.

Printing Resistance

Measurement in the same manner as in Example A1 was carried out.

Chemical Resistance

Measurement in the same manner as in Example A1 was carried out.

Preservation Property

Measurement in the same manner as in Example A1 was carried out.

The results of the evaluations in Examples C1 to C4 are shown in Table 4.

TABLE 4

| | Sensitivity ($mJ/cm^2$) | Range of proper time for development (sec.) | Rate of area of non-uniform portion on the plate (%) | Judgment on development property | Printing resistance (sheets) | Chemical resistance | Preservation property |
|---|---|---|---|---|---|---|---|
| Example C1 | 140 | 27–60 | 0 | ◎ | 100,000 | ○ | ○ |
| Example C2 | 140 | 27–55 | 0.8 | ◎ | 100,000 | ○ | ○ |
| Example C3 | 140 | 27–50 | 19 | x | 100,000 | ○ | ○ |
| Example C4 | 140 | 27–50 | 15 | x | 100,000 | ○ | ○ |

Examples D1 to D6

Preparation of a Lithographic Printing Plate

Preparation of an Aluminum Plate

An aluminum plate (material: 1050, hardness: H16) having a thickness of 0.24 mm and a width of 1,200 mm was subjected to degreasing treatment at 60° C. for one minute in a 5 wt % sodium hydroxide aqueous solution and then to electrolytic etching treatment in an aqueous nitric acid solution having a concentration of 0.5 mol/l at a temperature of 25° C. at a current density of 60 $A/dm^2$ for a treating time of 30 seconds. Then, it was subjected to desmut treatment in a 5 wt % sodium hydroxide aqueous solution at 60° C. for 10 seconds and then to anodizing treatment in a 20 wt % sulfuric acid solution at a temperature of 20° C. at a current density of 3 $A/dm^2$ for a treating time of one minute. Further, it was subjected to a hydrothermal pore sealing treatment with hot water of 80° C. for 20 seconds to obtain an aluminum plate as a support for a lithographic printing plate.

A photosensitive liquid comprising the following components, was coated by a roll coater on the aluminum plate prepared by the above described method, dried in a first furnace at 45° C. for 30 seconds, and dried in a second furnace at 80° C. for 30 seconds, to obtain a photosensitive layer with a film thickness of 24 $mg/dm^2$. A protective material (material: natural pulp, water content: 4%) was sandwiched therebetween, followed by cutting into 1,000×1,000 mm, and the sandwich was piled to obtain a photosensitive lithographic printing plate.

| Photosensitive liquid | | |
|---|---|---|
| Photo-thermal conversion material: | Compound S-53 in Table 1 | 0.04 g |
| Alkali-soluble resin: | m-cresol/p-cresol/phenol (3:2:5 molar ratio) novolak resin | 1.0 g |
| Solubility-suppressing agent 1: | Crystal Violet lactone | 0.1 g |
| Solubility-suppressing agent 2: | Novolak resin and the above-mentioned compound (V) bonded to each other by ester linkage | 0.1 g |
| Additive 1: | Cymel 300 manufactured by Mitsui Cytec Company | 0.01 g |
| Additive 2: | Cyclohexane-1,2-dicarboxylic acid | 0.05 g |
| Additive 3: | Polyoxyethylenesorbit tetraoleate | 0.04 g |
| Solvent: | Methyl cellosolve | 7.2 g |
| Ethyl cellosolve | 1.8 | g |

Example D1

400 sheets of the above-mentioned photosensitive lithographic printing plates were piled on a resin pallet having a wooden particleboard put thereon. Then, as shown in FIG. 3, the side surfaces thereof were covered with a moistureproof sheet obtained by bonding a paper sheet with a thickness of 130 $\mu$m to PE and having aluminum vapor-deposited on the surface of PE, and they were adhered to each other so that no air was present therebetween, and a tape was applied to the edges for sealing. The pallet was put in a heat treatment chamber at a temperature of 60° C., followed by treatment for 32 hours, to obtain a photosensitive lithographic printing plate.

Example D2

1,000 sheets of the above-mentioned photosensitive lithographic printing plates were piled on a resin pallet having a wooden particleboard put thereon. Then, LDPE manufactured by Showa Packs K.K. having a thickness of 75 $\mu$m and a moisture permeability of 2 $g/m^2 \cdot 24$ hr was wound on the pile, and they were adhered to each other so that no air was present therebetween, and a tape was applied to the edges for sealing. The pallet was put in a heat treatment chamber at a temperature of 60° C., followed by treatment for 32 hours, to obtain a photosensitive lithographic printing plate.

Example D3

1,000 sheets of the above-mentioned photosensitive lithographic printing plates were piled on a resin pallet having a wooden particleboard put thereon. Then, as shown in FIG. 3, the side surfaces thereof were covered with a moistureproof sheet obtained by bonding Shrink Film D-955 (polyethylene tri-layer) manufactured by Cryovac, a paper sheet with a thickness of 25 $\mu$m and PE bonded to one another, and having aluminum vapor-deposited on the surface of PE, in one winding, and they were adhered to each other so that no air was present therebetween, and a tape was applied to edges for sealing. Then, the film was subjected to contraction with a drier, for further adhesion to the side surfaces of the plates. The pallet was put in a heat treatment chamber at a temperature of 60° C., followed by treatment for 32 hours, to obtain a photosensitive lithographic printing plate.

Example D4

1,000 sheets of the above-mentioned photosensitive lithographic printing plates were piled on a resin pallet having a wooden particleboard put thereon. Then, as shown in FIG. 3, the side surfaces thereof were covered with a moistureproof sheet obtained by bonding Shrink Film D-955 (polyethylene tri-layer) manufactured by Cryovac, a paper sheet with a thickness of 25 $\mu$m and PE bonded to one another, and having aluminum vapor-deposited on the surface of PE, in two windings, and they were adhered to each other so that no air was present therebetween, and a tape was applied to edges for sealing. Then, the film was subjected to contraction with a drier, for further adhesion to the side surfaces of the plates. The pallet was put in a heat treatment chamber at a temperature of 60° C., followed by treatment for 32 hours, to obtain a photosensitive lithographic printing plate.

Example D5

1,000 sheets of the above-mentioned photosensitive lithographic printing plates were piled on a resin pallet having a wooden particleboard put thereon. Then, the pallet was put into a heat treatment chamber having no moisture conditioning applied thereto, and having a relative humidity of 7%, an absolute humidity of 0.0087 kg/kg' and a temperature of $6^{0\circ}$ C., followed by treatment for 32 hours, to obtain a photosensitive lithographic printing plate.

Example D6

1,000 sheets of the above-mentioned photosensitive lithographic printing plates were piled on a resin pallet having a wooden particleboard put thereon. Then, the pallet was put into a heat treatment chamber having no moisture conditioning applied thereto, and having a relative humidity of 12%, an absolute humidity of 0.015 kg/kg' and a temperature of 60° C., followed by treatment for 32 hours, to obtain a photosensitive lithographic printing plate.

The above-mentioned photosensitive lithographic printing plate was bonded on a rotary drum, and scanning exposure was carried out by a laser light (8 W) by a semiconductor laser plotter (Trendsetter 830 nm, manufactured by CREO CO., LTD.) under a yellow lamp.

Then, development was carried out with an alkali developer MT-4 (for a positive lithographic plate, manufactured by Mitsubishi Chemical Corporation) diluted 2.3 times at 31° C. by an automatic developing machine MT-850X manufactured by G & J, and evaluation was carried out with respect to performances by the following methods.

Method for Measuring Water Content in the Protective Material

The 10th protective material from the top of said piled photosensitive lithographic printing plates before the treatment was quickly subjected to sampling, and a measurement was carried out in accordance with JISP8127-1979.

Judgment on Development Property

Measurement of the Range of Proper Time for Development

Measurement was carried out in the same manner as in Example C1.

Sensitivity

Measurement was carried out in the same manner as in Example C1.

Development Uniformity of the Entire Plate of the Photosensitive Layer

Measurement was carried out in the same manner as in Example C 1.

Measurement of the Film Remaining Ratio

Measurement was carried out in the same manner as in Example A1.

Printing Resistance

Measurement was carried out in the same manner as in Example A1.

Chemical Resistance

Measurement was carried out in the same manner as in Example A1.

Preservation Property

Measurement was carried out in the same manner as in Example A1.

The results of the evaluations in Examples D1 to D6 are shown in Table 5.

TABLE 5

| | Sensitivity ($mJ/cm^2$) | Range of proper time for development (sec.) | Rate of area of non-uniform portion on the plate (%) | Judgment on development property | Printing resistance (sheets) | Chemical resistance | Preservation property |
|---|---|---|---|---|---|---|---|
| Example D1 | 140 | 20–35 | 2 | ○Δ | 100,000 | ○ | ○ |
| Example D2 | 140 | 25–45 | 2 | ○ | 100,000 | ○ | ○ |
| Example D3 | 140 | 27–57 | 1 | ○ | 100,000 | ○ | ○ |
| Example D4 | 140 | 27–55 | 0.4 | ◎ | 100,000 | ○ | ○ |
| Example D5 | 140 | 27–50 | 19 | x | 100,000 | ○ | ○ |
| Example D6 | 140 | 27–50 | 15 | x | 100,000 | ○ | ○ |

Reference Examples E1 to E3 and Examples E1 and E2

Reference Example E1

A web of an aluminum thin plate (JIS alloy 1050) having a thickness of 0.29 mm and a width of 1,180 mm, as a metal thin plate, and a slip sheet web comprising 100% of natural pulp, having a thickness of 0.05 mm, a weighing of 35 $g/m^2$ and a width of 1,175 mm, and having polyethylene laminated on one surface in a thickness of 8 $\mu$m, as a slip sheet, were employed.

They were bonded to each other by utilizing static electricity, and cut in a length of 1,000 mm, and 860 sheets thereof were piled on a resin pallet having a particleboard with a thickness of 15 mm, a heat-insulating material with a thickness of 30 mm (trade name: Formnaht PIF board) and a patch board put thereon in this order. Further, on the piled sheets, a glass wool heat-insulating material with a thickness of 50 mm (trade name: Fine Jacket) was put, which was then put in a heat treatment chamber having the atmospheric temperature set to be 60° C., followed by heat treatment for 32 hours.

Reference Example E2

A web of an aluminum thin plate (JIS alloy 1050) having a thickness of 0.20 mm and a width of 1,180 mm, as a metal thin plate, and a slip sheet web comprising 100% of natural pulp, having a thickness of 0.05 mm, a weighing of 35 $g/m^2$ and a width of 1,175 mm, and having polyethylene laminated on one surface in a thickness of 8 $\mu$m, as a slip sheet, were employed.

They were bonded to each other by utilizing static electricity, and cut in a length of 900 mm, and 600 sheets thereof were piled on a resin pallet having a particleboard with a thickness of 15 mm, a heat-insulating material with a thickness of 30 mm (trade name: Formnaht PIF board) and a patch board put thereon in this order. Further, on the piled sheets, a glass wool heat-insulating material with a thickness of 50 mm (trade name: Fine Jacket) was put, which was then put in a heat treatment chamber having the atmospheric temperature set to be 60° C., followed by heat treatment for 32 hours.

Reference Example E3

The same operation as in Reference Example E1 was carried out except that the heat-insulating material was not used, and the piled 860 sheets were put in the heat treatment chamber, followed by heat treatment for 24 hours.

The results are shown in FIGS. 14 to 16. In Reference Example E3 (FIG. 16), the difference in the temperatures at the upper part and at the middle of the pile was at least 10° C., whereas in Reference Example E1 (FIG. 14) and Reference Example E2 (FIG. 15), it was suppressed to be at most 3° C.

Example E1

Preparation of a Lithographic Printing Plate

Preparation of an Aluminum Plate

An aluminum plate (material: 1050, hardness: H16) having a thickness of 0.29 mm and a width of 1,200 mm was subjected to degreasing treatment at 60° C. for one minute in a 5 wt % sodium hydroxide aqueous solution and then to electrolytic etching treatment in an aqueous nitric acid solution having a concentration of 0.5 mol/l at a temperature of 25° C. at a current density of 60 $A/dm^2$ for a treating time of 30 seconds. Then, it was subjected to desmut treatment in a 5 wt % sodium hydroxide aqueous solution at 60° C. for 10 seconds and then to anodizing treatment in a 20 wt % sulfuric acid solution at a temperature of 20° C. at a current density of 3 $A/dm^2$ for a treating time of one minute. Further, it was subjected to a hydrothermal pore sealing treatment with hot water of 80° C. for 20 seconds to obtain an aluminum plate as a support for a lithographic printing plate.

Formation of a Photosensitive Layer

A photosensitive liquid comprising the following components, was coated by a roll coater on the aluminum plate prepared by the above described method and dried at 85° C. for 2 minutes, to obtain a photosensitive printing plate having a photosensitive layer with a film thickness of 24 $mg/dm^2$ coated thereon.

| Photosensitive liquid | | |
|---|---|---|
| Photo-thermal conversion material: | Compound S-53 in Table 1 | 0.04 g |
| Alkali-soluble resin: | m-cresol/p-cresol/phenol (3:2:5 molar ratio) novolak resin | 1.0 g |
| Solubility-suppressing agent: | Crystal Violet lactone | 0.1 g |
| Additive 1: | Cymel 300 manufactured by Mitsui Cytec Company | 0.01 g |
| Additive 2: | Cyclohexane-1,2-dicarboxylic acid | 0.05 g |
| Additive 3: | Polyoxyethylenesorbit tetraoleate | 0.04 g |
| Solvent: | Methyl cellosolve | 6.6 g |
| | Ethyl cellosolve | 1.7 g |

Heat Treatment

On the surface of the photosensitive layer of the above-mentioned photosensitive printing plate, a protective material (material: natural pulp paper) having a water content of 4%, a thickness of 50 μm and a weight of 35 $g/dm^2$, and having polyethylene with a thickness of 8 μm laminated on one surface, was supplied, followed by cutting in a length of 1,000 mm by a cutter. 860 sheets thereof were piled on a resin pallet having a wooden particleboard put thereon and further having a heat-insulating material put thereon. Then, a glass wool heat-insulating material was put on the top, which was then put in a chamber in an atmosphere of 60° C., followed by a treatment for 32 hours, to obtain a photosensitive printing plate.

Evaluation

Print Making

The above-mentioned photosensitive lithographic printing plate was bonded on a rotary drum, and scanning exposure was carried out by a laser light (8 W) by a semiconductor laser plotter (Trendsetter 830 nm, manufactured by CREO CO., LTD.) under a yellow lamp. Then, development was carried out with an alkali developer DP4 (for a positive lithographic plate, manufactured by Fuji Photo Film Co., Ltd.) diluted 7 times at 28° C. every 5 seconds for 120 seconds, and evaluation was carried out with respect to performances by the following methods.

Measurement of the Range of Proper Time for Development

Measurement was carried out in the same manner as in Example A1.

Printing Resistance

Measurement was carried out in the same manner as in Example A1.

Example E2

The same operation as in Example E1 was carried out except that no heat-insulating material was applied, and the heat treatment was carried out for 24 hours, to obtain a photosensitive printing plate.

The results are shown in Table 6.

TABLE 6

| | | Range of proper time for development (sec.) | Printing resistance ($\times10^4$ sheets) |
|---|---|---|---|
| Example E1: | Upper part | 50–110 | 10 |
| | Middle | 50–110 | 10 |
| | Lower part | 50–110 | 10 |
| Example E2: | Upper part | 30–100 | 2 |
| | Middle | 20–20 | 2 |
| | Lower part | 30–30 | 2 |

Examples F1 to F7

Preparation of a Lithographic Printing Plate

Preparation of an Aluminum Plate

An aluminum plate (material: 1050, hardness: H16) having a thickness of 0.24 mm and a width of 1,200 mm was subjected to degreasing treatment at 60° C. for one minute in a 5 wt % sodium hydroxide aqueous solution and then to electrolytic etching treatment in an aqueous nitric acid solution having a concentration of 0.5 mol/l at a temperature of 25° C. at a current density of 60 $A/dm^2$ for a treating time of 30 seconds. Then, it was subjected to desmut treatment in a 5 wt % sodium hydroxide aqueous solution at 60° C. for 10 seconds and then to anodizing treatment in a 20 wt % sulfuric acid solution at a temperature of 20° C. at a current density of 3 $A/dm^2$ for a treating time of one minute. Further, it was subjected to a hydrothermal pore sealing treatment with hot water of 80° C. for 20 seconds to obtain an aluminum plate as a support for a lithographic printing plate.

| Photosensitive liquid | |
|---|---|
| Photo-thermal conversion material: Compound S-53 in Table 1 | 0.04 g |
| Alkali-soluble resin: m-cresol/p-cresol/phenol (3:2:5 molar ratio) novolak resin | 1.0 g |

-continued

| Photosensitive liquid | | |
|---|---|---|
| Solubility-suppressing agent 1: Crystal Violet lactone | | 0.1 g |
| Solubility-suppressing agent 2: Novolak resin and the above-mentioned compound (V) bonded to each other by ester linkage | | 0.1 g |
| Additive 1: | Cymel 300 manufactured by Mitsui Cytec Company | 0.01 g |
| Additive 2: | Cyclohexane-1,2-dicarboxylic acid | 0.05 g |
| Additive 3: | Polyoxyethylenesorbit tetraoleate | 0.04 g |
| Solvent: | Methyl cellosolve | 7.2 g |
| | Ethyl cellosolve | 1.8 g |

Example F1

A photosensitive liquid comprising the above-mentioned components, was coated by a roll coater on the aluminum plate prepared by the above-described method, dried in a first drying step at 45° C. for 33 seconds, and then dried in a second drying step at 60° C. for 43 seconds, to obtain a photosensitive layer of 20 $mg/dm^2$. After drying, a treatment was carried out under a condition of an absolute humidity of 0.043 kg/kg for 24 hours, to obtain a photosensitive lithographic printing plate.

Example F2

A photosensitive liquid comprising the above-mentioned components, was coated by a roll coater on the aluminum plate prepared by the above-described method, dried in a first drying step at 45° C. for 33 seconds, and then dried in a second drying step at 60° C. for 43 seconds, to obtain a photosensitive layer of 24 $mg/dm^2$. After drying, a treatment was carried out under a condition of an absolute humidity of 0.043 kg/kg for 24 hours, to obtain a photosensitive lithographic printing plate.

Example F3

A photosensitive liquid comprising the above-mentioned components, was coated by a roll coater on the aluminum plate prepared by the above-described method, dried a first drying step at 35° C. for 33 seconds, and then dried in a second drying step at 60° C. for 43 seconds, to obtain a photosensitive layer of 20 $mg/dm^2$. After drying, a treatment was carried out under a condition of an absolute humidity of 0.043 kg/kg for 24 hours, to obtain a photosensitive lithographic printing plate.

Example F4

A photosensitive liquid comprising the above-mentioned components, was coated by a roll coater on the aluminum plate prepared by the above-described method, dried in a first drying step at 35° C. for 33 seconds, and then dried in a second drying step at 60° C. for 43 seconds, to obtain a photosensitive layer of 24 $mg/dm^2$. After drying, a treatment was carried out under a condition of an absolute humidity of 0.043 kg/kg for 24 hours, to obtain a photosensitive lithographic printing plate. The above-mentioned photosensitive lithographic printing plate was treated at 55° C. under a condition of an absolute humidity of 0.037 kg/kg' for 24 hours, to obtain a photosensitive lithographic printing plate.

Example F5

A photosensitive liquid comprising the above-mentioned components, was coated by a roll coater on the aluminum plate prepared by the above-described method, dried in a first drying step at 45° C. for 33 seconds, and then dried in a second drying step at 70° C. for 43 seconds, to obtain a photosensitive layer of 24 $mg/dm^2$. After drying, a treatment was carried out under a condition of an absolute humidity of 0.043 kg/kg for 24 hours, to obtain a photosensitive lithographic printing plate.

Example F6

A photosensitive liquid comprising the above-mentioned components, was coated by a roll coater on the aluminum plate prepared by the above-described method, dried in a first drying step at 75° C. for 33 seconds, and then dried in a second drying step at 90° C. for 43 seconds, to obtain a photosensitive layer of 24 $mg/dm^2$. After drying, a treatment was carried out under a condition of an absolute humidity of 0.043 kg/kg for 24 hours, to obtain a photosensitive lithographic printing plate.

Example F7

A photosensitive liquid comprising the above-mentioned components, was coated by a roll coater on the aluminum plate prepared by the above-described method, dried in a first drying step at 45° C. for 33 seconds, and then dried in a second drying step at 80° C. for 43 seconds, to obtain a photosensitive layer of 18 $mg/dm^2$. After drying, a treatment was carried out under a condition of an absolute humidity of 0.043 kg/kg for 24 hours, to obtain a photosensitive lithographic printing plate.

Print Making Process

The above photosensitive lithographic printing plate was bonded on a rotary drum, and scanning exposure was carried out by a laser light (8 W) by a semiconductor laser plotter (Trendsetter 830 nm, manufactured by CREO CO., LTD.) under a yellow lamp. Then, development was carried out with an alkali developer MT-4 (for a positive lithographic plate, manufactured by Mitsubishi Chemical Corporation) diluted 2.3 times at 31° C. by an automatic developing machine MT-850X manufactured by G & J, and evaluation was carried out with respect to performances by the following methods.

Measurement of the Range of Proper Time for Development

In the development treatment with MT4 diluted 2.3 times, the time when the entire irradiated portion irradiated with the laser energy of 160 $mj/cm^2$ by the above exposure machine was dissolved, and the time when 10% of the non-irradiated portion with the laser (solid portion) was dissolved, were measured, and the difference was taken as the range of proper time for development. The wider the range of proper time for development, the better, and the more effectively said treatment proceeded.

Measurement of Tg of the Photosensitive Layer

The above-mentioned photosensitive liquid was coated at a liquid temperature of 25° C. under an atmosphere of 25° C., and then dried by a hot wind drier at 50° C. for 3 minutes to obtain a photosensitive layer of 24 $mg/dm^2$. The time of the constant rate drying was 30 seconds at this time. Tg of said photosensitive layer was measured by means of D-DSC, whereupon Tg was 53° C.

Time of Constant Rate Drying

This was calculated from the solid content concentration and the physical property values, the solvent concentration and the physical property values, film thickness and drying conditions. FIG. 5 illustrates one example of calculation of the time of the constant rate drying. The completion point of the constant rate drying is the point at which the evaporation process of the coated film reaches the internal diffusion-determined step, and practically, it can be obtained as the point at which the amount of displacement of the coated film thickness by drying reached almost 0 (point of inflection in a graph illustrating the thickness of the coated film).

The evaluation standard was such that ○: fluctuation value of within ±10%, Δ: within ±20%, and ×: at least ±20%, when a printing plate was prepared under the above-mentioned exposure conditions and development conditions.

The results of the evaluations in Examples F1 to F7 and are shown in Table 7.

TABLE 7

| | Sensitivity ($mJ/cm^2$) | Tg after coating and drying (° C.) | Time for constant rate drying (sec.) | Range of proper time for development (sec.) | Judgment on development property | Printing resistance (sheets) | Chemical resistance | Preservation property |
|---|---|---|---|---|---|---|---|---|
| Example F1 | 140 | 56 | 27.5 | 20–35 | ○Δ | 100,000 | ○ | ○ |
| Example F2 | 140 | 53 | 27.5 | 25–45 | ○ | 100,000 | ○ | ○ |
| Example F3 | 100 | 53 | 29 | 27–57 | ○ | 100,000 | ○ | ○ |
| Example F4 | 100 | 52.5 | 34 | 27–55 | ◎ | 100,000 | ○ | ○ |
| Example F5 | 140 | 53.5 | 27.5 | 27–55 | ◎ | 100,000 | ○ | ○ |
| Example F6 | 200 | 73 | 17.5 | 27–50 | x | 100,000 | ○ | ○ |
| Example F7 | 160 | 63 | 21 | 27–50 | x | 100,000 | ○ | ○ |

Coefficient of heat transfer in the hot wind drying was 24 $kcal/m^2 \cdot hr \cdot K$ in the first drying step in FIG. 4, and 50 $kcal/m^2 \cdot hr \cdot °$ C. in the second drying step in FIG. 4, and the solid content concentration was 13%.

Sensitivity

The minimum of the amount of laser energy ($mJ/cm^2$) with which a proper image can be obtained by a soak at 28° C. for 40 seconds under the above-mentioned exposure conditions and development conditions.

Printing Resistance

A pattern for printing was baked with an exposure of 160 $mJ/cm^2$ at 8 W by the above-mentioned exposure machine, and a treatment was carried out under the above-mentioned development conditions, to prepare a printing plate. By using this, printing of 100,000 sheets was carried out, and printing defect of 3% of dots was visually evaluated by a 25×magnifier.

Printing conditions: High Echo Beni manufactured by Toyo Ink, an output of 3%,

Wetting water: Astro No. 1, Mark 2, 1%, pH=5.0, an output of 40%,

Printing paper: OK Art

Printing rate: 6,000 sheets/hr

Printing pressure: 0.13

Chemical Resistance

Gum chemical resistance: each sample was developed under the above-mentioned exposure conditions and development conditions, and soaked in a gum liquid GU7 manufactured by Fuji Photo Film Co., Ltd. for 2 hours, whereupon the film remaining ratio of the non-exposed portion (solid portion) was measured by a reflection densitometer and evaluated.

The evaluation standard was such that ○: 100–90%, Δ: 90–80%, ×: at most 80%, based on the measured value of the above-mentioned film remaining ratio.

Preservation Property 30 sheets with a size of 1,030×800 mm were wrapped with a moistureproof paper sheet, and preserved at 25° C. under a condition of a humidity of 56% for 3 months, and development was carried out by the above-mentioned exposure method with DP4 diluted 7 times, whereupon fluctuation in performances was evaluated.

Examples G1 to G3

Preparation of a Lithographic Printing Plate

Preparation of an Aluminum Plate

An aluminum plate (material: JIS 1050, hardness: H16) having a thickness of 0.24 mm and a width of 1,200 mm was subjected to degreasing treatment at 60° C. for one minute in a 5 wt % sodium hydroxide aqueous solution and then to electrolytic etching treatment in an aqueous nitric acid solution having a concentration of 0.5 mol/l at a temperature of 25° C. at a current density of 60 $A/dm^2$ for a treating time of 30 seconds. Then, it was subjected to desmut treatment in a 5 wt % sodium hydroxide aqueous solution at 60° C. for 10 seconds and then to anodizing treatment in a 20 wt % sulfuric acid solution at a temperature of 20° C. at a current density of 3 $A/dm^2$ for a treating time of one minute. Further, it was subjected to a hydrothermal pore sealing treatment with hot water of 80° C. for 20 seconds to obtain an aluminum plate as a support for a lithographic printing plate.

A photosensitive liquid comprising the following components, was coated by a wire bar on the aluminum plate prepared by the above described method and dried at 85° C. for 2 minutes, to obtain a photosensitive lithographic printing plate having a photosensitive layer with a film thickness of 24 $mg/dm^2$ coated thereon.

| Photosensitive liquid | | |
|---|---|---|
| Photo-thermal conversion material: Compound S-53 in Table 1 | | 0.04 g |
| Alkali-soluble resin: m-cresol/p-cresol/phenol (3:2:5 molar ratio) novolak resin | | 1.0 g |
| Solubility-suppressing agent 1: Crystal Violet lactone | | 0.1 g |
| Solubility-suppressing agent 2: Novolak resin and the above-mentioned compound (V) bonded to each other by ester linkage | | 0.1 g |
| Additive 1: | Cymel 300 manufactured by Mitsui Cytec Company | 0.01 g |
| Additive 2: | Cyclohexane-1,2-dicarboxylic acid | 0.05 g |
| Additive 3: | Polyethylenesorbit tetraoleate | 0.04 g |

-continued

| Photosensitive liquid | | |
|---|---|---|
| Solvent: | Methyl cellosolve | 7.2 g |
| | Ethyl cellosolve | 1.8 g |

Example G1

On the surface of the photosensitive layer of the above-mentioned photosensitive lithographic printing plate, a protective material (material: natural pulp paper) having a water content of 4.0%, a thickness of 100 μm and a weight of 25 $g/dm^2$, was supplied, followed by cutting into a size of 1,180 mm×900 mm by a cutter, and 900 sheets thereof were piled on a resin pallet having a wooden particleboard put thereon. The side surfaces of the pile were covered with a heat contractive sheet, and the sheet was subjected to contraction with a drier for adhesion. On the top of the pile, a heat-insulating material in a form of a mat of 1,200 mm×1,400 mm was put.

Then, the pile was brought in a chamber in an atmosphere of 65° C., and the time until the temperature of the plate reached 60° C. was measured.

Example G2

On the surface of the photosensitive layer of the above-mentioned photosensitive lithographic printing plate, a protective material (material: natural pulp paper) having a water content of 4.0%, a thickness of 100 μm and a weight of 25 $g/dm^2$, was supplied, followed by cutting into a size of 1,180 mm×900 mm by a cutter, and 900 sheets thereof were piled on a resin pallet having a wooden particleboard put thereon. The side surfaces of the pile were covered with a heat contractive sheet, and the sheet was subjected to contraction with a drier for adhesion. On the side surfaces of the pile, a heat generator of a sheet shape (300 mm×4,200 mm (1.26 $m^2$)) with a wattage density of 457 $W/m^2$ was wound, and a heat contractive resin film was further wound on the outside thereof, followed by heating for contraction for adhesion of the heat generator to the side surfaces of the piled plates. On the top of the pile, a heat-insulating material in a form of a mat of 1,200 mm×1,400 mm was put.

Then, the pile was brought in a chamber in an atmosphere of 65° C., and at the same time, a voltage (100 V) was applied to the heat generator of a sheet shape, for heat generation. The time until the temperature of the plate reached 60° C. was measured.

Example G3

On the surface of the photosensitive layer of the above-mentioned photosensitive lithographic printing plate, a protective material (material: natural pulp paper) having a water content of 4.0%, a thickness of 100 μm and a weight of 25 $g/dm^2$, was supplied, followed by cutting into a size of 1,180 mm×900 mm by a cutter, and 900 sheets thereof were piled on a resin pallet having a wooden particleboard put thereon. On the side surfaces of the pile, a heat generator of a sheet shape (300 mm×4,200 mm (1.26 $m^2$)) with a wattage density of 457 $W/m^2$ was wound, and a heat contractive resin film was further wound on the outside thereof, followed by heating for contraction for adhesion of the heat generator to the side surfaces of the piled plates. Further, on the side surfaces thereof, a heat-insulating material in a form of a mat of 350 mm×4,400 mm was wound, and on the top of the pile, a heat-insulating material in a form of a mat of 1,200 mm×1,400 mm was put. Then, a voltage (100 V) was applied to the heat generator of a sheet shape in an ordinary temperature atmosphere, for heat generation. The time until the temperature of the plate reached 60° C. was measured.

The results in Examples G1 to G3 are shown in Table 8.

TABLE 8

| | Time until the temperature of the plate reached 60° C. |
|---|---|
| Example G1 | 32 hours |
| Example G2 | 14 hours |
| Example G3 | 10 hours |

Examples H1 and H2

Preparation of a Lithographic Printing Plate

Preparation of an Aluminum Plate

An aluminum plate (material: JIS1050, hardness: H16) having a thickness of 0.24 mm and a width of 1,200 mm was subjected to degreasing treatment at 60° C. for one minute in a 5 wt % sodium hydroxide aqueous solution and then to electrolytic etching treatment in an aqueous nitric acid solution having a concentration of 0.5 mol/l at a temperature of 25° C. at a current density of 60 $A/dm^2$ for a treating time of 30 seconds. Then, it was subjected to desmut treatment in a 5 wt % sodium hydroxide aqueous solution at 60° C. for 10 seconds and then to anodizing treatment in a 20 wt % sulfuric acid solution at a temperature of 20° C. at a current density of 3 $A/dm^2$ for a treating time of one minute. Further, it was subjected to a hydrothermal pore sealing treatment with hot water of 80° C. for 20 seconds to obtain an aluminum plate as a support for a lithographic printing plate.

A photosensitive liquid comprising the following components, was coated by a wire bar on the aluminum plate prepared by the above described method and dried at 85° C. for 2 minutes, to obtain a photosensitive lithographic printing plate having a photosensitive layer with a film thickness of 24 $mg/dm^2$ coated thereon.

| Photosensitive liquid | | |
|---|---|---|
| Photo-thermal conversion material: Compound S-53 in Table 1 | | 0.04 g |
| Alkali-soluble resin: m-cresol/p-cresol/phenol (3:2:5 molar ratio) novolak resin | | 1.0 g |
| Solubility-suppressing agent 1: Crystal Violet lactone | | 0.1 g |
| Solubility-suppressing agent 2: Novolak resin and the above-mentioned compound (V) bonded to each other by ester linkage | | 0.1 g |
| Additive 1: | Cymel 300 manufactured by Mitsui Cytec Company | 0.01 g |
| Additive 2: | Cyclohexane-1,2-dicarboxylic acid | 0.05 g |
| Additive 3: | Polyoxyethylenesorbit tetraoleate | 0.04 g |
| Solvent: | Methyl cellosolve | 7.2 g |
| | Ethyl cellosolve | 1.8 g |

Example H1

On the surface of the photosensitive layer of the above-mentioned photosensitive lithographic printing plate, a protective material (material: natural pulp paper) having a water content of 4.0%, a thickness of 100 μm and a weight of 25 $g/dm^2$, was supplied, followed by cutting into a size of 1,180 mm×900 mm by a cutter, and 900 sheets thereof were piled on a resin pallet having a wooden particleboard put thereon. The side surfaces of the pile were covered with a heat contractive sheet, and the sheet was subjected to contraction with a drier for adhesion. On the top of the pile, a heat-insulating material in a form of a mat of 1,200 mm×1,400 mm was put.

Then, the pile was brought in a chamber in an atmosphere of 70° C., and the time until the temperature of the plate reached 60° C. was measured, without operating an air circulation apparatus.

Example H2

On the surface of the photosensitive layer of the above-mentioned photosensitive lithographic printing plate, a protective material (material: natural pulp paper) having a water content of 4.0%, a thickness of 100 μm and a weight of 25 $g/dm^2$, was supplied, followed by cutting into a size of 1,180 mm×900 mm by a cutter, and 900 sheets thereof were piled on a resin pallet having a wooden particleboard put thereon. The side surfaces of the pile were covered with a heat contractive sheet, and the sheet was subjected to contraction with a drier for adhesion. On the top of the pile, a heat-insulating material in a form of a mat of 1,200 mm×1,400 mm was put.

Then, the pile was brought in a chamber in an atmosphere of 70° C., and the time until the temperature of the plate reached 60° C. was measured, while operating the air circulation apparatus. The rate of air current around the pile was 6.0 m/s on the average of the four corners of the surface of the piled lithographic printing plates against the air circulation apparatus.

The results in Examples Hi and H2 are shown in Table 9.

TABLE 9

| | Time until the temperature of the plate reached 60° C. |
|---|---|
| Example H1 | 21 hours |
| Example H2 | 18 hours |

Obviously, numerous modifications and variations of the present invention are possible in light of the above teachings. It is therefore to be understood that within the scope of the appended claims, the invention may be practiced otherwise than as specifically described herein.

This application claims the right of priority under 35 U.S.C. §119 based on the following Japanese Patent Applications:

No. 324734/1998 filed on Nov. 16, 1998,

No. 326340/1998 filed on Nov. 17, 1998,

No. 4985/1999 filed on Jan. 12, 1999,

No. 211957/1999 filed on Jul. 27, 1999,

No. 211958/1999 filed on Jul. 27, 1999, and

No. 236705/1999 filed on Aug. 24, 1999.

The entire disclosure of each of the above-mentioned Japanese applications is incorporated herein by reference.

What is claimed is:

1. A positive photosensitive lithographic printing plate which comprises a photosensitive material containing a photo-thermal conversion material having an absorption band within a wavelength range of from 600 nm to 1,300 nm and an alkali-soluble resin, wherein the dissolution rate of said photosensitive material, in unexposed condition, in an alkali developer increases from the surface part toward the lower part of said photosensitive material;

wherein said photosensitive material includes a polar compound diffused into said material from the surface of said photosensitive material.

2. A positive photosensitive lithographic printing plate which comprises a photosensitive material containing a photo-thermal conversion material having an absorption band within a wavelength range of from 600 nm to 1,300 nm and an alkali-soluble resin, wherein the dissolution rate of said photosensitive material, in unexposed condition, in an alkali developer continuously increases from the surface part toward the lower part of said photosensitive material;

wherein said photosensitive material includes a polar compound diffused into said material from the surface of said photosensitive material.

3. The positive photosensitive lithographic printing plate according to claim 1 or 2, which has been exposed by a laser light.

4. The positive photosensitive lithographic printing plate of claim 1 or 2 wherein said polar compound is $H_2O$.

5. The positive photosensitive lithographic printing plate according to claim 1 or 2, wherein the photosensitive material is a monolayer.

6. The positive photosensitive lithographic printing plate according to claim 1 or 2, wherein the gradient of solubility of the photosensitive material in the thickness direction is at least 2.

7. The positive photosensitive composition according to claim 1 or 2, wherein when the photosensitive material is developed with an alkali developer, the dissolution rate of the photosensitive material in the unexposed condition is from 0.01 to 20% at the half point (t/2) of the time (t) until the film remaining ratio reaches 20%.

8. The positive photosensitive lithographic printing plate according to claim 1 or 2, wherein the glass transition temperature of the photosensitive material is from 50° C. to 120° C.

9. The positive photosensitive lithographic printing plate according to claim 1 or 2, which contains at least a novolak resin as the alkali-soluble resin.

10. The positive photosensitive lithographic printing plate according to claim 1 or 2, which contains at least a polyvinyl phenol resin as the alkali-soluble resin.

11. The positive photosensitive lithographic printing plate according to claim 1 or 2, wherein the photo-thermal conversion material is a cyanine dye.

12. The positive photosensitive lithographic printing plate according to claim 11, wherein the cyanine dye is a compound represented by the following general formula (I):

(I)

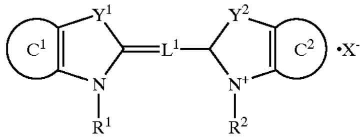

wherein each of the ring $C^1$ and the ring $C^2$ which are independent of each other, is a benzene ring or a naphthalene ring which may have a substituent, each of $Y^1$ and $Y^2$ which are independent of each other, is a dialkylmethylene group or a sulfur atom, each of $R^1$ and $R^2$ which are independent of each other, is a hydrocarbon group which may have a substituent, $L^1$ is a tri-, penta- or hepta-methine group which may have a substituent, provided that two substituents in said pent- or hepta-methine group may bond to each other to form a $C_{5-7}$ cycloalkene ring, and $X^-$ is a counter anion.

13. A method for forming a positive image, which comprises scanning and irradiating the positive photosensitive lithographic printing plate as defined in claim 11, with a laser light having a wavelength comprising 830 nm, to project an image for exposure, followed by development with an alkali developer.

14. The positive photosensitive lithographic printing plate according to claim 1 or 2, wherein the photo-thermal conversion material is a compound having at least one N,N-diaryl iminium skeleton in its molecule.

15. The positive photosensitive lithographic printing plate according to claim 14, wherein the compound having at least one N,N-diaryl iminium skeleton in its molecule is a compound represented by the following general formula (IIa) or (IIb):

(IIa)

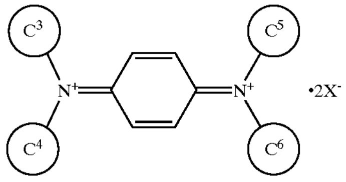

(IIb)

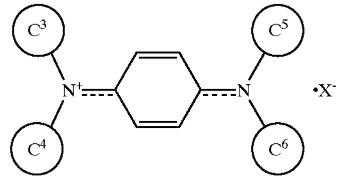

wherein each of $C^3$ to $C^6$ which are independent of each other, is a benzene ring which may have a substituent, $X^-$ is a counter anion, and the cyclohexadiene ring to which nitrogen atoms are bonded, may have a substituent.

16. A method for forming a positive image, which comprises scanning and irradiating the positive photosensitive lithographic printing plate as defined in claim 14, with a laser light having a wavelength comprising 1064 nm, to project an image for exposure, followed by development with an alkali developer.

17. The positive photosensitive lithographic printing plate according to claim 1 or 2, wherein the photosensitive material further contains a solubility-suppressing agent.

18. The positive photosensitive lithographic printing plate according to claim 17, wherein the solubility-suppressing agent is a sulfonic ester compound.

19. The positive photosensitive lithographic printing plate according to claim 17, wherein the solubility-suppressing agent is a compound having a triarylmethane skeleton.

20. The positive photosensitive lithographic printing plate according to claim 1 or 2, wherein the alkali-soluble resin contains phenolic hydroxyl groups, and at least part of said phenolic hydroxyl groups are esterified by a sulfonic acid compound which functions to suppress solubility of the photosensitive material.

21. The positive photosensitive lithographic printing plate according to claim 1 or 2, wherein the photosensitive material further contains an acid color-developable dye.

22. The positive photosensitive lithographic printing plate according to claim 21, wherein the acid color-developable dye is a compound having a lactone skeleton in its molecule.

23. The positive photosensitive lithographic printing plate according to claim 1 or 2, wherein the photosensitive layer further contains a compound capable of crosslinking the alkali-soluble resin by the effect of heat.

24. The positive photosensitive lithographic printing plate according to claim 23, wherein the compound capable of crosslinking the alkali-soluble resin by the effect of heat, is a compound having a melamine skeleton.

25. A positive photosensitive printing plate as set forth in claim 24 wherein said polar compound is $H_2O$.

26. The positive photosensitive lithographic printing plate according to claim 1 or 2, wherein the photosensitive material contains no photo-acid-generator.

27. The positive photosensitive lithographic printing plate according to claim 1 or 2, wherein the dissolution rate of the photosensitive layer in an alkali developer is not substantially changed by irradiation with ultraviolet rays.

28. The positive photosensitive lithographic printing plate according to claim 1 or 2, wherein the photosensitive material has a residual level of a solvent of at most 6%.

29. The positive photosensitive lithographic printing plate according to claim 1 or 2, wherein the photosensitive material does not undergo a chemical change by irradiation with a light having a wavelength within a range of from 600 nm to 1,300 nm.

30. The positive photosensitive lithographic printing plate according to claim 1 or 2, wherein the photosensitive material does not substantially undergo a chemical change by irradiation with a light having a wavelength within a range of from 250 nm to 600 nm.

31. The positive photosensitive lithographic printing plate according to claim 1 wherein the photosensitive material is composed of a plurality of layers.

32. A method for forming a positive image, which comprises scanning and irradiating the positive photosensitive lithographic printing plate as defined in claim 1, with a laser light having a wavelength range of from 600 to 1,300 nm, to project an image for exposure, followed by development with an alkali developer.

33. The method for forming a positive image according to claim 32, wherein the light intensity at the time of irradiation with a laser light beam is at least $2\times10^6$.

34. The method for forming a positive image according to claim 32, wherein the alkali developer contains an alkali metal hydroxide and an alkali metal silicate, has a pH of at least 12, and contains a silicone.

35. The method for forming a positive image according to claim 32, wherein the alkali developer contains an amphoteric surface active agent.

36. A method for forming a positive image, which comprises irradiating the positive photosensitive lithographic printing plate as defined in claim 1, with a laser light having a wavelength range of from 600 nm to 1,300 nm for exposure, and subjecting the positive photosensitive lithographic printing plate to an alkali development process.

37. A method for printing an image on a surface comprising forming a positive image on a printing plate by irradiating a positive photographic printing plate, as defined in claim 1, with a laser light having a wavelength of from 600 nm to 1,300 nm for exposure, developing the formed image using an alkali development process, applying printing ink to the developed image and applying ink from said image to the surface to be printed.

38. A method for producing a positive photosensitive lithographic printing plate, which comprises coating a photosensitive composition containing a photo-thermal conversion material having an absorption band within a wavelength range of from 600 nm to 1,300 nm and an alkali-soluble resin, on a support to form a layer of photosensitive material, and diffusing a compound having a polar group into the photosensitive material from the surface of the photosensitive material.

39. A method for forming a positive image, which comprises scanning and irradiating the positive photosensitive lithographic printing plate obtained by the method as defined in claim 38, with a laser light having a wavelength range of from 600 nm to 1,300 nm, to project an image for exposure, followed by development with an alkali developer.

40. A method for producing a positive photosensitive lithographic printing plate, which comprises coating a photosensitive composition containing a photo-thermal conversion material having an absorption band within a wavelength range of from 600 nm to 1,300 nm and an alkali-soluble resin, on a support to form a layer of photosensitive material, and diffusing $H_2O$ into the photosensitive material from the upper surface of the photosensitive material.

41. A method for producing a positive photosensitive lithographic printing plate, which comprises coating a photosensitive composition containing a photo-thermal conversion material having an absorption band within a wavelength range of from 600 nm to 1,300 nm and an alkali-soluble resin, on a support to form a photosensitive layer, and carrying out diffusion of a material into the photosensitive material from the surface of the photosensitive layer, so that the dissolution rate of said photosensitive layer in an alkali developer continuously increases from the surface part toward the lower layer part.

42. The method of claim 41 wherein the diffused material is a polar compound.

43. The method as set forth in claim 42, wherein said polar compound is $H_2O$.

44. A method for producing a positive photosensitive lithographic printing plate, which comprises coating a photosensitive composition containing a photo-thermal conversion material having an absorption band within a wavelength range of from 600 nm to 1,300 nm and an alkali-soluble resin, on a support to form a layer of photosensitive material, overlaying said photosensitive material with a protective material containing moisture, and keeping the laminate under heat.

45. The method for producing a positive photosensitive lithographic printing plate according to claim 44, wherein the protective material has a $H_2O$ content of from 1 to 10 wt %.

46. positive photosensitive lithographic printing plate which can be imaged when exposed by a laser light said plate comprising a photosensitive material containing a photo-thermal conversion material having an absorption band within a wavelength range of from 600 nm to 1,300 nm and an alkali-soluble resin, wherein the photosensitive material is formed on a support, which is then overlaid with a protective material having a $H_2O$ content of from 1 to 10 wt %, followed by keeping the laminate under heating such that said $H_2O$ diffuses into said photosensitive material.

47. The method for producing a positive photosensitive lithographic printing plate as defined in claim 46, wherein the positive photosensitive lithographic printing plate is overlaid with a protective material containing moisture, followed by keeping the laminate under heating at a temperature of from 30 to 100° C.

48. A method for producing a positive photosensitive lithographic printing plate which can be exposed by a laser light, which comprises forming a photosensitive layer containing a photo-thermal conversion material having an absorption band within a wavelength range of from 600 nm to 1,300 nm and an alkali-soluble resin, on a support, followed by overlying said photosensitive layer with a protective material having a $H_2O$ content of from 1 to 10 wt %, and keeping the laminate under heating for a predetermined time.

49. A method for producing a positive photosensitive lithographic printing plate which can be exposed by a laser light, which comprises forming a photosensitive layer containing a photo-thermal conversion material having an absorption band within a wavelength range of from 600 nm to 1,300 nm and an alkali-soluble resin, on a support, followed by overlying with a protective material having a $H_2O$ content of from 1 to 10 wt %, and keeping the laminate under heating for a predetermined time, so that said $H_2O$ diffuses from said protective material into said photosensitive material and the dissolution rate of said photosensitive material, in unexposed condition, in an alkali developer continuously increases from the surface part toward the lower part of said photosensitive material.

50. A method for producing a positive photosensitive lithographic printing plate, wherein a photosensitive composition containing a photo-thermal conversion material having an absorption band within a wavelength range of from 600 nm to 1,300 nm and an alkali-soluble resin, is coated on a support to form a layer of photosensitive material, which is then overlaid with a protective material having a $H_2O$ content of from 1 to 10 wt % to obtain a lithographic printing plate of a predetermined size, a plurality of such lithographic printing plates are piled one on another, and at least the entire side surfaces of the piled lithographic printing plates are covered with a moisture-impermeable material, followed by keeping the pile under heating.

51. A method for producing a positive photosensitive lithographic printing plate, wherein a photosensitive composition containing a photo-thermal conversion material having an absorption band within a wavelength range of from 600 nm to 1,300 nm and an alkali-soluble resin, is coated on a support to form a layer of photosensitive material, which is then overlaid with a protective material having a $H_2O$ content of from 1 to 10 wt %, and wound into a coil, and at least the entire side surfaces of said lithographic printing plate in a form of a coil are covered with a moisture-impermeable material, followed by keeping the coil under heating.

52. A method for producing a positive photosensitive lithographic printing plate, wherein a photosensitive composition containing a photo-thermal conversion material having an absorption band within a wavelength range of from 600 nm to 1,300 nm and an alkali-soluble resin, is coated on a support to form a layer of photosensitive material, and a fluid at a temperature of from 30 to 100° C. is collided thereagainst.

53. The method for producing a positive photosensitive lithographic printing plate according to claim 52, wherein the absolute humidity of said fluid is at least 0.007 kg/kg'.

54. The method for producing a positive photosensitive lithographic printing plate according to claim 52, wherein the collision rate of said fluid is from 0.5 to 20 m/s.

55. A method for producing a positive photosensitive lithographic printing plate pile, wherein a photosensitive composition containing a photo-thermal conversion material having an absorption band within a wavelength range of from 600 nm to 1,300 nm and an alkali-soluble resin, is coated on a support to form a layer of photosensitive material, which is then overlaid with a protective material having a water content of from 1 to 10 wt % to obtain a lithographic printing plate of a predetermined size, a plurality of such lithographic printing plates are piled one on another, said piled lithographic printing plates are put in a chamber having a temperature in the chamber of from 30 to 100° C. and having a predetermined size, and the air in the chamber is circulated.

56. A method for producing a positive photosensitive lithographic printing plate pile, wherein a photosensitive composition containing a photo-thermal conversion material having an absorption band within a wavelength range of from 600 nm to 1,300 nm and an alkali-soluble resin, is coated on a support to form a layer of photosensitive material, which is then overlaid with a protective material having a $H_2O$ content of from 1 to 10 wt % to obtain a lithographic printing plate of a predetermined size, a plurality of such lithographic printing plates are piled one on another, the side surfaces of said piled lithographic printing plates are covered with and heated by a heat generator, and kept under heating.

57. The method for producing a positive photosensitive lithographic printing plate pile according to claim 56, wherein the heat generator is of a sheet shape.

58. The method for producing a positive photosensitive lithographic printing plate pile according to claim 56, wherein the heat generator is in contact with the side surfaces of the printing plates.

59. A method for producing a positive photosensitive lithographic printing plate pile, wherein a photosensitive composition containing a photo-thermal conversion material having an absorption band within a wavelength range of from 600 nm to 1,300 nm and an alkali-soluble resin, is coated on a support to form a photosensitive layer, which is then overlaid with a protective material containing a compound having a polar group to obtain a lithographic printing plate of a predetermined size, a plurality of such lithographic printing plates are piled one on another, and a heat-insulating material is applied to almost entire top and bottom surfaces thereof, and the pile is kept under heating under such a state.

60. The method for producing a positive photosensitive lithographic printing plate pile according to claim 59, wherein the protective material has a $H_2O$ content of from 1 to 10 wt %.

61. A method for producing a positive photosensitive printing plate, wherein a photosensitive composition containing a photo-thermal conversion material having an absorption band within a wavelength range of from 600 nm to 1,300 nm and an alkali-soluble resin, is coated on a support to form a photosensitive layer, which is then overlaid with a protective material, a photosensitive printing plate is wound on a heat-insulating core material, the periphery thereof is covered with a heat-insulating material, and the coil is kept under heating under such a state.

62. The method for producing a positive photosensitive printing plate pile according to claim 61, wherein before a photosensitive printing plate and a protective material are alternately piled, the temperature of the photosensitive printing plate is raised to be within a range of ±10° C. to the temperature for keeping the photosensitive printing plate under heating.

63. A method for producing a positive photosensitive lithographic printing plate, wherein a photosensitive composition containing a photo-thermal conversion material having an absorption band within a wavelength range of from 600 nm to 1,300 nm and an alkali-soluble resin, is coated on a support to form a layer of photosensitive material, and a drying process of drying at a temperature within a range of from 20° C. to 100° C. for a predetermined time is carried out, prior to diffusion of a compound having a polar group from the surface of the photosensitive material.

64. The method for producing a positive photosensitive lithographic printing plate according to claim 63, wherein in said drying process, drying at a temperature within a range of from 20° C. to 100° C. is carried out for a time sufficient to provide a residual level of a solvent in the photosensitive layer of at most 10 wt %.

65. The method for producing a positive photosensitive lithographic printing plate according to claim 63, wherein said drying process comprises two steps, a first drying step, in which drying at a temperature within a range of from 20° C. to 55° C. is carried out for a predetermined time, and a second drying step, in which drying at a temperature higher than the first drying step is carried out for a predetermined time.

66. The method for producing a positive photosensitive lithographic printing plate according to claim 65, wherein said drying process comprises two steps, and in the first drying step, drying at a temperature within a range of from 20° C. to 55° C. is carried out for 10 to 120 seconds.

67. The method for producing a positive photosensitive lithographic printing plate according to claim 63, wherein in said drying process, drying is carried out for at least 25 seconds to a completion point of constant rate drying of the photosensitive layer of the positive photosensitive lithographic printing plate.

68. The method for producing a positive photosensitive lithographic printing plate according to claim 63, wherein in said drying process, the highest temperature at which drying is carried out is a temperature higher by 10° C. than the glass transition temperature of the material of said photosensitive layer before drying.

69. The method for producing a positive photosensitive lithographic printing plate according to claim 63, wherein in said drying process, the glass transition temperature of the photosensitive material after drying is from 40 to 80° C.

70. A positive photosensitive lithographic printing plate which comprises a photosensitive material containing a photo-thermal conversion material having an absorption band within a wavelength range of from 600 nm to 1,300 nm and an alkali-soluble resin, wherein the dissolution rate of said photosensitive material, in unexposed condition, in an alkali developer increases from the surface part toward the lower part of said photosensitive material;

wherein the alkali-soluble resin contains phenolic hydroxyl groups, and at least part of said phenolic hydroxyl groups are esterified by a sulfonic acid compound which functions to suppress solubility of the photosensitive material.

71. A positive photosensitive lithographic printing plate which comprises a photosensitive material containing a photo-thermal conversion material having an absorption band within a wavelength range of from 600 nm to 1,300 nm and an alkali-soluble resin, wherein the dissolution rate of said photosensitive material, in unexposed condition, in an alkali developer continuously increases from the surface part toward the lower part of said photosensitive material;

wherein the alkali-soluble resin contains phenolic hydroxyl groups, and at least part of said phenolic hydroxyl groups are esterified by a sulfonic acid compound which functions to suppress solubility of the photosensitive material.

72. The positive photosensitive lithographic printing plate according to claim 70 or 71, which has been exposed by a laser light.

73. The positive photosensitive lithographic printing plate according to claim 70 or 71, wherein the photosensitive material is a monolayer.

74. The positive photosensitive lithographic printing plate according to claim 70 or 71, wherein the gradient of solubility of the photosensitive material in the thickness direction is at least 2.

75. The positive photosensitive composition according to claim 70 or 71, wherein when the photosensitive material is developed with an alkali developer, the dissolution rate of the photosensitive material in the unexposed condition is from 0.01 to 20% at the half point (t/2) of the time (t) until the film remaining ratio reaches 20%.

76. The positive photosensitive lithographic printing plate according to claim 70 or 71, wherein the glass transition temperature of the photosensitive material is from 50° C. to 120° C.

77. The positive photosensitive lithographic printing plate according to claim 70 or 71, which contains at least a novolak resin as the alkali-soluble resin.

78. The positive photosensitive lithographic printing plate according to claim 70 or 71, which contains at least a polyvinyl phenol resin as the alkali-soluble resin.

79. The positive photosensitive lithographic printing plate according to claim 70 or 71, wherein the photo-thermal conversion material is a cyanine dye.

80. The positive photosensitive lithographic printing plate according to claim 79, wherein the cyanine dye is a compound represented by the following general formula (I):

(I)

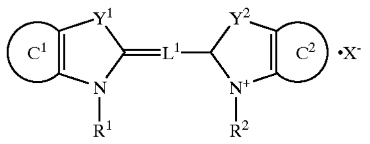

wherein each of the ring $C^1$ and the ring $C^2$ which are independent of each other, is a benzene ring or a naphthalene ring which may have a substituent, each of $Y^1$ and $Y^2$ which are independent of each other, is a dialkylmethylene group, or a sulfur atom, each of $R^1$ and $R^2$ which are independent of each other, is a hydrocarbon group which may have a substituent, $L^1$ is a tri-, penta- or hepta-methine group which may have a substituent, provided that two substituents in said pent- or hepta-methine group may bond to each other to form a $C_{5-7}$ cycloalkene ring, and $X^-$ is a counter anion.

81. A method for forming a positive image, which comprises scanning and irradiating the positive photosensitive lithographic printing plate as defined in claim 79, with a laser light having a wavelength comprising 830 nm, to project an image for exposure, followed by development with an alkali developer.

82. The positive photosensitive lithographic printing plate according to claim 70 or 71, wherein the photo-thermal conversion material is a compound having at least one N,N-diaryl iminium skeleton in its molecule.

83. The positive photosensitive lithographic printing plate according to claim 82, wherein the compound having at least one N,N-diaryl iminium skeleton in its molecule is a compound represented by the following general formula (IIa) or (IIb):

(IIa)

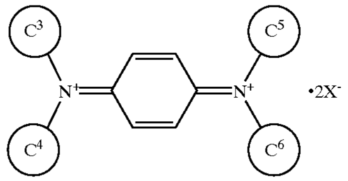

-continued (IIb)

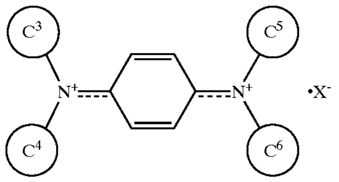

wherein each of $C^3$ to $C^6$ which are independent of each other, is a benzene ring which may have a substituent, $X^-$ is a counter anion, and the cyclohexadiene ring to which nitrogen atoms are bonded, may have a substituent.

84. A method for forming a positive image, which comprises scanning and irradiating the positive photosensitive lithographic printing plate as defined in claim 82, with a laser light having a wavelength comprising 1064 nm, to project an image for exposure, followed by development with an alkali developer.

85. The positive photosensitive lithographic printing plate according to claim 70 or 71, wherein the photosensitive material further contains a solubility-suppressing agent.

86. The positive photosensitive lithographic printing plate according to claim 85, wherein the solubility-suppressing agent is a sulfonic ester compound.

87. The positive photosensitive lithographic printing plate according to claim 85, wherein the solubility-suppressing agent is a compound having a triarylmethane skeleton.

88. The positive photosensitive lithographic printing plate according to claim 70 or 71, wherein the photosensitive material further contains an acid color-developable dye.

89. The positive photosensitive lithographic printing plate according to claim 88, wherein the acid color-developable dye is a compound having a lactone skeleton in its molecule.

90. The positive photosensitive lithographic printing plate according to claim 70 or 71, wherein the photosensitive layer further contains a compound capable of crosslinking the alkali-soluble resin by the effect of heat.

91. The positive photosensitive lithographic printing plate according to claim 90, wherein the compound capable of crosslinking the alkali-soluble resin by the effect of heat, is a compound having a melamine skeleton.

92. A positive photosensitive lithographic printing plate according to claim 91 having a polar compound diffused therethrough from the surface.

93. A positive photosensitive printing plate as set forth in claim 92 wherein said polar compound is $H_2O$.

94. The positive photosensitive lithographic printing plate according to claim 70 or 71, wherein the photosensitive material contains no photo-acid-generator.

95. The positive photosensitive lithographic printing plate according to claim 70 or 71, wherein the dissolution rate of the photosensitive layer in an alkali developer is not substantially changed by irradiation with ultraviolet rays.

96. The positive photosensitive lithographic printing plate according to claim 70 or 71, wherein the photosensitive material has a residual level of a solvent of at most 6%.

97. The positive photosensitive lithographic printing plate according to claim 70 or 71, wherein the photosensitive material does not undergo a chemical change by irradiation with a light having a wavelength within a range of from 600 nm to 1,300 nm.

98. The positive photosensitive lithographic printing plate according to claim 70 or 71, wherein the photosensitive material does not substantially undergo a chemical change by irradiation with a light having a wavelength within a range of from 250 nm to 600 nm.

99. The positive photosensitive lithographic printing plate of claim 70, wherein said photosensitive material includes a polar compound diffused into said material from the surface of said photosensitive material.

100. The positive photosensitive lithographic printing plate of claim 99, wherein said polar compound is $H_2O$.

101. The positive photosensitive lithographic printing plate according to claim 70 wherein the photosensitive material is composed of a plurality of layers.

102. A method for forming a positive image, which comprises scanning and irradiating the positive photosensitive lithographic printing plate as defined in claim 70, with a laser light having a wavelength range of from 600 to 1,300 nm, to project an image for exposure, followed by development with an alkali developer.

103. The method for forming a positive image according to claim 102, wherein the light intensity at the time of irradiation with a laser light beam is at least $2\times10^6$.

104. The method for forming a positive image according to claim 102, wherein the alkali developer contains an alkali metal hydroxide and an alkali metal silicate, has a pH of at least 12, and contains a silicone.

105. The method for forming a positive image according to claim 102, wherein the alkali developer contains an amphoteric surface active agent.

106. A method for forming a positive image, which comprises irradiating the positive photosensitive lithographic printing plate as defined in claim 70, with a laser light having a wavelength range of from 600 nm to 1,300 nm for exposure, and subjecting the positive photosensitive lithographic printing plate to an alkali development process.

107. A method for printing an image on a surface comprising forming a positive image on a printing plate by irradiating a positive photographic printing plate, as defined in claim 70, with a laser light having a wavelength of from 600 nm to 1,300 nm for exposure, developing the formed image using an alkali development process, applying printing ink to the developed image and applying ink from said image to the surface to be printed.

108. A positive photosensitive lithographic printing plate which comprises a photosensitive material containing a photo-thermal conversion material having an absorption band within a wavelength range of from 600 nm to 1,300 nm and an alkali-soluble resin, wherein the dissolution rate of said photosensitive material, in unexposed condition, in an alkali developer increases from the surface part toward the lower part of said photosensitive material;

wherein the photosensitive material further contains a compound capable of crosslinking the alkali-soluble resin by the effect of heat; and wherein the compound capable of crosslinking the alkali-soluble resin by the effect of heat is a compound having a melamine skeleton; and wherein said photosensitive material comprises a polar compound diffused therethrough from the surface.

109. A positive photosensitive lithographic printing plate which comprises a photosensitive material containing a photo-thermal conversion material having an absorption band within a wavelength range of from 600 nm to 1,300 nm and an alkali-soluble resin, wherein the dissolution rate of said photosensitive material, in unexposed condition, in an alkali developer continuously increases from the surface part toward the lower part of said photosensitive material;

wherein the photosensitive material further contains a compound capable of crosslinking the alkali-soluble resin by the effect of heat; and wherein the compound capable of crosslinking the alkali-soluble resin by the effect of heat is a compound having a melamine skeleton; and wherein said photosensitive material comprises a polar compound diffused therethrough from the surface.

110. The positive photosensitive lithographic printing plate according to claim 108 or 109, which has been exposed by a laser light.

111. The positive photosensitive lithographic printing plate of claim 108 or 109, wherein said polar compound is $H_2O$.

112. The positive photosensitive lithographic printing plate according to claim 108 or 109, wherein the photosensitive material is a monolayer.

113. The positive photosensitive lithographic printing plate according to claim 108 or 109, wherein the gradient of solubility of the photosensitive material in the thickness direction is at least 2.

114. The positive photosensitive composition according to claim 108 or 109, wherein when the photosensitive material is developed with an alkali developer, the dissolution rate of the photosensitive material in the unexposed condition is from 0.01 to 20% at the half point (t/2) of the time (t) until the film remaining ratio reaches 20%.

115. The positive photosensitive lithographic printing plate according to claim 108 or 109, wherein the glass transition temperature of the photosensitive material is from 50° C. to 120° C.

116. The positive photosensitive lithographic printing plate according to claim 108 or 109, which contains at least a novolak resin as the alkali-soluble resin.

117. The positive photosensitive lithographic printing plate according to claim 108 or 109, which contains at least a polyvinyl phenol resin as the alkali-soluble resin.

118. The positive photosensitive lithographic printing plate according to claim 108 or 109, wherein the photothermal conversion material is a cyanine dye.

119. A method for forming a positive image, which comprises scanning and irradiating the positive photosensitive lithographic printing plate as defined in claim 118, with a laser light having a wavelength comprising 830 nm, to project an image for exposure, followed by development with an alkali developer.

120. The positive photosensitive lithographic printing plate according to claim 108 or 109, wherein the cyanine dye is a compound represented by the following general formula (I):

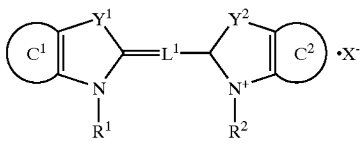

(I)

wherein each of the ring $C^1$ and the ring $C^2$ which are independent of each other, is a benzene ring or a naphthalene ring which may have a substituent, each of $Y^1$ and $Y^2$ which are independent of each other, is a dialkylmethylene group, or a sulfur atom, each of $R^1$ and $R^2$ which are independent of each other, is a hydrocarbon group which may have a substituent, $L^1$ is a tri-, penta- or hepta-methine group which may have a substituent, provided that two substituents in said pent- or hepta-methine group may bond to each other to form a $C_{5-7}$ cycloalkene ring, and $X^-$ is a counter anion.

121. The positive photosensitive lithographic printing plate according to claim 108 or 109, wherein the photothermal conversion material is a compound having at least one N N-diaryl iminium skeleton in its molecule.

122. The positive photosensitive lithographic printing plate according to claim 121, wherein the compound having at least one N,N-diaryl iminium skeleton in its molecule is a compound represented by the following general formula (IIa) or (IIb):

(IIa)

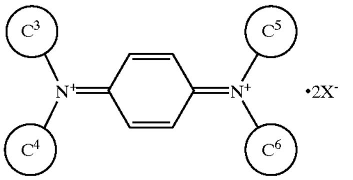

(IIb)

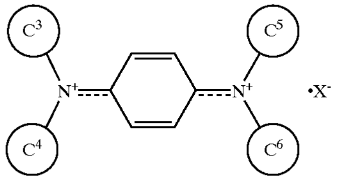

wherein each of $C^3$ to $C^6$ which are independent of each other, is a benzene ring which may have a substituent, $X^-$ is a counter anion, and the cyclohexadiene ring to which nitrogen atoms are bonded, may have a substituent.

123. A method for forming a positive image, which comprises scanning and irradiating the positive photosensitive lithographic printing plate as defined in claim 121, with a laser light having a wavelength comprising 1064 nm, to project an image for exposure, followed by development with an alkali developer.

124. The positive photosensitive lithographic printing plate according to claim 108 or 109, wherein the photosensitive material further contains a solubility-suppressing agent.

125. The positive photosensitive lithographic printing plate according to claim 124, wherein the solubility-suppressing agent is a sulfonic ester compound.

126. The positive photosensitive lithographic printing plate according to claim 124, wherein the solubility-suppressing agent is a compound having a triarylmethane skeleton.

127. The positive photosensitive lithographic printing plate according to claim 108 or 109, wherein the alkali-soluble resin contains phenolic hydroxyl groups, and at least part of said phenolic hydroxyl groups are esterified by a sulfonic acid compound which functions to suppress solubility of the photosensitive material.

128. The positive photosensitive lithographic printing plate according to claim 108 or 109, wherein the photosensitive material further contains an acid color-developable dye.

129. The positive photosensitive lithographic printing plate according to claim 128, wherein the acid color-developable dye is a compound having a lactone skeleton in its molecule.

130. The positive photosensitive lithographic printing plate according to claim 108 or 109, wherein the photosensitive material contains no photo-acid-generator.

131. The positive photosensitive lithographic printing plate according to claim 108 or 109, wherein the dissolution rate of the photosensitive layer in an alkali developer is not substantially changed by irradiation with ultraviolet rays.

132. The positive photosensitive lithographic printing plate according to claim 108 or 109, wherein the photosensitive material has a residual level of a solvent of at most 6%.

133. The positive photosensitive lithographic printing plate according to claim 108 or 109, wherein the photosensitive material does not undergo a chemical change by irradiation with a light having a wavelength within a range of from 600 nm to 1,300 nm.

134. The positive photosensitive lithographic printing plate according to claim 108 or 109, wherein the photosensitive material does not substantially undergo a chemical change by irradiation with a light having a wavelength within a range of from 250 nm to 600 nm.

135. The positive photosensitive lithographic printing plate according to claim 108, wherein the photosensitive material is composed of a plurality of layers.

136. A method for forming a positive image, which comprises scanning and irradiating the positive photosensitive lithographic printing plate as defined in claim 108, with a laser light having a wavelength range of from 600 to 1,300 nm, to project an image for exposure, followed by development with an alkali developer.

137. The method for forming a positive image according to claim 136, wherein the light intensity at the time of irradiation with a laser light beam is at least $2\times10^6$.

138. The method for forming a positive image according to claim 136, wherein the alkali developer contains an alkali metal hydroxide and an alkali metal silicate, has a pH of at least 12, and contains a silicone.

139. The method for forming a positive image according to claim 136, wherein the alkali developer contains an amphoteric surface active agent.

140. A method for forming a positive image, which comprises irradiating the positive photosensitive lithographic printing plate as defined in claim 108, with a laser light having a wavelength range of from 600 nm to 1,300 nm for exposure, and subjecting the positive photosensitive lithographic printing plate to an alkali development process.

141. A method for printing an image on a surface comprising forming a positive image on a printing plate by irradiating a positive photographic printing plate, as defined in claim 108, with a laser light having a wave length of from 600 nm to 1,300 nm for exposure, developing the formed image using an alkali development process, applying printing ink to the developed image and applying ink from said image to the surface to be printed.

* * * * *